(12) United States Patent
Uezawa et al.

(10) Patent No.: US 9,755,191 B2
(45) Date of Patent: Sep. 5, 2017

(54) METHOD AND APPARATUS FOR MANUFACTURING ORGANIC ELECTROLUMINESCENT ELEMENT, AND ORGANIC ELECTROLUMINESCENT MODULE

(71) Applicant: Konica Minolta, Inc., Tokyo (JP)

(72) Inventors: Kuniaki Uezawa, Tokyo (JP); Masahiro Morikawa, Tokyo (JP); Hiroyuki Shindo, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 84 days.

(21) Appl. No.: 14/903,948

(22) PCT Filed: Jul. 10, 2014

(86) PCT No.: PCT/JP2014/068391
§ 371 (c)(1),
(2) Date: Jan. 8, 2016

(87) PCT Pub. No.: WO2015/005412
PCT Pub. Date: Jan. 15, 2015

(65) Prior Publication Data
US 2016/0164046 A1    Jun. 9, 2016

(30) Foreign Application Priority Data

Jul. 11, 2013 (JP) .................................. 2013-145063
Jul. 11, 2013 (JP) .................................. 2013-145281

(51) Int. Cl.
*H01L 51/56* (2006.01)
*C09K 11/06* (2006.01)
(Continued)

(52) U.S. Cl.
CPC .............. *H01L 51/56* (2013.01); *C09K 11/06* (2013.01); *G02B 5/08* (2013.01); *G02B 5/22* (2013.01);
(Continued)

(58) Field of Classification Search
CPC ...... H01L 51/56; H01L 51/50; H01L 51/5281
See application file for complete search history.

(56) References Cited

U.S. PATENT DOCUMENTS 8,330,724 B2    12/2012  Kim
9,564,592 B2 *  2/2017  Uezawa ................. C09K 11/06

FOREIGN PATENT DOCUMENTS

JP    H04-255692 A    9/1992
JP    H08-315985 A    11/1996
(Continued)

OTHER PUBLICATIONS

International Preliminary Report on Patentability issued in PCT/JP2014/068391 dated Jan. 12, 2016 (1 page).
(Continued)

*Primary Examiner* — Douglas Menz
(74) *Attorney, Agent, or Firm* — Osha Liang LLP

(57) ABSTRACT

Disclosed is a method for manufacturing an organic EL element, which has, on a supporting substrate, at least one intermediate electrode layer, and at least two light emitting units, each of which has one or a plurality of organic functional layers, the intermediate electrode layer being disposed between the light emitting units. The method is characterized in having: a first patterning step wherein at least one organic functional layer of each of the light emitting units is patterned using a mask; and a second patterning step wherein at least one organic functional layer in each of the light emitting units is patterned into, by means of light irradiation, a region where a light emitting function
(Continued)

is modulated, and a region where the light emitting function is not modulated. The method is also characterized in that the second patterning step is performed for each light emitting unit that is manufactured.

7 Claims, 13 Drawing Sheets

(51) Int. Cl.
*G02B 5/08* (2006.01)
*G02B 5/22* (2006.01)
*G02B 5/30* (2006.01)
*H01L 51/50* (2006.01)
*H01L 51/52* (2006.01)
*H01L 51/00* (2006.01)
*H01L 27/32* (2006.01)

(52) U.S. Cl.
CPC ............ *G02B 5/30* (2013.01); *H01L 27/3202* (2013.01); *H01L 51/0014* (2013.01); *H01L 51/50* (2013.01); *H01L 51/5056* (2013.01); *H01L 51/5088* (2013.01); *H01L 51/5271* (2013.01); *H01L 51/5281* (2013.01); *H01L 51/5284* (2013.01); *C09K 2211/1011* (2013.01); *C09K 2211/1029* (2013.01); *C09K 2211/1033* (2013.01); *C09K 2211/1044* (2013.01); *C09K 2211/1059* (2013.01); *C09K 2211/1088* (2013.01); *C09K 2211/185* (2013.01); *H01L 27/3209* (2013.01)

(56) References Cited

FOREIGN PATENT DOCUMENTS

| | | |
|---|---|---|
| JP | 2005-099309 A | 4/2005 |
| JP | 2009-535779 A | 10/2009 |
| JP | 2010-027584 A | 2/2010 |
| JP | 2011-034884 A | 2/2011 |
| JP | 2012-028335 A | 2/2012 |
| JP | 2012-506604 A | 3/2012 |
| WO | 2013/011599 A1 | 1/2013 |

OTHER PUBLICATIONS

English translation of Written Opinion of the International Searching Authority issued in PCT/JP2014/068391 dated Aug. 5, 2014 (4 pages).
International Search Report issued in PCT/JP2014/068391 mailed on Aug. 5, 2014 (2 pages).
Written Opinion of the International Searching Authority issued in PCT/JP2014/068391 mailed on Aug. 5, 2014 (4 pages).

* cited by examiner

METHOD AND APPARATUS FOR MANUFACTURING ORGANIC ELECTROLUMINESCENT ELEMENT, AND ORGANIC ELECTROLUMINESCENT MODULE

TECHNICAL FIELD

One or more embodiments of the invention relate to a method and an apparatus for producing an organic electroluminescent element, as well as an organic electroluminescent module. In particular, one or more embodiments of the invention relate to a method and an apparatus for producing an organic electroluminescent element which enables to change the light emitting pattern having excellent shape accuracy, and an organic electroluminescent module provided with the organic electroluminescent element produced by the method.

BACKGROUND

In recent years, a light emitting diode (LED) using a light guide panel and an organic light emitting diode (OLED, hereafter, it is also called as an organic electroluminescent element) have been attracted attentions as a flat panel light source. An LED with a light guide panel (hereafter, it is called as a light guide panel LED) has been used not only for a general illumination, but for various situations and purposes such as a backlight for a liquid crystal display (LCD) (for example, refer to Patent Document 1).

In particular, it has been rapidly increased the use of smart devices such as smart phones and tablets. In many cases, the smart device is provided with buttons of fixed functions and fixed shapes (hereafter, they are called as "common function key buttons") such as: a "home" button indicated by a square mark; a "return" button indicated by an arrow mark; and a "search" button indicated by a magnifier mark, in the outside of the main display.

These common function key buttons have a composition as follows. Generally, a deflection pattern of a dot form is printed beforehand on a light guide panel according to a pattern form of a mark to be displayed. Then, there is placed an LED light source to irradiate light to a side-edge surface of the light guide panel at a side surface of the light guide panel. With respect to the common function key button, the emitted light from the LED light source enters the side surface of the light guide panel, and the incident light is totally reflexed to the front surface direction of the light guide panel through the deflect reflection surface of the deflection pattern. By this, the light is taken out from the front surface side of the light guide panel, whereby it becomes possible to see the emitted pattern when viewed from the front surface of the light guide panel.

A generally used smart device contains a standard function of changing a direction of the main display according to the direction of the smart device. For example, when the smart device is rotated clockwise by 90°, the indication of the main display is also rotated clockwise by 90°.

However, the above-described common function key button cannot be changed with the direction of the mark or any required form at the same location in accordance with the direction of the smart device.

A generally used common function key button usually adopts a light guide panel LED as describe above. The common function key button having this constitution has the following features.

For example, in order to change a direction of a mark or any required optional mark, it is required to laminate a plurality of light guide panel LEDs. However, the laminated plural light guide panel LEDs have an increased thickness and they cannot be incorporated in an inner portion of a smart device.

In addition, in a common function key button adopting a light guide panel LED, light is introduced from the side-edge surface of the light guide panel. As a result, emission unevenness becomes remarkable depending on the design and the shape of the common function key button.

Further, since the mark of the common function key button is formed with a deflecting material having a dot shape and printed on the light guide panel LED, the deflecting material of dot shape is also visible, and it cannot clearly display the light emitting pattern.

However, when a common function key button is displayed by using an organic EL element containing a plurality of laminated light emitting units in which a different light emitting pattern is formed (patterned) in each unit, the above-described features will not be produced. Namely, by changing the light emitting unit to be lighted in accordance with the direction of the smart device, it is possible to change the light emitting pattern of the organic EL element. Further, since the organic EL element as described above is very thin and flat, it can be incorporated in the inner portion of the smart device.

As a method of patterning the light emitting unit, Patent Document 2 discloses a method of modifying the light emitting function of the irradiated portion by irradiating with UV rays.

However, Patent Document 2 does not disclose a method of patterning different patterns to a plurality of light emitting units.

In addition, it is conceivable to form an organic functional layer having a different light emitting pattern in each light emitting unit with film formation using a mask. However, there will remain a feature of low shape accuracy of the light emitting pattern only by using a method of patterning to form an organic functional layer with a mask.

PRIOR ART DOCUMENT

Patent Document

Patent Document 1: U.S. Pat. No. 8,330,724
Patent Document 2: Japanese Patent Application Publication (JP-A) No. 2012-028335

SUMMARY OF THE INVENTION

One or more embodiments of the invention provide a method and an apparatus for producing an organic electroluminescent element which enables to change the light emitting pattern having excellent shape accuracy, as well as to provide an organic electroluminescent module provided with the organic electroluminescent element produced by the method.

Further, one or more embodiments of the invention provide a method and an apparatus for producing an organic electroluminescent element without emission unevenness, as well as to provide an organic electroluminescent module.

The present inventors have investigated the reasons of the above-described features, and have found the following and achieved the following embodiments. At least one organic functional layer in each light emitting unit is patterned with a mask in the forming step of the organic functional layer, after formation of the organic functional layer, the organic functional layer is further patterned by light irradiation so as to pattern into a region where a light emitting function is modulated, and a region where a light emitting function is not modulated. By this, it can change the light emitting pattern with keeping shape accuracy. And further, it is possible to provide an organic EL element without emission unevenness.

That is, the above-described features are addressed by one or more of the following embodiments.

1. A method of producing an organic electroluminescent element comprising a support substrate having thereon: at least two light emitting units each containing one or a plurality of organic functional layers; and at least one intermediate electrode layer, the intermediate electrode layer being arranged between the light emitting units, the method comprising:
   a first patterning step to pattern with a mask at least one of the organic functional layers in each of the light emitting units; and
   a second patterning step to pattern the at least one of the organic functional layers by light irradiation into a region where a light emitting function is modulated, and a region where a light emitting function is not modulated,
   wherein the second patterning step is conducted each time when each of the light emitting units is produced.
2. The method of producing an organic electroluminescent element described in the item 1, wherein the light irradiation in the second patterning step is done under conditions of: wavelength in the range of 320 to 420 nm; and radiation luminance in the range of 10 to 1,000 mW/cm$^2$.
3. A method of producing an organic electroluminescent element comprising a support substrate having thereon: at least two light emitting units each containing one or a plurality of organic functional layers; and at least one intermediate electrode layer, the intermediate electrode layer being arranged between the light emitting units, the method comprising:
   a patterning step to pattern with a mask at least one of the organic functional layers in each of the light emitting units; and
   a light irradiation step to pattern the at least one of the organic functional layers by light irradiation into a region where a light emitting function is modulated, and a region where a light emitting function is not modulated,
   wherein the light irradiation step is conducted after all of the light emitting units are laminated; and
   in the light irradiation step, the light irradiation is done by changing an amount of the light irradiation in the region where the light emitting function is modulated.
4. The method of producing an organic electroluminescent element of any one of the items 1 to 3, wherein the at least one of the organic functional layers is a hole transport layer or a hole injection layer.
5. An apparatus for producing an organic electroluminescent element comprising a support substrate having thereon: at least two light emitting units each containing one or a plurality of organic functional layers; and at least one intermediate electrode layer, the intermediate electrode layer being arranged between the light emitting units, the apparatus comprising:
   a first patterning section to pattern with a mask at least one of the organic functional layers in each of the light emitting units; and
   a second patterning section to pattern the at least one of the organic functional layers by light irradiation into a region where a light emitting function is modulated, and a region where a light emitting function is not modulated,
   wherein the second patterning section conducts the patterning each time when each of the light emitting units is produced.
6. An organic electroluminescent module having an organic electroluminescent element produced by a method of producing an organic electroluminescent element described in any one of the items 1 to 4.
7. An organic electroluminescent module described in the item 6, wherein a polarizing member, a half mirror member, or a black filter is provided on a light emitting surface side of the support substrate.

By one or more embodiments of the present invention, it is possible to provide a method and an apparatus for producing an organic electroluminescent element which enables to change the light emitting pattern having excellent shape accuracy, as well as to provide an organic electroluminescent module provided with the organic electroluminescent element produced by the method.

Further, it is possible to provide a method and an apparatus for producing an organic electroluminescent element without emission unevenness, as well as to provide an organic electroluminescent module.

A formation mechanism or an action mechanism of embodiments of the present invention is not clearly identified, but is supposed as follows.

In the past, an edge of an organic functional layer (hole injection layer) produced by using a mask became dull, and there was a feature that the shape accuracy (resolution) was deteriorated.

However, the trimming of the light emitting pattern can be made by irradiating this dulled portion to prevent light emission and to modulate the light emitting function. Thus, it is possible to improve the shape accuracy of the light emitting pattern.

Further, the edge of the mask will produce a shadow due to the thickness of the mask, it may cause insufficient lamination of film forming substance around the edge. In this case, the organic functional layer may be produced wider than a light emitting pattern beforehand, and unnecessary portion can be trimmed by irradiation with light to become non-light emitting portion. Thus, it is possible to improve the shape accuracy of the light emitting pattern.

BRIEF DESCRIPTION OF THE DRAWINGS

FIG. 17AB is a plan view illustrating a pattern shape in a hole injection layer of a light emitting unit according to one or more embodiments.

Figure 1:
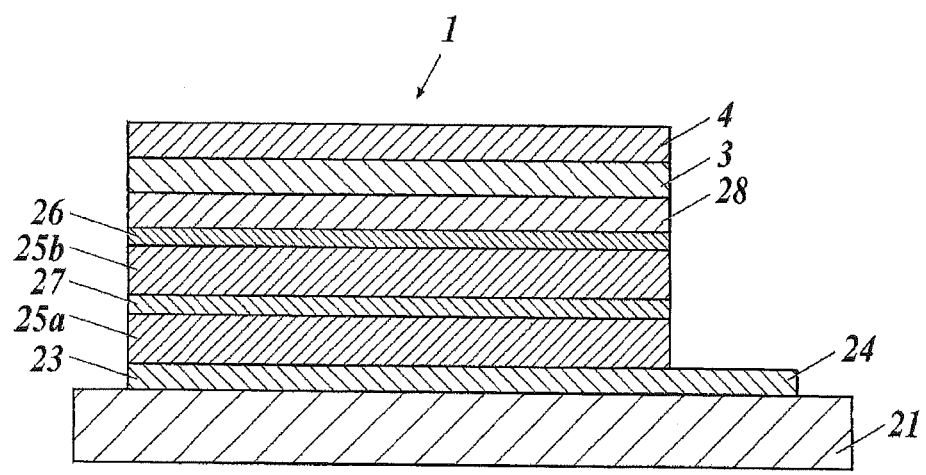
FIG. 1 is a schematic cross sectional view illustrating an example of an organic EL element.

A production method of an organic EL element of one or more embodiments of the present invention may be characterized in the following. At least one organic functional layer in each light emitting unit is patterned with a mask in the forming step of the organic functional layer, after formation of the organic functional layer, the organic functional layer is further patterned (patterning) by light irradiation so as to pattern into a region where a light emitting function is modulated, and a region where a light emitting function is not modulated. This feature is a common technical feature of one or more embodiments of the invention according to claim 1 to claim 7.

In one or more embodiments of the present invention, it is preferable that the light irradiation in the second patterning step is done under conditions of: wavelength in the range of 320 to 420 nm; and radiation luminance in the range of 10 to 1,000 mW/cm². By this, a specific light irradiation apparatus is not required in the production of an organic EL element. As a result, it can obtain an effect that an organic EL element according to one or more embodiments of the present invention may be easily produced.

Further, it is preferable that at least one of the organic functional layers patterned by light irradiation is a hole transport layer or a hole injection layer from the viewpoint of improving mask resolution.

A producing apparatus of an organic electroluminescent element according to one or more embodiments of the present invention is characterized in the following.

The producing apparatus contains:

a first patterning section to pattern with a mask at least one of the organic functional layers in each of the light emitting units; and a second patterning section to pattern at least one of the organic functional layers by light irradiation into a region where a light emitting function is modulated, and a region where a light emitting function is not modulated, wherein the second patterning section conducts the patterning each time when each of the light emitting units is produced.

Further, an organic EL element according to one or more embodiments of the present invention is appropriately provided in an organic EL module.

In one or more embodiments of the present invention, it is preferable that a polarizing member, a half mirror member, or a black filter is provided on a light emitting surface side of the support substrate.

Embodiments of the present invention and the constitution elements thereof, as well as configurations and embodiments to carry out embodiments of the present invention, will be detailed in the following. In the present description, when two figures are used to indicate a range of value before and after "to", these figures are included in the range as a lowest limit value and an upper limit value.

<<Constitution of Organic EL Element>>

Preferable examples of a constitution of an organic EL element according to one or more embodiments of the present invention are described below. However, embodiments of the present invention are not limited to them.

(I) Anode/first light emitting unit/intermediate electrode layer/second light emitting unit/cathode (II) Anode/first light emitting unit/first intermediate electrode layer/second light emitting unit/second intermediate electrode layer/third light emitting unit/cathode (I-1) Anode/white light emitting unit/intermediate electrode layer/white light emitting unit/cathode (II-1) Anode/white light emitting unit/first intermediate electrode layer/white light emitting unit/second intermediate electrode layer/white light emitting unit/cathode As an example of an organic EL element according to one or more embodiments of the present invention, an organic EL element having the above-described constitution (I) is illustrated in FIG. 1.

As illustrated in FIG. 1, an organic EL element 1 is constituted by sequentially laminated on a support substrate 21 with an anode 23, a first light emitting unit 25a, an intermediate electrode layer 27, a second light emitting unit 25b, and a cathode 26.

On a side edge portion of the support substrate 21, the anode 4 is pulled out to form a taking-out wiring 24 that is formed in such a manner that a part thereof is in contact with the anode 23. The intermediate electrode layer 27 has preferably a light transmitting property.

In one or more embodiments of the present invention, a sufficient number of light emitting units is 2 or more, and there is no limitation. However, by considering the production efficiency, a preferable number is in the range of 2 to 10, and a more preferable number is in the range of 2 to 3. Here, when a number of light emitting units is N (N is an integer of 2 or more), a number of intermediate metal layers is (N−1).

A light emitting unit in one or more embodiments of the present invention is a laminated body composed of one or a plurality of organic functional layers.

Examples of an organic functional layer used for a light emitting unit are known layers such as: a hole injection transport layer (an anode buffer layer), a hole transport layer, a light emitting layer, an electron transport layer, an electron injection layer (a cathode buffer layer), a hole blocking layer, and an electron blocking layer.

Preferable examples of a constitution and a lamination order of a light emitting unit are described below. However, embodiments of the present invention are not limited to them.

(i) Hole injection transport layer/light emitting layer/electron injection transport layer
(ii) Hole injection transport layer/light emitting layer/hole blocking layer/electron injection transport layer
(iii) Hole injection transport layer/electron blocking layer/light emitting layer/hole blocking layer/electron injection transport layer
(iv) Hole injection layer/hole transport layer/light emitting layer/electron transport layer/electron injection layer
(v) Hole injection layer/hole transport layer/light emitting layer/hole blocking layer/electron transport layer/electron injection layer
(vi) Hole injection layer/hole transport layer/electron blocking layer/light emitting layer/hole blocking layer/electron transport layer/electron injection layer In one or more embodiments of the present invention, the light emitting units each may be composed of a different organic functional layer. However, it is preferable to be composed of the same organic functional layer and the same material. Further, it is preferable that the number of the light emitting layers is the same. By this, it can reduce the number of the employed substances for forming the light emitting units. This will produce a merit of cost and quality control. Moreover, it can improve production efficiency. And, when a vapor deposition process is employed for forming each organic functional layer, the film forming room can be commonly used for each light emitting unit. Thus, a merit of production efficiency will be benefited.

Each layer which constitutes a light emitting unit is formed with known thin film forming methods such as: a vapor deposition method, a spin coating method, a cast method, an LB (Langmuir-Blodgett method) method, an inkjet method, a spray method, a printing method, and a slot type coater method.

<<Production Method and Production Apparatus of Organic EL Element>>

In the following, a production method and a production apparatus of an organic EL element 1 are described by referring to FIG. 2 to FIG. 14.

A production method of an organic EL element according to one or more embodiments of the present invention is a method of producing an organic EL element containing a support substrate having thereon: at least two light emitting units each containing one or a plurality of organic functional layers; and at least one intermediate electrode layer, the intermediate electrode layer being arranged between the light emitting units. The method is characterized in that it contains:

a first patterning step to pattern with a mask at least one of the organic functional layers in each of the light emitting units; and a second patterning step to pattern the at least one of the organic functional layers by light irradiation into a region where a light emitting function is modulated, and a region where a light emitting function is not modulated, wherein the second patterning step is conducted each time when each of the light emitting units is produced.

The production apparatus is not limited to a production apparatus 100 describe in the following.

In the production method of an organic EL element according to one or more embodiments of the present invention, it is preferable that the light irradiation in the second patterning step is done under conditions of: wavelength in the range of 320 to 420 nm; and radiation luminance in the range of 10 to 1,000 mW/cm$^2$.

Figure 2:
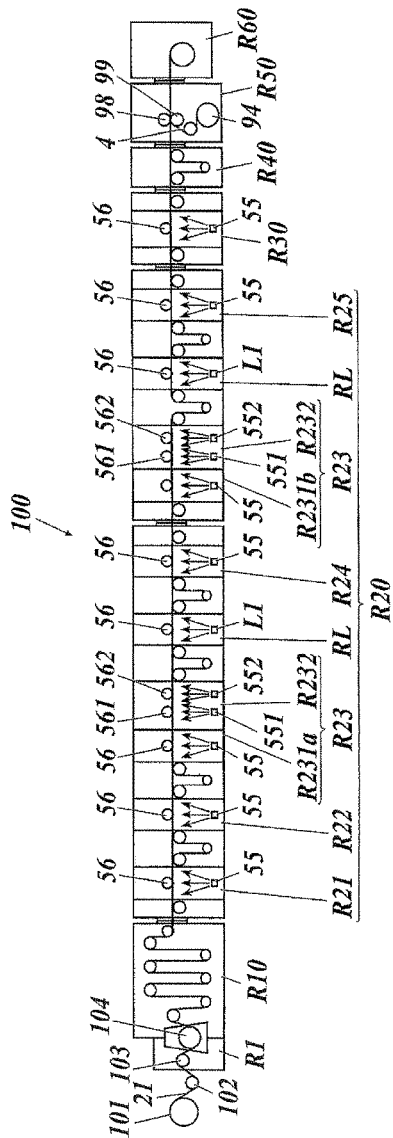
FIG. 2 is a schematic constitutional drawing illustrating a production apparatus of an organic EL element according to one or more embodiments.

FIG. 2 is a schematic constitutional drawing illustrating a production apparatus 100 of an organic EL element according to one or more embodiments of the present invention. The production apparatus 100 indicated in FIG. 2 is an apparatus for producing an organic EL element 1 by continuously conveying a support substrate 21 wound in a roll condition. In addition, in one or more embodiments, a film forming surface of the support substrate 21 is provided with an inorganic insulating layer in advance. As an inorganic insulating layer, it may be suitably selected from the known compounds used in an organic EL element.

The support substrate 21 fed out from a feeding out section 101 placed under a reduced pressure enters an anterior room R1 through guide rollers 102 and 103. Further, it is conveyed in a surface treatment and accumulating room R10 placed under a vacuum condition through a slit roller 104, and dry cleaning of the surface and dewatering process are conducted. The pressure in the surface treatment and accumulating room R10 is preferably set to be in the range of $1\times10^{-5}$ to 10 Pa.

Subsequently, the support substrate 21 is continuously conveyed from the surface treatment and accumulating room R10 to a film forming room R20. Between the surface treatment and accumulating room R10 and the film forming room R20, there is provided with a gate valve or a pressure adjusting room. The difference of pressure between the surface treatment and accumulating room R10 and the film forming room R20 is adjusted.

In the production method according to one or more embodiments of the present invention, at first, a film forming process of any one of organic functional layers is conducted to the film forming surface of the conveying support substrate 21 in the film forming room R20 and in a 6th film forming room R30 described later.

Further, in this film forming process: a first patterning process is conducted to at least one of the organic functional layers in the light emitting unit by using a mask; and a second patterning process is conducted to make patterning by light irradiation into a region where a light emitting function is modulated, and a region where a light emitting function is not modulated.

In one or more embodiments, as a mask used for the first patterning process, a continuous mask, which will be described layer, is employed. The mask used for the first patterning process is not limited to the continuous mask, it may be used a known mask such as a plate mask.

In addition, the first patterning process is conducted in a first patterning section in which patterning is conducted to at least one of the organic functional layers in the light emitting unit by using a mask before formation of an intermediated electrode layer.

In one or more embodiments, a first patterning section designates a film forming room provided with a continuous mask among film forming rooms R21 to R25 described later. In the film forming room provided with a continuous mask, each organic functional layer is formed while patterning.

In one or more embodiments of the present invention, the first patterning section may be done to a plurality of organic functional layers, or to any one of organic functional layers. It is particularly preferable to be done to a hole transport layer or a hole injection layer.

The film forming room R20 is constituted of a plurality of film forming rooms R21 to R25 and a second patterning section RL. Between the film forming rooms R21 to R25 and the second patterning section RL, there is provided with an accumulator mechanism which absorbs treatment speed. The film forming rooms R21 to R25 and the second patterning section RL each are independently vented to be kept in a vacuum condition or a reduced pressure condition. Although the film forming pressure depends of the film forming method, the film forming pressure is preferably set to be in the range of $1 \times 10^{-6}$ to 10 Pa.

In the first film forming room R21, an anode 23 is formed on the support substrate 21 by using a film forming conductive material of a metal or a metal oxide with a film forming method such as a vacuum deposition method, a sputter method and an ion plating method.

Figure 3:
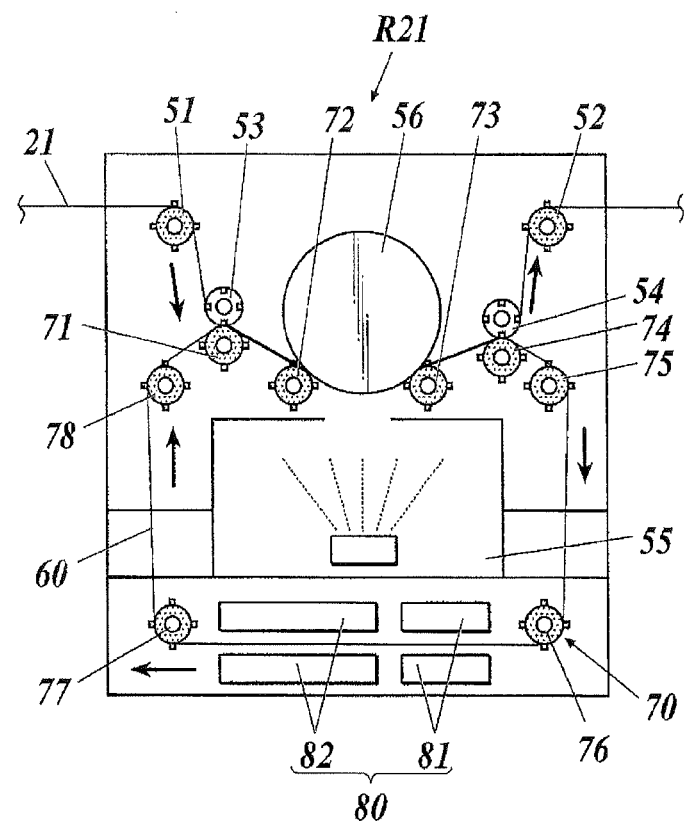
FIG. 3 is a schematic constitutional drawing illustrating an example of a film forming room constituting a production apparatus of an organic EL element.

Here, the first film forming room R21 is described by referring to FIG. 3. FIG. 3 is a schematic constitutional drawing of the first film forming room R21.

The first film forming room R21 is constituted by containing inside with: a plurality of convey rollers 51 and 52 and receive rollers 53 and 54 conveying the support substrate 21 via a predetermined route, a raw material supplying section 55 facing the film forming surface of the support substrate 21 to be conveyed, and a back side cooling roller 56 to cool the support substrate 21 by contacting the opposite surface of the film forming surface of the support substrate 21. Further, the inside of the first film forming room R21 may be provided with: a continuous loop shape mask 60 having an opening section of a predetermined pattern shape, a rotate transport section 70 to rotate transport the continuous mask 60 in the loop direction, and a cleaning section 80 to make cleaning the continuous mask 60.

Figure 4:
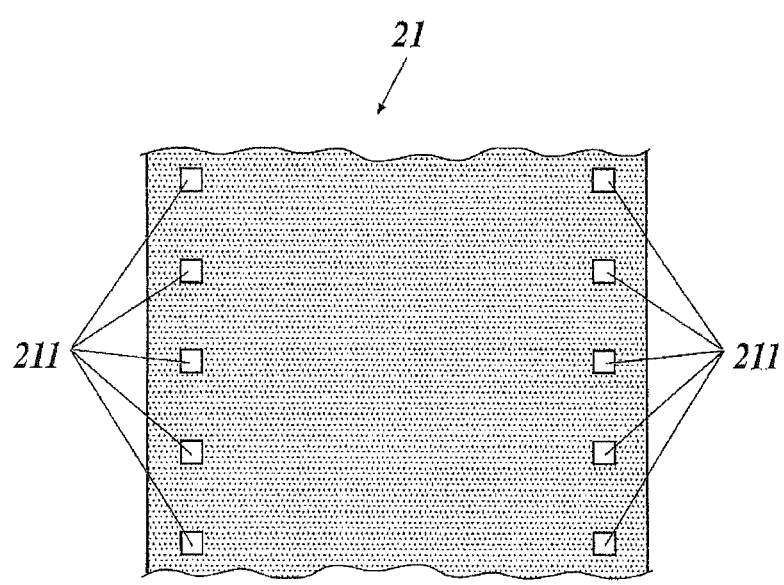
FIG. 4 is a schematic drawing illustrating a part of a support substrate according to one or more embodiments.

Here, in one or more embodiments of the present invention, as indicated in FIG. 4, the support substrate 21 has a plurality of first guide holes 211 having apertures with an equivalent interval at two edge portions of the width direction in the conveying direction (transport direction).

The convey rollers 51 and 52 have a plurality of projections located at the periphery in a diameter direction. During the conveying of the support substrate 21, the projections are inserted in the first guide holes 211 of the support substrate 21. By this, the support substrate 21 is smoothly conveyed. The convey rollers 51 and 52 are composed in the same manner as convey rollers 71 to 78 of the rotate transport section 70 that will be described later.

Figure 5A:
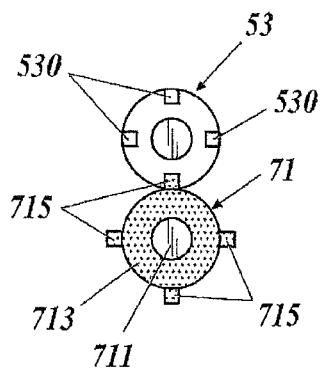
FIG. 5A is a schematic side view illustrating a convey roller and a receive roller according to one or more embodiments.
Figure 5B:
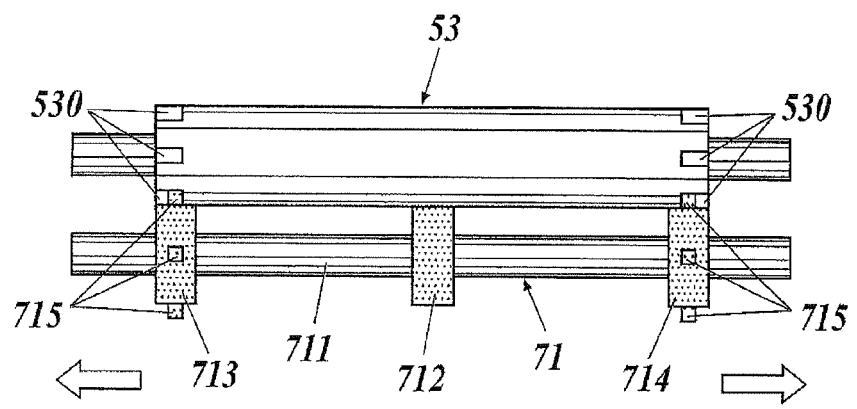
FIG. 5B is a schematic side view illustrating a convey roller and a receive roller according to one or more embodiments.

The receive roller 53 conveys the support substrate 21 together with convey rollers 51 and 52 by rotating driving. In addition, as indicated in FIG. 5A and FIG. 5B, the receive roller 53 is provided with a plurality of concave portions 530 on the surface thereof. The receive roller 54 is composed in the same manner as the receive roller 53. These receive rollers 53 and 54 will be described in detail later.

The raw material supplying section 55 has a film forming mechanism corresponding to respective methods of a vacuum deposition method, a sputter method and an ion plating method. It is placed facing the film forming surface of the support substrate 21. By this, an anode 23 is formed on the predetermined region of the film forming surface of the support substrate 21 that is conveyed in the first film forming room R21.

The back side cooling roller 56 is pivotably supported and it is a roller member that is provided with a predetermined cooling mechanism. The back side cooling roller 56 is placed in the opposite side of the raw material supplying section 55 across the support substrate 21. Through contact with the opposite surface of the film forming surface of the support substrate 21, it cools the film forming region of the support substrate 21 using by the raw material supplying section 55.

The continuous mask 60 is a mask for continuous pattern forming. It is continuous in a loop form in the first film forming room R21. The continuous mask 60 is bridged with tension to a plurality of convey rollers 71 to 78 constituting the rotate transport section 70.

Figure 6A:
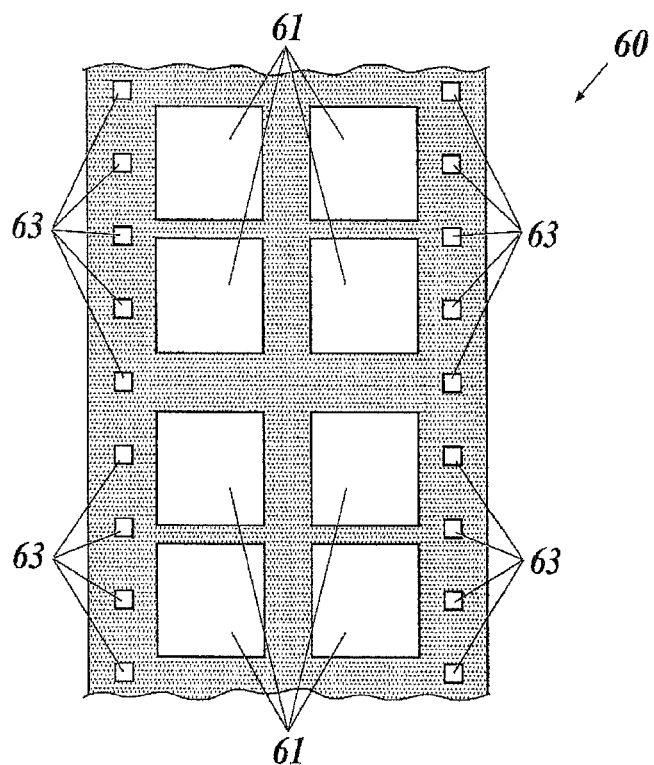
FIG. 6A is a schematic drawing illustrating a part of continuous mask according to one or more embodiments.
Figure 6B:
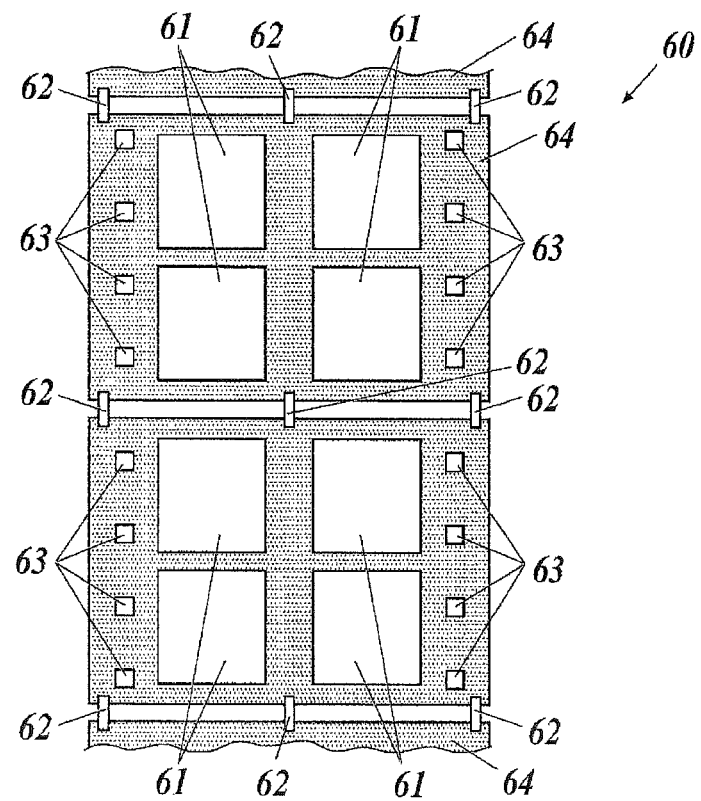
FIG. 6B is a schematic drawing illustrating a part of continuous mask according to one or more embodiments.

The continuous mask 60 is described in the following by referring to FIG. 6A and FIG. 6A. FIG. 6A is a schematic drawing of the continuous mask 60 that is formed in a seamless state. FIG. 6B is a schematic drawing of the continuous mask 60 that is formed by bonding a plurality of sheet form masks 64.

The continuous mask 60 has a plurality of opening section 61 having a predetermined pattern shape. Film formation is done on the support substrate 21 through this opening section 61. Thus, it can form an anode having a predetermined pattern shape. Since the continuous mask 60 is closely contacted with the support substrate 21 being conveyed, it is preferable that the continuous mask 60 has flexibility in the same manner as the support substrate 21.

Examples of a material for the continuous mask 60 are: Fe—Ni alloys such as SUS 300, invar, 42 alloy, Hastelloy™ and Inconel™; metal foils and alloy foils such as aluminum, magnesium, and titanium; thin plate ceramics and thin plate glass such as silicon, alumina and boronitride; thermoplastic resins such as polyester and polyurethane; and heat curable resins having high heat resistivity such as polyimide, epoxy resin, bakelite resin, polycarbonate, acrylic resin, urea resin, and phenol resin.

In particular, when a metal is used for a material of the continuous mask 60, aperture forming is easily done, and the obtained continuous mask 60 has high thermal resistivity and low linear expansion coefficient. In addition, it can improve resistivity to the dry cleaning process that will be described later.

Moreover, when a heat curable resin is used for a material of the continuous mask 60, it is preferable to include a glass fiber or a carbon fiber in the resin from the viewpoint of improving thermal resistivity and decreasing linear expansion coefficient. Thus, it is possible to improve size precision of the mask.

The thickness of the continuous mask 60 is preferably in the range of 0.1 to 3 mm from the viewpoint of flexibility and resistivity. Further, in order to give resistivity to the dry cleaning process and an easily peeling property from the adhered body, the surface of the continuous mask 60 may be treated with a Ni plating treatment, an alumite treatment, or a fluorine coating treatment.

As long as the continuous mask 60 is in the loop state, it may be formed in a seamless belt state having no bonding portion (refer to FIG. 6A), or it may be formed with a plurality of sheet form masks, which are bonded together (refer to FIG. 6B). When the continuous mask 60 is formed with a plurality of sheet form masks, the continuous mask 60 may be composed of a plurality of sheet form masks 64 by bonding them with bonding jigs 62, the sheet form masks 64 being provided with an aperture area having a predetermined pattern beforehand, for example. As a bonding jig 62, it may be used rivet fixing, metal chain bonding, flexible tape, and flexible belt. By the above-descried composition, the continuous mask 60 can be produced with a low cost, and even when a part of the continuous mask 60 is broken, the mask can be easily repaired and it can be reused by replacing only the broken sheet form masks.

Further, as indicated in FIG. 6A and FIG. 6B, the continuous mask 60 has a plurality of second guide holes 63 having apertures with an equivalent interval at two edge portions of the width direction in the loop direction (transport direction). The size of the plurality of second guide holes 63 and the interval are made to be the same size and interval as the first guide holes 211 of the support substrate 21.

The rotate transport section 70 is composed of a plurality of convey rollers 71 to 78. These convey rollers 71 to 78 are bridged with tension to the continuous mask 60. Through rotating driving of the plurality of convey rollers 71 to 78, the continuous mask 60 will be rotate transported to the moving direction of the loop. The rotate transport section 70 can make overlap a part of the continuous mask 60 with the support substrate 21 being conveyed by rotate transporting the continuous mask 60. Moreover, the rotate transport section 70 can detach the continuous mask 60 overlapped with the support substrate 21 by further rotate transporting the continuous mask 60.

In addition, the rotate transporting speed of the continuous mask 60 by the rotate transport section 70 is controlled to be the same as the transport speed of the support substrate 21.

The convey roller 71 is described by referring to FIG. 5A and FIG. 5B. FIG. 5A is a drawing of the convey roller 71 and receive roller 53 viewed from the axis direction. FIG. 5B is a side view of the convey roller 71 and receive roller 53.

As indicated in FIG. 5A and FIG. 5B, the convey roller 71 is composed of: a rotating shaft 711 capable of rotate driving; a roller 712 placed in the center portion of the shaft direction of the rotating shaft 711; and rollers 713 and 714 placed at the both edges of the rotating shaft 711. The roller 712 is fixed to the rotating shaft 711, and it rotates with the rotating driving of the rotating shaft 71. The rollers 713 and 714 are fixed to the rotating direction of the rotating shaft 711, and they are placed in a state movable to the separating direction with respect to the shaft direction of the rotating shaft 711 with each other (an arrow direction in FIG. 5B). The rollers 713 and 714 are respectively provided with a plurality of projections 715 located at the periphery in a diameter direction. The projections 715 of the rollers 713 and 714 are inserted in the second guide holes 63 of the continuous mask 60, thereby the convey roller 71 can smoothly rotate transport the continuous mask 60. In addition, tension of the width direction can be given to the continuous mask 60 by making to move the rollers 713 and 714 to a separating direction with each other during the condition of inserting the projections 715 of the rollers 713 and 714 into the second guide holes 63. By this, the continuous mask 60 can be overlapped to the support substrate 21 with high precision. It is preferable that the projections 715 are formed in a tapered shape to be easily inserted in the second guide holes 63. The convey rollers 72 to 78 are composed in the same manner as the convey roller 71.

Among the convey rollers 71 to 78, the convey rollers 71 and 74 are located to be contact with the receive rollers 53 and 54. The projections 715 of the convey roller 71 are made to be contained in the concave portions 530 of the receive roller 53. As a result, the convey rollers 71 and 74 are contacted with the receive rollers 53 and 54 without space. By this, the continuous mask 60 rotate transported by the convey rollers 71 and 74 will be overlapped to the support substrate 21 conveyed by the receive rollers 53 and 54 to result in achieving close contact condition.

The projections 715 of the convey rollers 71 and 74 are inserted in the second guide holes 63 of the continuous mask 60, and at the same time, they are inserted in the first guide holes 211 of the support substrate 21. Since the first guide holes 211 and the second guide holes 63 are formed in a corresponding position with each other, it can overlap the continuous mask 60 and the support substrate 21 with making alignment by inserting the projections 715 in the first guide holes 211 and the second guide holes 63. Consequently, alignment of high precision and patterning film formation can be made while conveying the support substrate 21 without using a complex alignment mechanism.

In addition, by the mechanism of moving the rollers 713 and 714 of the convey rollers 71 and 74 to the separating direction with each other, tension to the width direction can be given not only to the continuous mask 60 but to the support substrate 21.

The cleaning section 80 makes dry cleaning (cleaning method without using a liquid cleaning solvent) to the continuous mask 60 after being peeled off from the support substrate 21 via the rotate transport section 70. The coating film adhered to the continuous mask 60 during film formation is removed. The cleaning section 80 is placed in the first film forming room R21 and it can make cleaning to the region of the continuous mask 60 that is not overlapped to the support substrate 21, at the same time of the film forming treatment using the continuous mask 60. Therefore, continuous film formation can be made after completion of the cleaning without releasing the continuous mask 60 in the air. Further, since the cleaning section 80 can make cleaning of the continuous mask 60 at the same time of film forming treatment in the first film forming room R21, it is not required to stop the transport of the support substrate 21 for the purpose of the exchange operation of the continuous mask 60 or the cleaning operation. Thus, it is possible to improve production efficiency. Further, it is not required to separately arrange the cleaning mechanism of the continuous mask 60 outside the film forming rooms R21, as a result, the width size of the production apparatus 100 can be downsized.

As a cleaning frequency of the continuous mask 60 by the cleaning section 80, cleaning may be made each time after completion of the film forming process. It may make cleaning after 5 to 100 times of completion of the film forming process to reduce production cost.

The cleaning section 80 makes dry cleaning under a reduced pressure atmosphere of about 0.1 to 200 Pa. As a result, cleaning can be done almost without changing the pressure in the first film forming room R21. Therefore, it is not required to place an accumulator or a gate valve in the first film forming room R21. Cleaning can be done while rotate transporting the continuous mask 60. Further, since the first film forming room R21 is already under a reduced pressure condition, it can easily done: improvement of etching speed, removal of particles, and elimination of gas.

In an example indicated in FIG. 3, the cleaning section 80 is constituted of an element doing plasma etching treatment. That is, the cleaning section 80 has a composition provided with a cooling section 81 and a plasma etching section 82. The cooling section 81 cools the continuous mask 60 heated by the film forming process. The plasma etching section 82 makes plasma by applying a high frequency voltage to a cleaning gas such as $O_2$ (oxygen), $NF_3$ (nitrogen trifluoride), Ar (argon), and $N_2$ (nitrogen). A surface etching treatment of the continuous mask 60 is done by using a cleaning gas made in a plasma state. By this, the coating film of the continuous mask 60 is effectively removed.

In addition, the continuous mask 60 is heated by carrying out the plasma etching treatment. Therefore, the cleaning section 80 may be further provided with a cooling mechanism (not illustrated) to cool the continuous mask 60 before overlapping again the continuous mask 60 with the support substrate 21.

Figure 7:
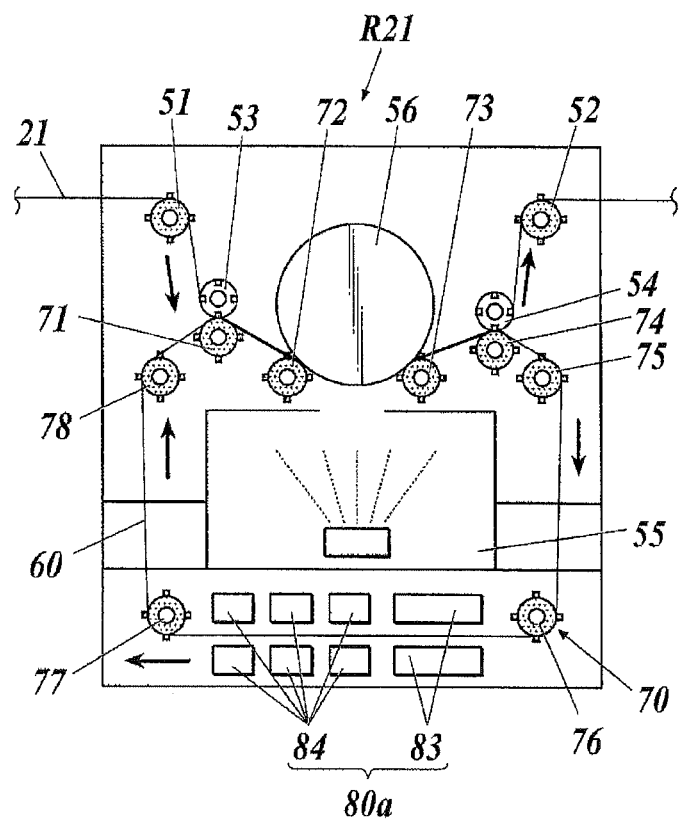
FIG. 7 is a schematic constitutional drawing illustrating an example of a film forming room constituting a production apparatus of an organic EL element.

As a method of dry cleaning the continuous mask 60, it may have a constitution of doing blast etching treatment using dry ice particles, as illustrated in FIG. 7.

In this case, in the first film forming room R21, there is placed a cleaning section 80a composed of a heating section 83 and a plurality of cleaning heads 84 instead of the cooling section 81 and the plasma etching section 82. The heating section 83 heats the continuous mask 60 beforehand so that the dry ice particles to be blown to the continuous mask 60 are effectively sublimate. The plurality of cleaning heads 84 blow the dry ice particles in a powder form to the continuous mask 60. The adhered objects to the continuous mask 60 are removed by making use of the volume expansion force of the dry ice particles at sublimation when they hit the continuous mask 60.

The cleaning method of the continuous mask 60 is not limited to the above-described plasma etching treatment or a blast etching treatment using dry ice particles. For example, it can be used: a method of removing an adhered substance by making contact the continuous mask 60 with a roll member coated with a weak adhesive of acrylic resin or a flexible resin; and a method of removing an adhered substance by making contact the continuous mask 60 with a roll member having projections of a brush shape. It can adopt a method of physically removing an adhered substance from the continuous mask 60 by making contact the continuous mask 60 with a roll shape cleaning member. After performing cleaning with the aforesaid method, it may further add a process to detach a remained adhered substance and to remove the produced particles by blowing a nitrogen gas from the slit nozzle to the continuous mask 60.

As a cleaning frequency by using the roll shape cleaning member, cleaning may be made each time after completion of the film forming process. It may make cleaning after 5 to 100 times of completion of the film forming process by considering the lifetime of the roll shape cleaning member when needed.

The inside of the first film forming room R21 is composed as described above.

Subsequently, the film forming rooms R22 to R25 and R30, and the second patterning section RL are described by referring again to FIG. 2. Here, the second film forming room R22, the 4th film forming room R24, the 5th film forming room R25, and the 6th film forming room R30 each have almost the same constitution. The employed film forming materials are different.

In the second film forming rooms R22, film formation of a taking-out wiring 24 is made. In the second film forming rooms R22, a conductive material of a metal or a metal oxide is used. A film formation of a taking-out wiring 24 is made on the support substrate 21 so that a part of the taking-out wiring is made contact to the anode 23 with a film forming method such as a vacuum deposition method, a sputter method and an ion plating method.

In addition, the first film forming rooms R221 and the second film forming rooms R22 are described as being placed separately. However, it may be placed with one of these two. In this case, the anode 23 and the taking-out wiring 24 (it is also called as a taking-out electrode) may be formed by using the same material via the continuous mask. Thus, it may reduce a production cost.

In the 3rd film forming rooms R23, film formation of the first light emitting unit 25a and the second light emitting unit 25b is made. In the 3rd film forming rooms R23, since film formation of the first light emitting unit 25a and the second light emitting unit 25b is made with a vacuum deposition method, it is preferable that the film forming pressure in the 3rd film forming rooms R23 is set to be a high vacuum region in the range of $1\times10^{-6}$ to $1\times10^{-4}$ Pa.

Figure 8:
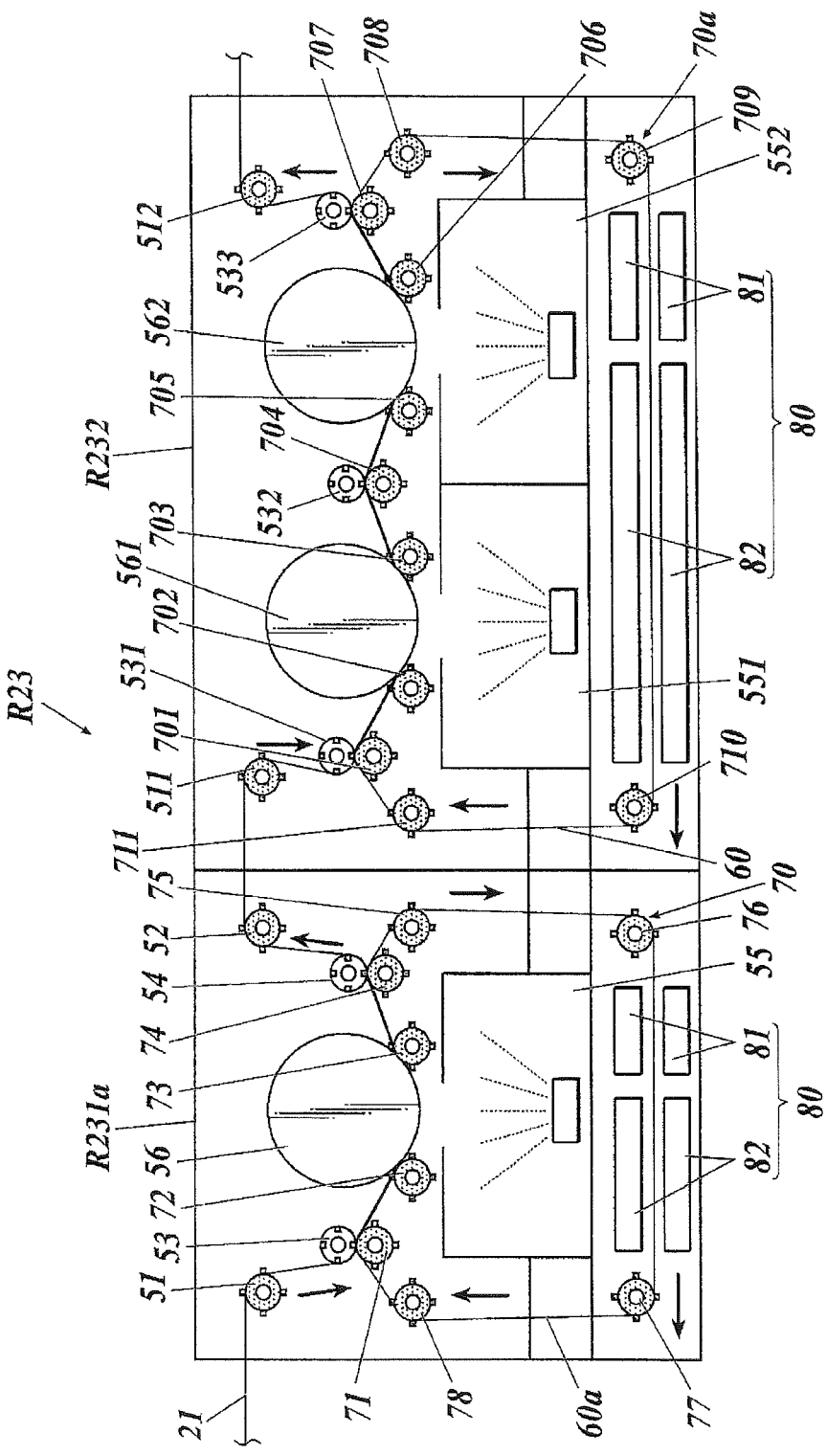
FIG. 8 is a schematic constitutional drawing illustrating an example of a film forming room constituting a production apparatus of an organic EL element.

The 3rd film forming rooms R23 is described by referring to FIG. 8. FIG. 8 is a schematic constitutional drawing of the inside of the 3rd film forming rooms R23.

The 3rd film forming rooms R23 of one or more embodiments contains a hole injection layer forming rooms R231a or R231b, and an organic functional layer forming room R232 where an organic functional layer other than a hole injection layer is formed. The 3rd film forming rooms R23 indicated in FIG. 8 is an example of a case having a hole injection layer forming rooms R231a and an organic functional layer forming room R232.

Here, the constitution of the hole injection layer forming rooms R231a and the organic functional layer forming room R232 is almost the same as the above-described first film forming room R21.

When aluminum or silver is used for the intermediate electrode layer, the organic functional layer forming room R232 forms an electron injection layer, and the electron injection layer is made to be adjacent to the intermediate electrode layer formed in the 4th film forming rooms R24.

The hole injection layer forming rooms R231a and R231b are different from the first film forming room R21 with respect to the film forming materials employed and the shape of the continuous mask. The hole injection layer forming rooms R231a and R231b are different from each other with respect to the shape of the continuous mask, and the other constitutions are the same.

Figure 9A:
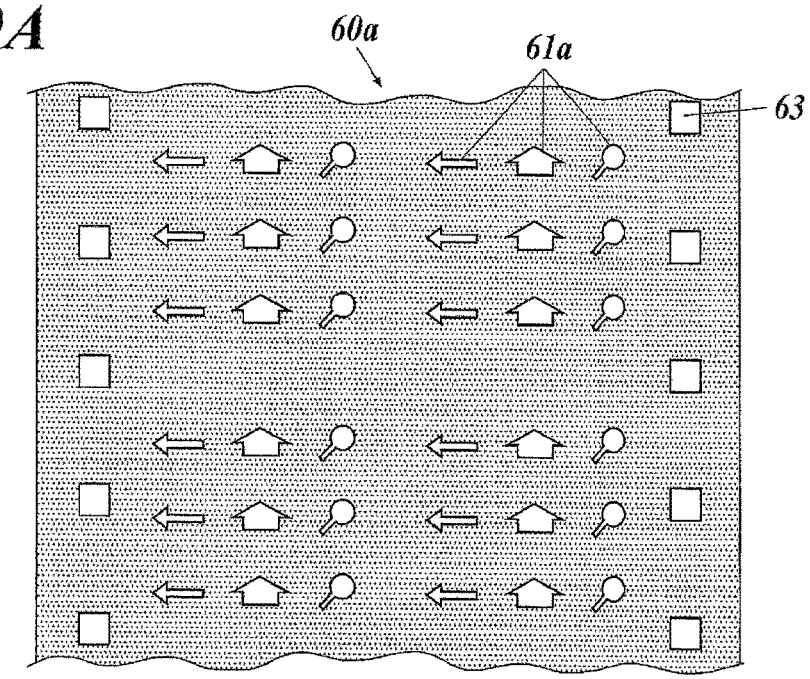
FIG. 9A is a schematic drawing illustrating a part of continuous mask used in a film forming room of a hole injection layer according to one or more embodiments.
Figure 9B:
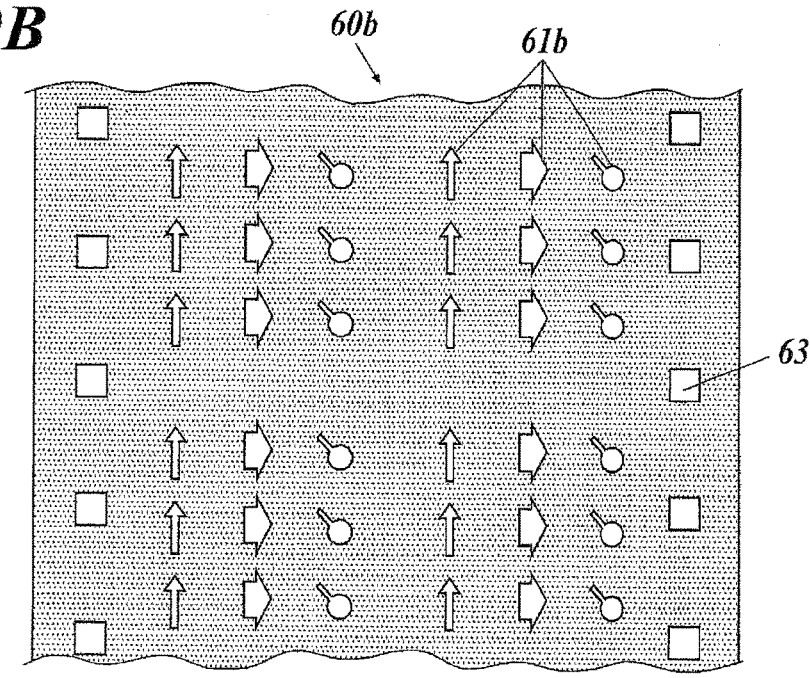
FIG. 9B is a schematic drawing illustrating a part of continuous mask used in a film forming room of a hole injection layer according to one or more embodiments.

FIG. 9A and FIG. 9B are a schematic drawing illustrating a part of continuous mask used in hole injection layer forming rooms of R231a and R231b of one or more embodiments.

The continuous mask 60a is used in the hole injection layer forming room of R231a. For example, as indicated in FIG. 9A, it has opening sections 61a formed in a pattern (light emitting pattern) that is expected to emit light in the first light emitting unit 25a in the shape of such as common function ley button marks. By this, in one or more embodiments, the hole injection layer included in the first light emitting unit 25a is formed in a shape of the opening sections 61a.

The continuous mask 60b is used in the hole injection layer forming room of R231b. As indicated in FIG. 9B, it has opening sections 61b having a shape of the opening sections 61a clockwise rotated by 90°. By this, in one or more embodiments, the hole injection layer included in the second light emitting unit 25b is formed in the shape of opening sections 61b. Namely, the light emitting pattern of the second light emitting unit 25b is formed in the shape of the light emitting pattern of the first light emitting unit 25a which is clockwise rotated by 90°. As a result, when the smart device is clockwise rotated by 90°, the light emission is switched from the first light emitting unit 25a to the second light emitting unit 25b, thereby it is possible to keep the direction of the common function ley button marks to the user of the smart device.

In one or more embodiments, the light emitting pattern of the second light emitting unit 25b is formed in the shape of the light emitting pattern of the first light emitting unit 25a which is clockwise rotated by 90°. However, embodiments of the present invention are not limited to this. It may be formed in any required shape. In this case, the continuous mask 60b has opening sections 61b formed in a required shape. By this, it is possible to form a light emitting pattern in the second light emitting unit 25b having any required shape.

The organic functional layer forming room R232 is constituted by containing inside with: convey rollers 511 and 512 and receive rollers 531 to 533, conveying the support substrate 21 via a predetermined route; raw material supplying sections 551 and 552 facing the film forming surface of the support substrate 21 conveyed; and back side cooling rollers 561 and 562 to cool the support substrate 21 by contacting the opposite surface of the film forming surface of the support substrate 21. Further, in an inside of the organic functional layer forming room R232, there are placed the continuous mask 60, a second rotate transport section 70a and a cleaning section 80. The second rotate transport section 70a is constituted of convey rollers 701 to 711.

Each member in the organic functional layer forming room R232 is composed in the same manner as the member having the same name of the above-described first film forming room R21.

That is, the organic functional layer forming room R232 is different from the first film forming room R21 only in the points of the number of each member and its location. By forming this constitution, it can continuously form film to the overlapped region of the support substrate 21 and the continuous mask 60 by using the raw material supplying section 551 and 552.

Thus, when a plurality of layers having the same pattern are formed on the support substrate 21, a plurality of film formation can be made using one continuous mask 60, as indicated in FIG. 8.

In an example indicated in FIG. 8, two raw material supplying sections and two back side cooling rollers are provided. Two times of film formation can be made by the constitution of the example. It is preferable that the raw material supplying section and the back side cooling roller are placed with the same number as the number of laminated layers composing the light emitting unit.

The second patterning section RL makes the second patterning of the organic functional layer by light irradiation into a region where a light emitting function is modulated, and a region where a light emitting function is not modulated.

Here, to modulate the light emitting function by light irradiation modulated indicates to modulate the function of the hole injection transport materials composing the light emitting unit to result in modifying the light emitting function of the light emitting unit.

When an organic EL element having a plurality of light emitting units is irradiated with light to change the emission luminance to result in decreasing, if the light irradiation is done to the sealed organic EL element as a whole, it cannot achieve to display a different design or mark by each respective light emitting unit.

The second patterning step avoids the above-described situation. The second patterning step is a step in which trimming of the light emitting pattern is done respectively to each light emitting unit by modulating the light emitting function with light irradiation to each respective light emitting unit having an organic functional layer patterned beforehand.

In the light irradiation step, any light irradiation method may be used as long as it enables to make a light emitting region in which an emission luminance is changed by light irradiation to a predetermined pattern region of each respective light emitting unit (in one or more embodiments, the first light emitting unit 25a and the second light emitting unit 25b). It is not limited to a specific method. For example, it may be used methods of surface exposure, line exposure and point exposure, which will be described later.

The light irradiated in the light irradiation step may contain UV rays, visible light and infrared rays. Preferably, it contains UV rays.

In one or more embodiments of the present invention, a UV ray is an electromagnetic wave having a longer wavelength than an X ray and a shorter wavelength than a shortest wavelength of a visible light. Specifically, it is an electromagnetic having a wavelength of 1 to 400 nm.

Options for generating and irradiating UV rays are not specifically limited as long as they generate UV rays and irradiate with a conventionally known apparatus. Examples of a specific light source are: a UV ray LED, a high pressure mercury lamp, a low pressure mercury lamp, a hydrogen (deuterium) lamp, a rare gas (e.g., xenon, argon, helium, neon) discharge lamp, a nitrogen laser, an excimer laser (e.g., XeCl, XeF, KrF, KrCl), a hydrogen laser, a halogen laser, and a harmonic wave light of various visible (LD) to infrared laser (e.g., THG (Third Harmonic Generation) of YAG laser).

Examples of an exposing method by the second patterning section RL will be described in the following by referring to FIG. 10 to FIG. 12B and by listing the case of conducting surface exposure, line exposure and point exposure.

Here, the second patterning section RL has almost the same constitution as the above-described first film forming room R21. Namely, the second patterning section RL is constituted by containing inside with: a plurality of convey rollers 51 and 52 and receive rollers 53 and 54 conveying the support substrate 21 via a predetermined route, a UV irradiation apparatus L1 facing the film forming surface of the support substrate 21 to be conveyed, and a back side cooling roller 56 to cool the support substrate 21 by contacting the opposite surface of the film forming surface of the support substrate 21. Further, the inside of the second patterning section RL may be provided with: a continuous loop shape mask 60 having an opening section of a predetermined pattern shape, a rotate transport section 70 to rotate transport the continuous mask 60 in the loop direction. The rotate transport section 70 is composed of the convey rollers 71 to 78. When the second patterning section RL conducts point exposure, there is no need to place continuous mask 60L, and there is no need to place the rotate transport section 70 (refer to FIG. 12B).

Each member in the second patterning section RL is composed in the same manner as the member having the same name of the above-described first film forming room R21, except the UV irradiation apparatus L1 and the continuous mask 60L.

(1) Surface Exposure

Figure 10:
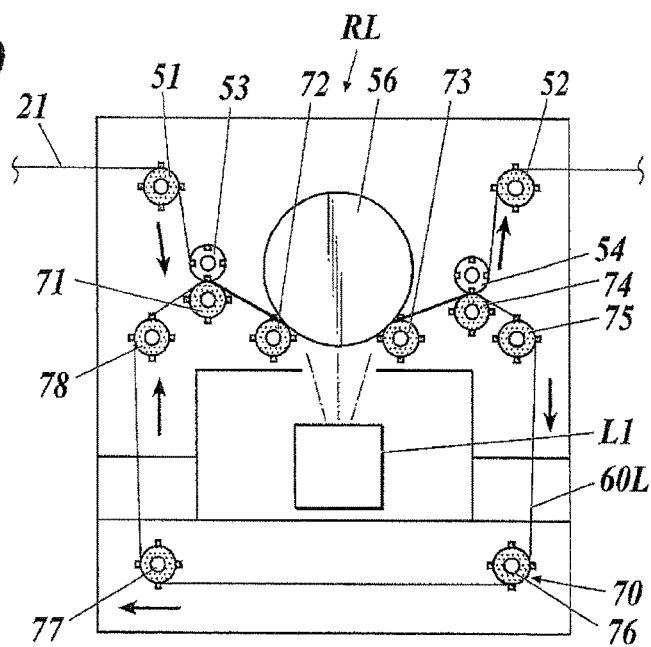
FIG. 10 is a schematic constitutional drawing illustrating an example of a second patterning section.
Figure 11:
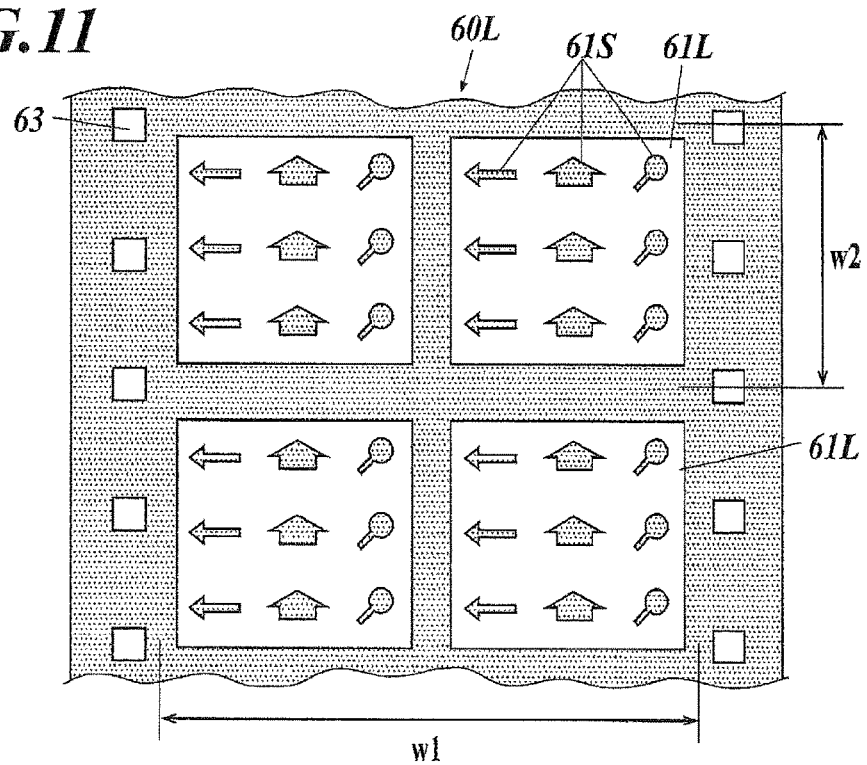
FIG. 11 is a schematic drawing illustrating a part of continuous mask that is provided in a second patterning section according to one or more embodiments.

FIG. 10 is a schematic constitutional drawing illustrating an example of a second patterning section RL doing a surface exposure. FIG. 11 is a schematic drawing illustrating an example of a continuous mask 60L provided in the second patterning section RL indicated in FIG. 10.

The second patterning section RL indicated in FIG. 10 is provided with a UV irradiation apparatus L1 and a continuous mask 60L having a transparent sheet member 61L made of a transparent sheet that is resistive to UV rays such as polyethylene terephthalate (PET).

The UV irradiation apparatus L1 is composed of a plurality of UV LED light sources and eye lenses. It has an irradiation region of the length w1 in the right angle direction to the loop direction and the length w2 in the loop direction. By this, the UV irradiation apparatus L1 can irradiate the transparent sheet member 61L as a whole.

Further, it is preferable that a laying pipe (not illustrated) of water cooling for cooling the UV LED light source is bonded to the outer chiller. By this, the UV LED light source will have a longer lifetime. It can obtain an effect that the running cost of the UV LED light source is decreased.

A pattern portion 61S having a shape of a common function key button is printed to the transparent sheet member 61L possessed by the continuous mask 60L. This pattern portion 61S is made to shield UV rays. Therefore, the UV rays emitted from the UV irradiation apparatus L1 are irradiated through the continuous mask 60L to the first light emitting unit 25a before forming an intermediate electrode. By this, the dulled portion at the edge of the organic functional layer (hole injection layer), which is produced during film formation of the organic functional layer, is made to be non-light emitting portion. Thus, it can produce a sharp pattern without blurring.

(2) Line Exposure

Figure 12A:
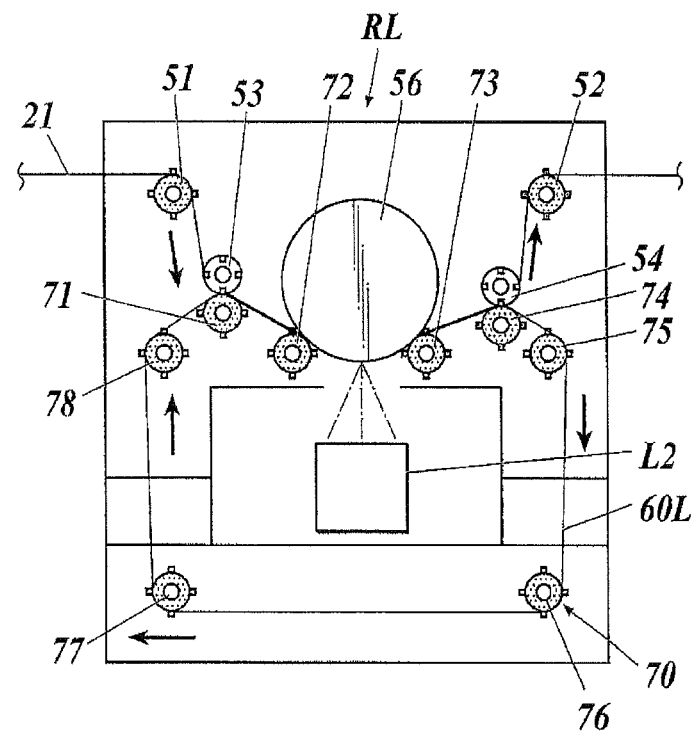
FIG. 12A is a schematic constitutional drawing illustrating an example of a second patterning section.

FIG. 12A is a schematic constitutional drawing illustrating an example of a second patterning section RL doing a line exposure.

The second patterning section RL indicated in FIG. 12A is provided with a UV irradiation apparatus L2 and a continuous mask 60L indicated in FIG. 11.

The light emitted from the UV irradiation apparatus L2 is focused on the continuous mask 60L in a line shape having a length of w1 or more that extends to the right angle direction to the loop direction of the continuous mask 60L.

As described above, by focusing the light emitted from the UV irradiation apparatus L2 to one direction to result in focusing in a line shape, the density of radiation luminance can be made high, and it can reduce the time required for patterning. Further, since the focused light in a line shape is irradiated, the light can be irradiated at about vertical to the surface having the same curvature as the back side cooling roller 56. Thus, it is possible to further reduce the time required for patterning.

(3) Point Exposure

Figure 12B:
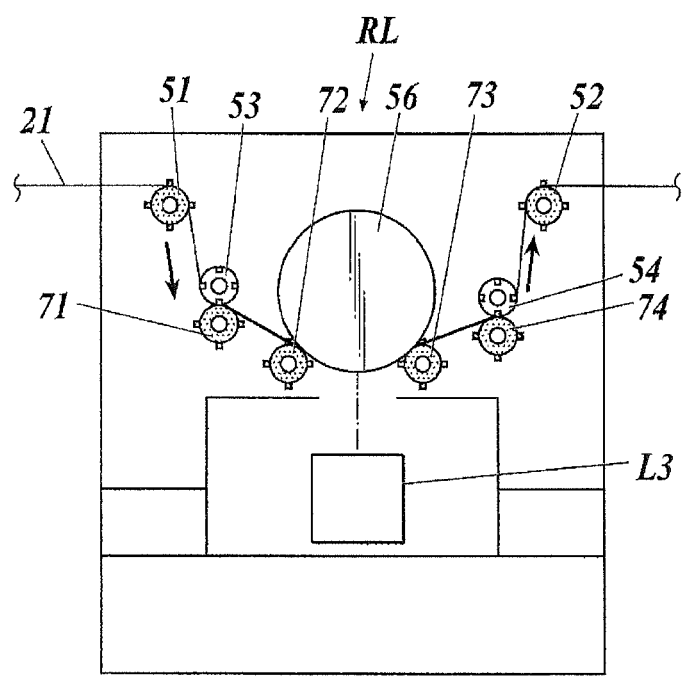
FIG. 12B is a schematic constitutional drawing illustrating an example of a second patterning section.

FIG. 12B is a schematic constitutional drawing illustrating an example of a second patterning section RL doing a point exposure.

The second patterning section RL indicated in FIG. 12B is provided with a focused spot irradiation apparatus L3 which irradiates the light emitting unit with a focused spot formed by focusing the light emitted from the light source.

This focused spot irradiation apparatus L3 is provided with a galvano mirror, and it can scan the focused spot to the right angle direction to the loop direction.

Further, the second patterning section RL is provided with a camera and an emission controlling apparatus inside thereof. It can obtain positional information of the first guide hole 211 of the support substrate 21 to be irradiated by using the camera. The emission controlling apparatus controls the irradiation by the focused spot irradiation apparatus L3 based on the positional information of the first guide hole 211, and it makes trimming of the light emitting pattern.

In addition, the emission controlling apparatus may be incorporated inside of the focused spot irradiation apparatus L3 as described above, or it may be placed at the outside of the second patterning section RL. As a light source, it is preferable to use a laser light source having high directivity.

It may use a blue-violet light source having a wavelength of 400 to 420 nm as a laser light source.

By using this focused spot irradiation apparatus L3, it can draw a light emitting pattern in a shape of a common functional key button mark. In this case, a mask such as a continuous mask is unnecessary, and it can reduce the cost of the mask and maintenance fee of the equipment.

In the 4th film forming room R24, film formation of an intermediate electrode layer 27 is made. In the 4th film forming room R24, a conductive material of a metal or a metal oxide is used. A film formation of an intermediate electrode layer 27 is made with a film forming method such as a vacuum deposition method, a sputter method and an ion plating method. The film forming pressure of the 4th film forming room R24 is preferably set to be in the range of $1 \times 10^{-6}$ to 10 Pa.

In the 5th film forming room R25, film formation of a cathode 26 is made. In the 5th film forming room R25, a conductive material of a metal or a metal oxide is used. A film formation of a cathode 26 is made with a film forming method such as a vacuum deposition method, a sputter method and an ion plating method. The film forming pressure of the 5th film forming room R25 is preferably set to be in the range of $1 \times 10^{-6}$ to 10 Pa.

In one or more embodiments, on one surface of the support substrate 21 are laminated with an anode 23, a taking-out wiring 24, a first light emitting unit 25a, an intermediate electrode layer 27, and a second light emitting unit 25b, and a cathode. This support substrate 21 is continuously conveyed to the 6th film forming room R30 after doing the first patterning step and the second patterning step in the first patterning section and the second patterning section (film forming room R2) each time after producing the light emitting unit.

By this, patterning with light irradiation can be made without being absorbed a part of the irradiation light to the intermediate electrode layer 27. As a result, the time required to do patterning can be reduced and production efficiency can be improved.

In one or more embodiments, it is described an embodiment in which two light emitting units are formed by the composition containing two rooms of 3rd film forming room R23. Embodiments of the present invention are not limited to this. Some embodiments may be a composition having two or more rooms of 3rd film forming room R23 to result in producing three or more light emitting units. In this case, the repeating number of the 3rd film forming rooms R23 are placed, and the second film forming section RL and the 4th film forming room R24 are placed between the 3rd film forming rooms R23.

In the 6th film forming room R30, a film forming step is done to the film forming surface of the support substrate 21 so as to form a sealing layer 28 (refer to FIG. 1).

In the 6th film forming room R30, the sealing layer 28 made of an inorganic compound is formed with a film forming method such as a vacuum deposition method, a sputter method, an ion plating method and a plasma CVD method. In particular, since the sealing layer 28 covers the steps and unevenness of the constituting layers on the support substrate 21, it is preferable that it is formed with a method excellent in step coverage property. As such a film forming method, it can be cited a sputter method, an ion plating method and a plasma CVD method. These methods have relatively high film forming pressure and the raw material can easily come around behind. By using these film forming methods, it can achieve sealing excellent in step coverage property and having precise and high barrier property.

The film forming pressure of the 6th film forming room R30 is set to be a relatively low vacuum condition in the range of 0.1 to 200 Pa by considering the balance of the step coverage property and the film density. When this film forming pressure is used, an excellent step coverage property can be obtained. On the other hand, if the mask is not sufficiently closely contacted to the support substrate 21 during the film formation with a mask, the precision of the film formed pattern will be decreased due to the coming around behind of the raw material. In one or more embodiments of the present invention, since film formation is done to the support substrate 21 that is easily bent compared with a glass substrate, it can prevent separation of the mask. When the sealing layer 28 is formed with a vacuum deposition method, the coming around behind of the raw material can be decreased even if the mask is separated. Therefore, this method is effective to increase a pattern precision.

Subsequently, the support substrate 21 is continuously transported from the 6th film forming room R30 to an accumulating room R40. In the accumulating room R40, the pressure and the transport speed of the support substrate 21 are adjusted, then, the support substrate 21 is continuously transported into a laminating room R50 with keeping the reduced pressure.

In the production method according to one or more embodiments of the present invention, it is preferable to conduct a laminating step in which a belt type back side film 4 (refer to FIG. 1) that is continuously transported is bonded to the film forming surface of the support substrate 21 via resin adhesive layer 3 (refer to FIG. 1).

Figure 13:
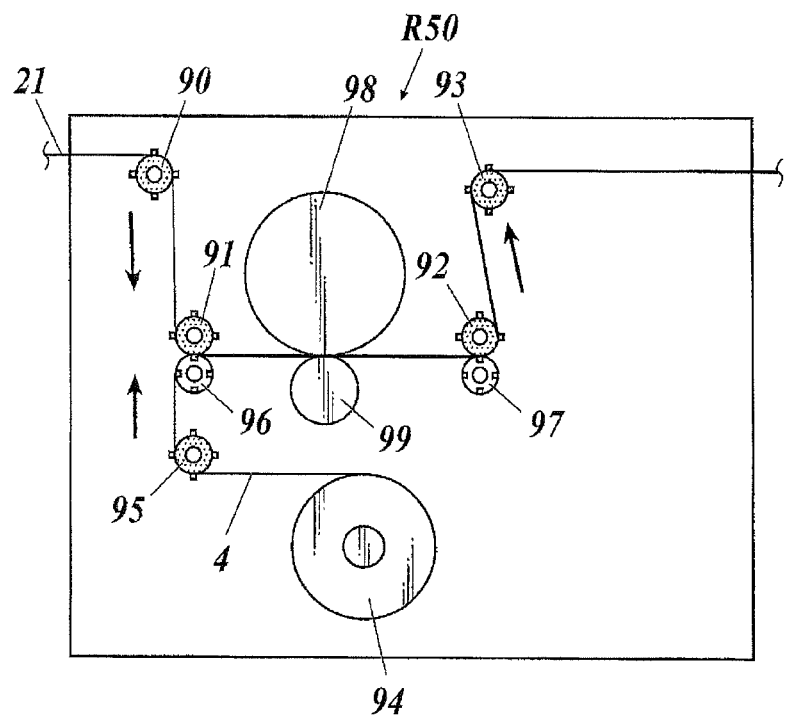
FIG. 13 is a schematic constitutional drawing illustrating a laminate room constituting a production apparatus of an organic EL element according to one or more embodiments.

The laminating room R50 is described by referring to FIG. 13. FIG. 13 is a schematic constitutional drawing of the laminating room R50. The inside of the laminating room R50 is preferably set to be a vacuum or reduced condition.

The laminating room R50 is composed of: a plurality of convey rollers 90 to 93 conveying the support substrate 21 via a predetermined route; a second feeding out section 94 that support a back side film 4 in a roll condition; convey roller 95 that conveys the back side film 4 to the position in which the support substrate 21 can be adhered; receive rollers 96 and 97 that interpose the support substrate 21 and the back side film 4 between the convey rollers; and a heat roller 98 and a pressure roller 99 that heat and press the adhered support substrate 21 and the back side film 4. Here, an adhesive layer 3 is provided beforehand to a surface of the back side film 4 facing to the support substrate 21.

The plurality of convey rollers 90 to 93 are composed in the same manner as the above-described convey roller 71. The support substrate 21 can be smoothly conveyed by inserting projections (not illustrated) in the first guide holes 211 of the support substrate 21. Among these convey rollers 90 to 93, the convey rollers 91 and 92 are arranged to contact the receive rollers 96 and 97.

Figure 14:
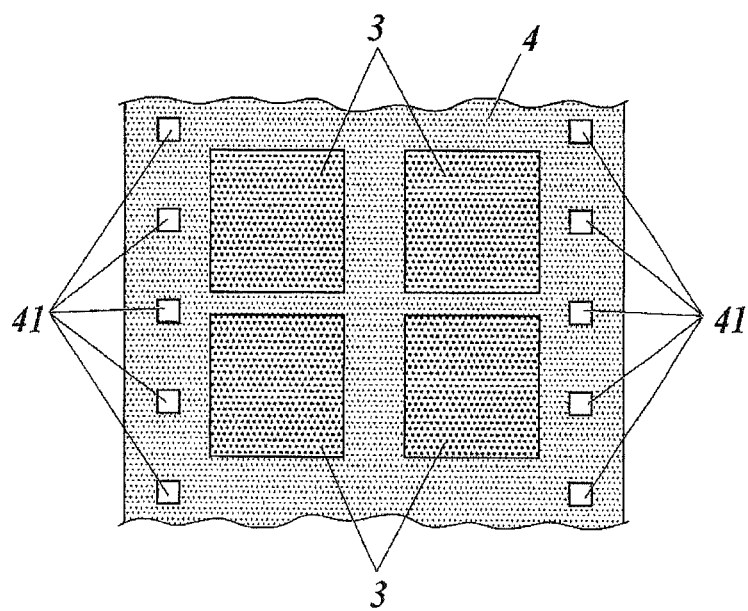
FIG. 14 is a schematic drawing illustrating a part of back side film according to one or more embodiments.

The second feeding out section 94 supports the back side film 4 wound in a roll and feeds out the back side film 4 sequentially. As indicated in FIG. 14, an adhesive layer 3 is provided beforehand to a surface of the back side film 4 facing to the support substrate 21. In the production apparatus 100 of the present embodiment, since the back side film 4 is adhered to the film forming surface of the support substrate 21 by heat and pressure of the heat roller 98 and the pressure roller 99, the resin adhesive layer 3 is composed of a heat curable resin.

The back side film 4 has a plurality of 3rd guide holes 41 having apertures with an equivalent interval of the first guide holes 211 of the support substrate 21 at two edge portions of the width direction in the conveying direction (transport direction).

The convey roller 95 is composed in the same manner as the above-described convey roller 71. The back side film 4 can be smoothly conveyed by inserting projections (not illustrated) in the third guide holes 41 of the back side film 4.

The receive roller 96 and 97 are composed in the same manner as the above-described receive roller 53.

The projections of the convey rollers 91 and 92 are made to be contained in the concave portions (not illustrated) of the receive rollers 96 and 97. As a result, the convey rollers 91 and 92 are contacted with the receive rollers 96 and 97 without space. By this, the back side film 4 is overlapped to the support substrate 21 and these are closely bonded.

The projections of the convey rollers 91 and 92 are inserted in the first guide holes 211 of the support substrate 21, and at the same time, they are inserted in the 3rd guide holes 41 of the back side film 4. Since the first guide holes 211 and the 3rd guide holes 41 are formed in a corresponding position with each other, it can overlap the back side film 4 and the support substrate 21 with making alignment. Consequently, alignment of high precision can be made while conveying the support substrate 21 without using a complex alignment mechanism. Thus by overlapping the back side film 4 with making alignment, it can prevent the resin adhesive layer 3 and the back side film 4 from covering the taking-out electrode 24 placed on the support substrate 21. Thus, the production yield can be improved.

The heat roller 98 and the pressure roller 99 are made in close contact from the thickness direction with the overlapped support substrate 21 and the back side film 4 by the convey roller 91 and the receive roller 96, and, the back side film 4 is adhered via the resin adhesive layer 3 to the film forming surface of the support substrate 21 by heating and pressing.

In the laminating room R50, it may be provided with a curing mechanism by light or heat to the support substrate 21 adhered with the back side film 4 in the downstream side of the conveying direction with respect to the heat roller 98 and the pressure roller 99.

Finally, the support substrate 21 is continuously conveyed from the laminating room R50 to the winding room R60, and it is wound in the winding room R60.

The organic EL element 1 produced as described above has a constitution in which a portion except the taking-out wiring 24 is covered with the sealing layer 28 and the back side film 4. In the organic EL element 1, the taking-out wiring 24 is connected with an electric source unit (electric power supplying member) composed of a print board or flexible board having IC (not illustrated). Moreover, the organic EL element 1 is used as an illuminating device or a light emitting device by making to have a composition reinforced with a body, a frame member and a fixing substrate.

In the above-described production method and the production apparatus 100, the continuous mask 60 is provided in all of the film forming rooms R21 to R25 and R30. However, the continuous mask 60 may be provided in any one of the film forming rooms R21 to R25 and R30.

Further, in the above-described production method and the production apparatus 100, the laminating step is continuously done to the organic. EL element 1 itself. However, the laminating step may be done by a different apparatus.

With respect to a light emitting unit which is not laminated an intermediate electrode layer 27 on the light extracting surface side, light irradiation may be done after sealing even if light irradiation is not done with a second patterning RL. For example, when the light extracting surface side is a side of the support substrate 21, the first light emitting unit 25a is not irradiated with light, and after completing the sealing, the light irradiation may be done from the side of the support substrate 21.

In the following, it will be described each layer which constitutes an organic EL element according to one or more embodiments of the present invention produced by the above-described method and production apparatus 100.

<Intermediate Electrode Layer>

An intermediate electrode layer (also called as an intermediate metal layer) according to one or more embodiments of the present invention is arranged between two light emitting units.

An intermediate electrode layer may have a state in which a film made of metal substance is not formed in a part of the fine region and to form a pinhole or a mesh structure in the plane direction of the layer. Otherwise, an intermediate electrode layer forming portion may form an island shape (macule).

In the intermediate electrode layer according to one or more embodiments of the present invention, a metal is employed.

Examples of a substance used in the intermediate electrode layer are: aluminum (work function: 4.28 eV, melting point: 933.5 K), silver (work function: 4.26 eV, melting point: 1235.9 K), calcium (work function: 2.87 eV; melting point: 1112.2 K), lithium (do.: 2.9 eV; do.: 453.7 K), sodium (do.: 2.75 eV; do.: 371 K), potassium (do.: 2.3 eV; do.: 336.9 K), cesium (do.: 2.14 eV; do.: 301.6 K), rubidium (do.: 2.16 eV; do.: 312.1 K), barium (do.: 2.7 eV; do.: 998.2 K), and strontium (do.: 2.59 eV, do.: 1042.2 K).

Among them, aluminum, silver, lithium, calcium and barium are preferable. These substances have a melting point at normal pressure of 400 K or more and they will hardly deteriorate the performance of an organic EL element at a high temperature. In addition, when aluminum or silver is used for an intermediate electrode layer, the intermediate electrode layer is arranged to be adjacent to an electron injection layer.

A thickness of an intermediate electrode layer is preferably in the range of 0.6 to 5 nm, more preferably, in the range of 0.8 to 3 nm, and still more preferably, in the range of 0.8 to 2 nm.

When a thickness of an intermediate electrode layer is 5 nm or less, it will inhibit deterioration in efficiency of an organic EL element due to light absorption of the metal substance employed. And, there will be no deterioration in storage stability and driving stability of an organic EL element.

On the other hand, when a thickness of an intermediate conductive layer is 0.6 nm or more, it will result in increased property stability, in particular, it will result in achieving small property change in the early stage after production of an element.

In addition, "a thickness of an intermediate electrode layer" according to one or more embodiments of the present invention is defined as "an average thickness" which is calculated by dividing the formed film mass per unit area with a density of the material. Consequently, it does not matter whether a thickness of an intermediate electrode layer at an arbitral portion is larger or smaller compared with "an average thickness".

In addition, the intermediate electrode layer may be formed with the same metal as used for an anode and a cathode described later.

In one or more embodiments of the present invention, from the viewpoint of avoiding deterioration of the conductivity in the voltage application direction of the intermediate electrode layer, and controlling the conductivity in in-plane direction, it is preferable that at least one of the surfaces of the intermediate electrode layer is formed as a non-flat surface instead of the case in which a surface of the intermediate electrode layer facing the light emitting unit has a complete flat surface. When the intermediate electrode layer has a non-flat surface, this indicates that the shape of the intermediate electrode layer in the in-plane direction has a mesh structure or an island structure.

In addition, it is preferable that a layer adjacent to the intermediate electrode layer and located in the side of the anode is formed with a film formation using a single organic compound. This makes the production process to be simple and can easily control the production process. Further, it is preferable since it can reduce the risk of property variation caused by using a plurality of materials, and it will result in excellent long term stability, high temperature stability or long term driving stability.

It is preferable that the layer adjacent to the intermediate electrode layer has a function (between the light emitting unit located in the side of the cathode and the light emitting unit located in the side of the anode via the intermediate electrode layer) of giving and receiving a charge or injecting a charge to each light emitting unit. As a layer having such function, in order to increase a charge transport property, it is preferable to form a mixture layer composed of a charge transporting organic compound with an inorganic material or an organic metal complex which can oxidize or reduce the organic compound, or can form a charge transfer complex.

<Light Emitting Layer>

It is preferable that a light emitting layer contains a host compound and a light emitting dopant. The light emitting dopant contained in the light emitting layer may be uniformly included in the thickness direction of the light emitting layer, or it may be included in a manner having a density gradient.

A thickness of each light emitting layer in each light emitting unit is not specifically limited. From the viewpoint of obtaining uniformity of the formed layer, preventing unnecessary high voltage application at the time of light emission and achieving improvement of emission color with respect to the driving voltage, it is preferable that the thickness of each light emitting layer is adjusted in the range of 5 to 200 nm, and more preferably, it is adjusted in the range of 10 to 100 nm.

In the following, a host compound and a phosphorescent dopant contained in the light emitting layer will be described.

(1) Host Compound

A structure of a host compound used for one or more embodiments of the present invention is not particularly limited. Representative compounds include those having a basic skeleton such as: carbazole derivatives, triarylamine derivatives, aromatic borane derivatives, nitrogen-containing heterocyclic compounds, thiophene derivatives, furan derivatives, oligoarylene compounds, carboline derivatives, or diazacarbazole derivatives (here, "a diazacarbazole derivative" indicates a ring structure in which at least one of the carbon atoms constituting the carboline ring is replaced with a nitrogen atom).

A host compound may be used singly, or a plurality of phosphorescent host compounds may be used together.

A host compound used in a light emitting layer according to one or more embodiments of the present invention is preferably a compound represented by Formula (a).

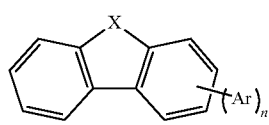

Formula (a)

In Formula (a), "X" represents NR', O, S, CR'R", or SiR'R". R' and R" each independently represent a hydrogen atom or a substituent. "Ar" represents an aromatic ring. "n" is an integer of 0 to 8.

With respect to "X" in Formula (a), examples of a substituent represented by R' or R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, an allyl group, 1-propenyl group, 2-butenyl group, 1,3-butadienyl group, 2-pentenyl group and iso-propenyl group); an alkynyl group (for example, an ethynyl group and a propargyl group); an aromatic hydrocarbon group (also called an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyl group); an aromatic heterocyclic group (for example, a furyl group, a thienyl group, a pyridyl group, a pyridazinyl group, a pyrimidinyl group, a pyrazinyl group, a triazinyl group, group, an imidazolyl group, a pyrazolyl group, a thiazolyl group, a quinazolinyl group, a carbazolyl group, a carbolinyl group, a diazacarbazolyl group (indicating a ring structure in which one of the carbon atoms constituting the carboline ring of the carbolinyl group is replaced with nitrogen atoms), and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group) and a phosphono group.

These substituents may be further substituted by the above-mentioned substituent. Further, a plurality of these substituents may combine with each other to form a ring.

In Formula (a), "X" is preferably NR' or O, and R' is particularly preferable to be an aromatic hydrocarbon ring group or an aromatic heterocyclic group.

In Formula (a), an aromatic ring represented by "Ar" is an aromatic hydrocarbon ring or an aromatic heterocyclic ring.

An aromatic ring represented by "Ar" maybe a single ring or a condensed ring. In addition, it may be unsubstituted or it may have a substituent represented by R' and R".

Examples of an aromatic hydrocarbon ring represented by "Ar" in Formula (a) include: a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring, and an anthraanthrene ring.

Examples of an aromatic heterocyclic ring represented by "Ar" in Formula (a) include: a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, and a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (indicating a ring structure in which one of the carbon atoms constituting the carboline ring is replaced with a nitrogen atom).

Among the above-described rings, preferable rings used for an aromatic ring represented by "Ar" in Formula (a) are a carbazole ring, a carboline ring, a dibenzofuran ring, and a benzene ring. More preferably used rings are a carbazole ring, a carboline ring, and a benzene ring. Most preferably used ring is a benzene ring having a carbazolyl group.

As an aromatic ring represented by "Ar" in Formula (a), one of the preferable embodiments is a condensed ring having three or more rings. Specific examples of a condensed aromatic hydrocarbon ring having three or more rings are: a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronen ring, a hexabenzocoronen ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, coronene ring, a naphthocoronen ring, an ovalene ring, and an anthraanthrene ring.

Specific examples of a condensed aromatic heterocyclic ring having three or more rings are: an acridine ring, a benzoquinoline ring, a carbazole ring, a carboline ring, a phenazine ring, a phenanthridine ring, a phenanthroline ring, a carboline ring, a cycladine ring, a quindoline ring, a tepenidine ring, a quinindoline ring, a triphenodithiazine ring, a triphenodioxazine ring, a phenanthrazine ring, an anthrazine ring, perimidine ring, a diazacarbazole ring (indicating a ring structure in which one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, and a thiophanthrene ring (a naphthothiophene ring).

In Formula (a), n is an integer of 0 to 8. Preferably, n is an integer of 0 to 2. In particular, when "X" represents O or S, n is preferably an integer of 1 or 2.

Specific examples of a host compound represented by Formula (a) are listed in the following, however, embodiments of the present invention are not limited to them.

1-1

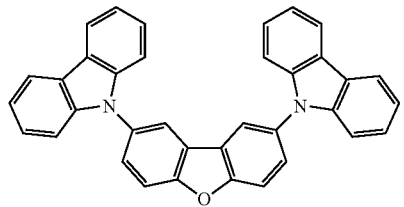

1-2

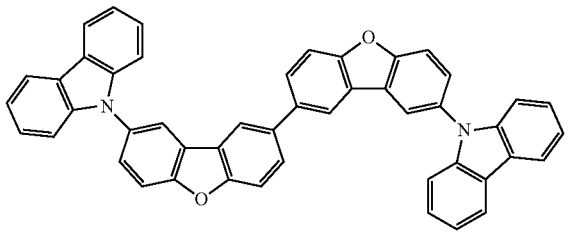

1-3

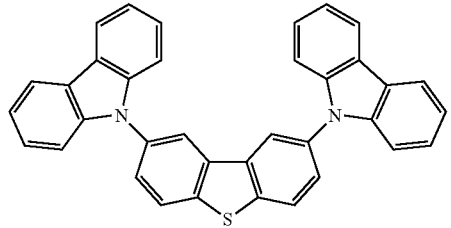

1-4

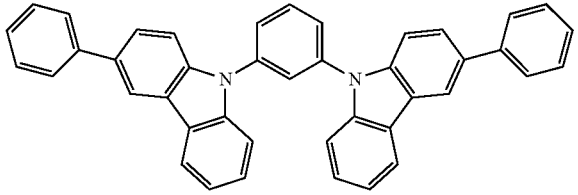

1-5

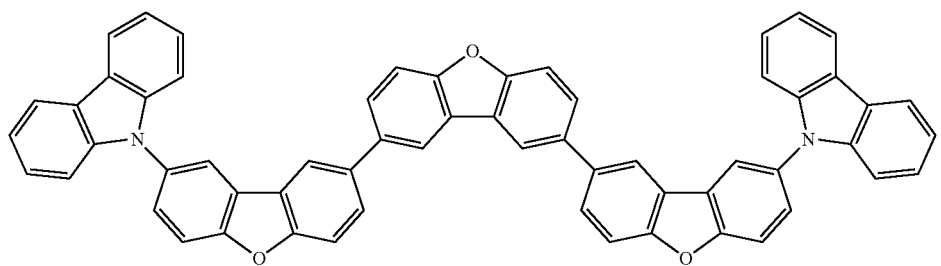

-continued
1-6
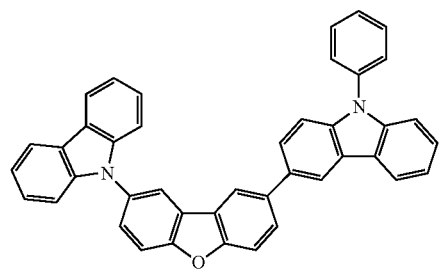
1-7
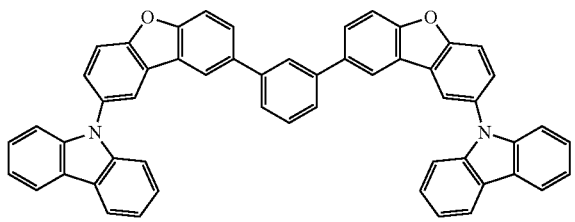
1-8
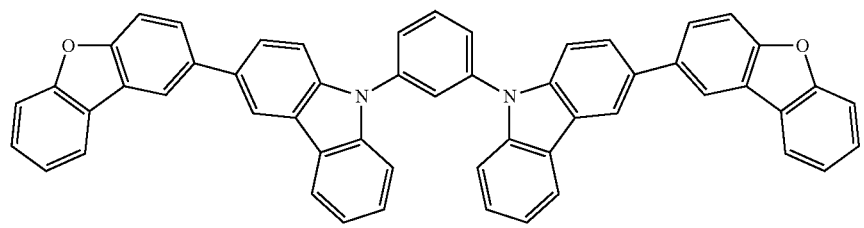
1-9
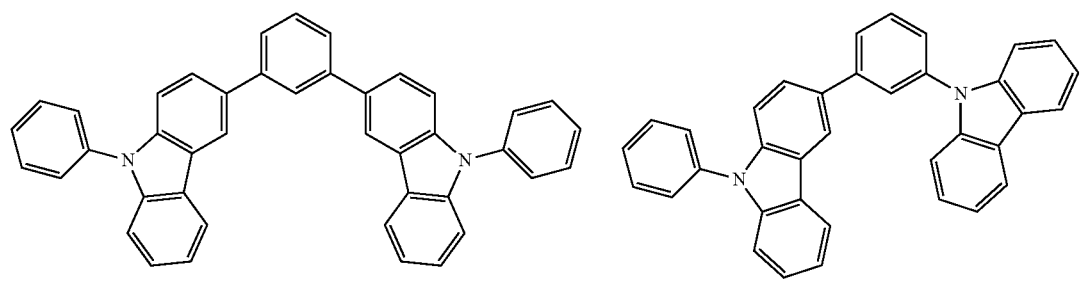
1-10
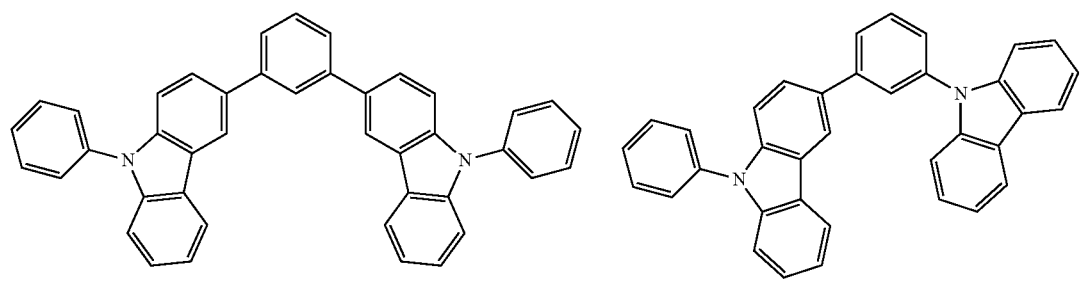
1-11
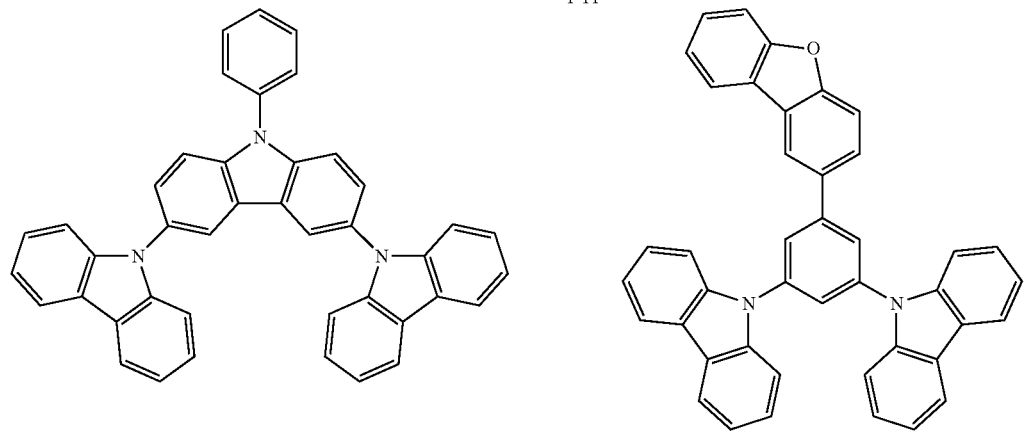
1-12
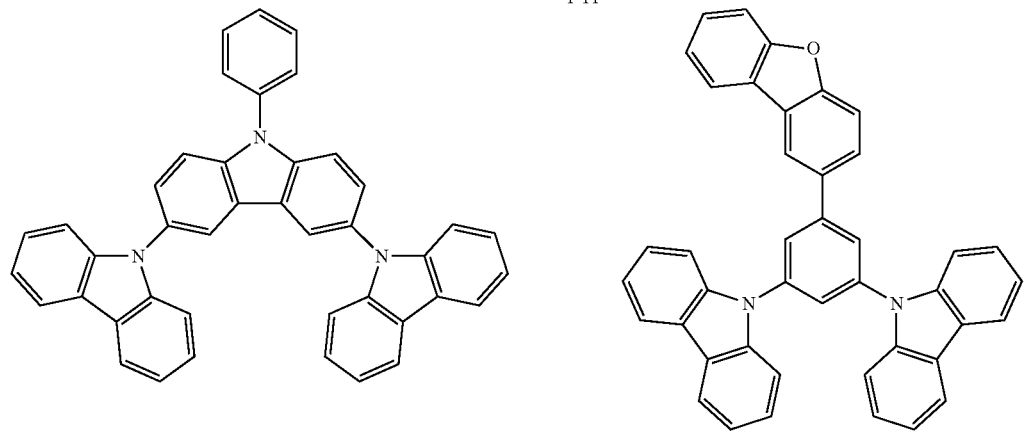
1-13
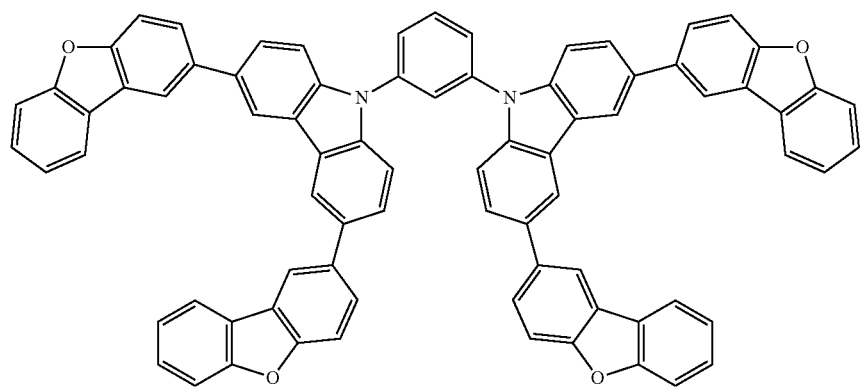

-continued
1-14
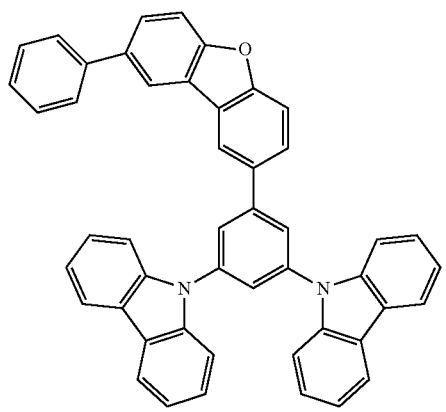
1-15
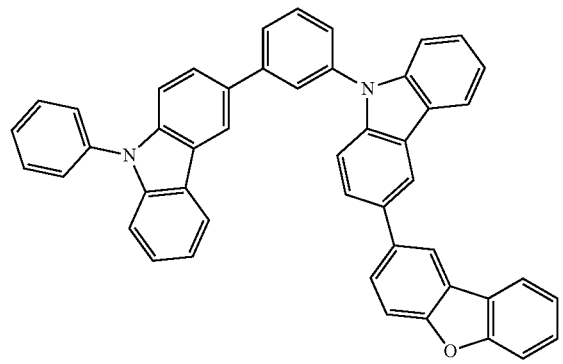
1-16
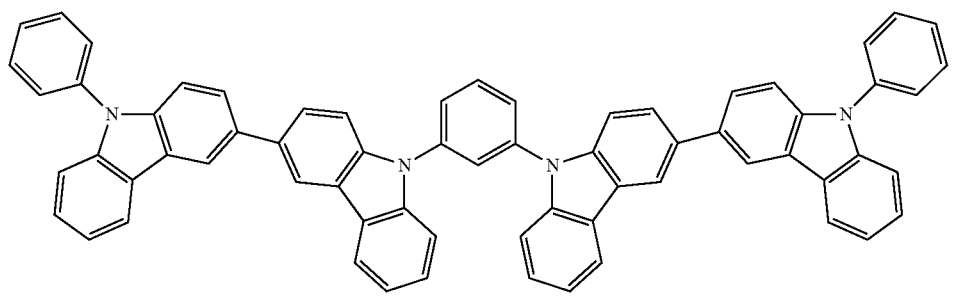
1-17
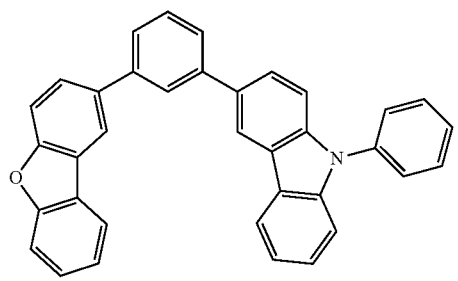
1-18
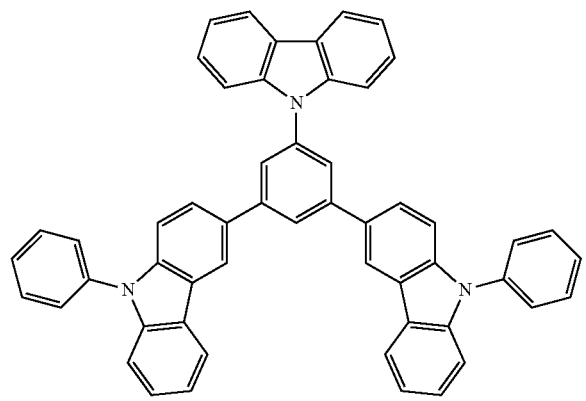
1-19
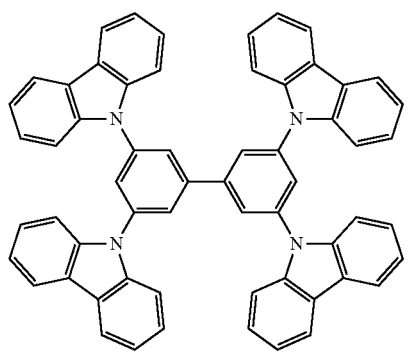
1-20
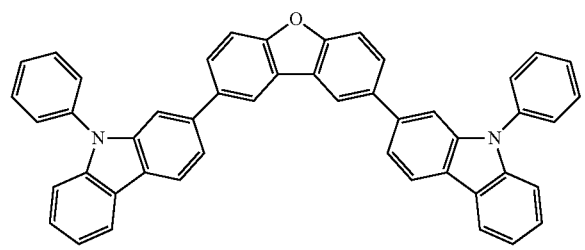

-continued
1-21
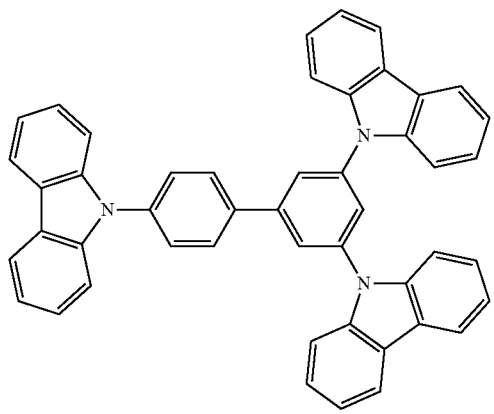
1-22
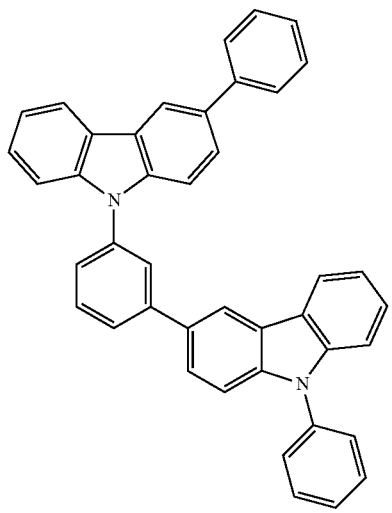
1-23
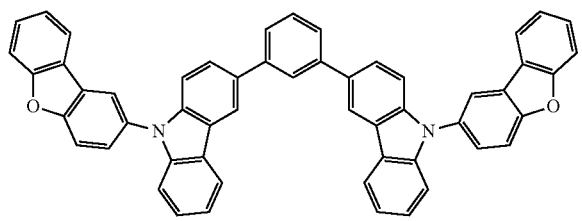
1-24
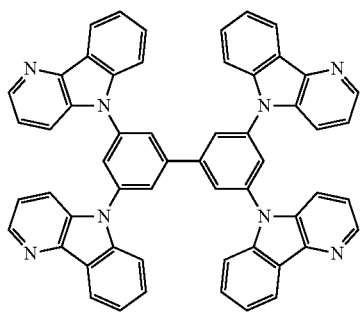
1-25
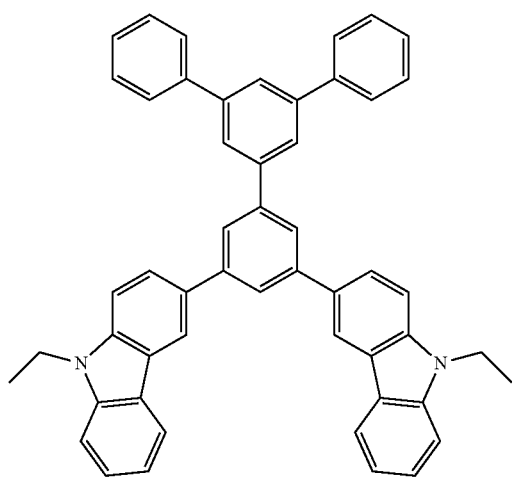
1-26
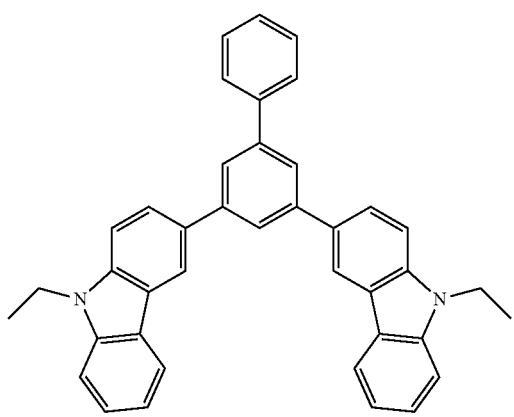

1-27
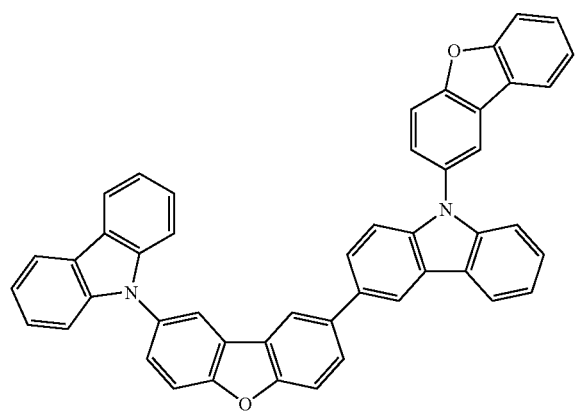
1-28
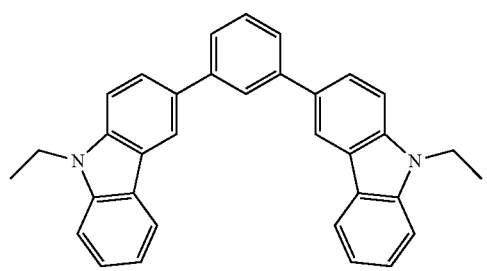
1-29
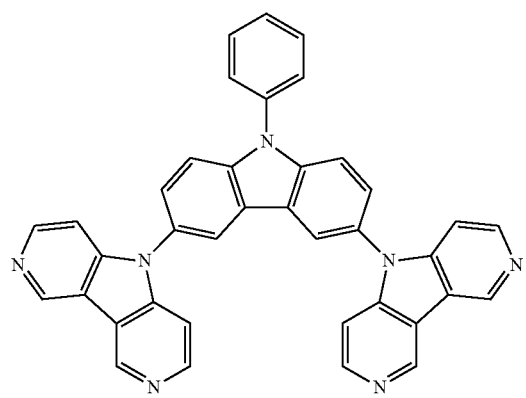
1-30
1-31
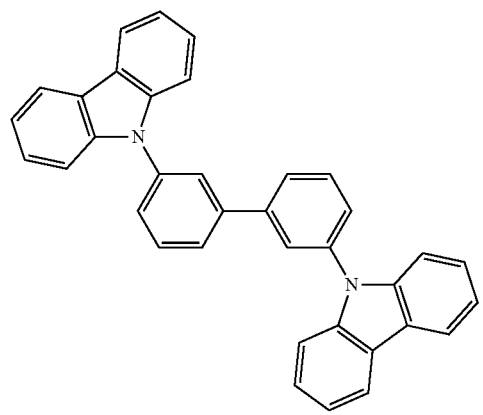
1-32
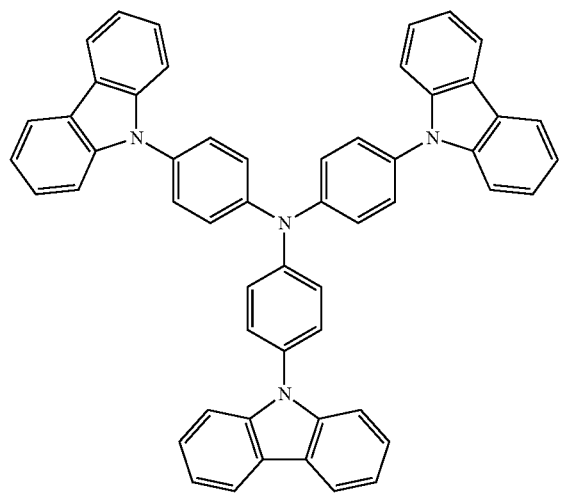
1-33
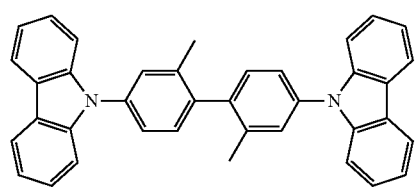
1-34
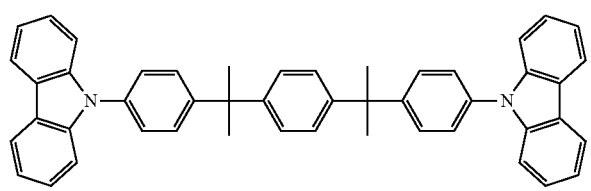

-continued
1-35
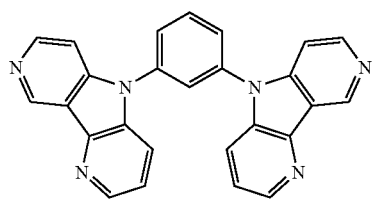
1-36
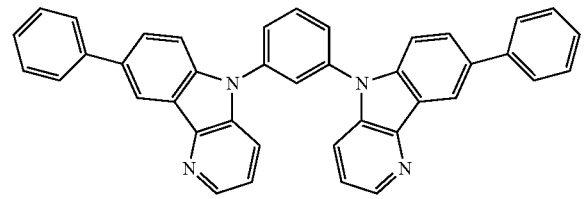
1-37
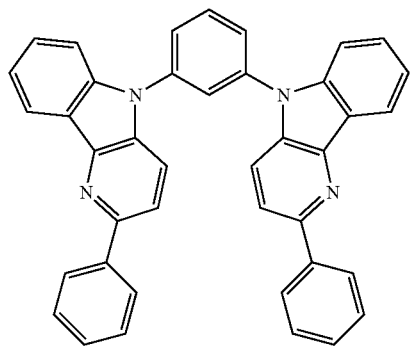
1-38
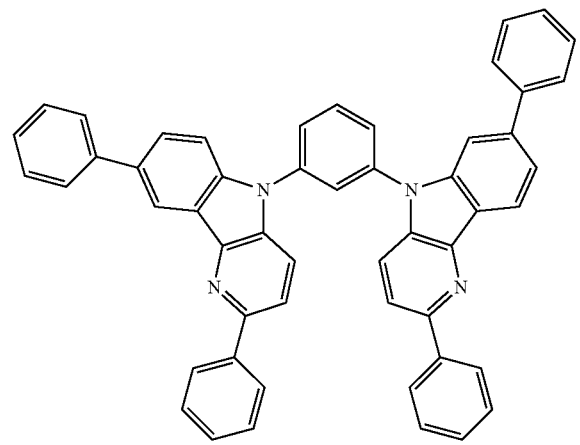
1-39
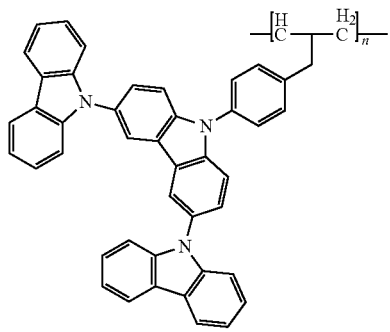
1-40
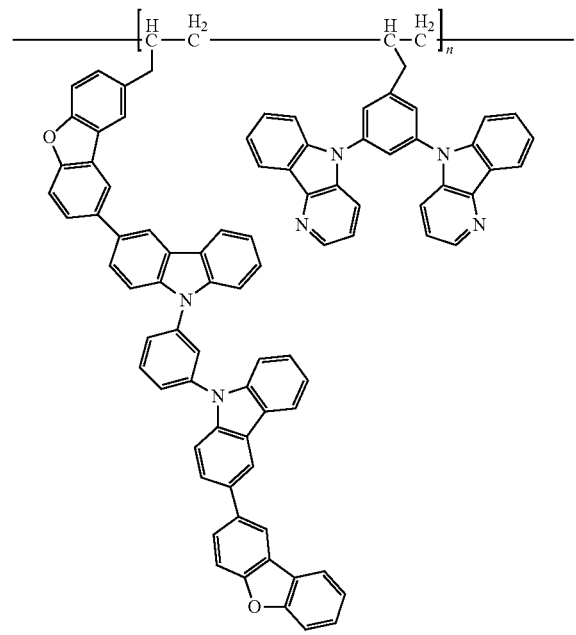

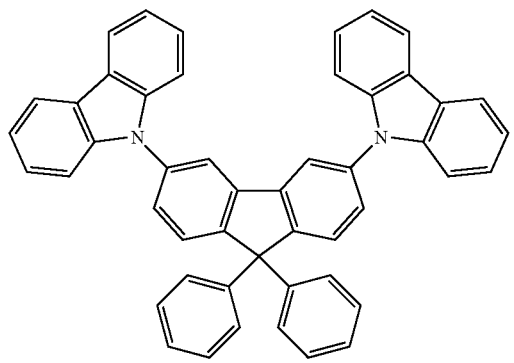

1-41

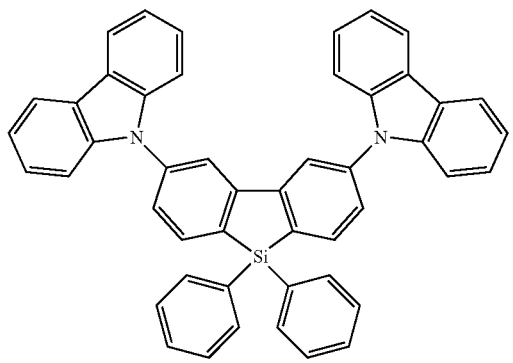

1-42

Further, a host compound used in one or more embodiments of the present invention may be either a low molecular weight compound or a polymer compound having a repeating unit, in addition to a low molecular weight compound provided with a polymerizing group such as a vinyl group and an epoxy group (a vapor deposition polymerizable light emitting host).

It is preferable that the host compound is a compound having properties of hole transport ability and electron transport ability, and at the same time, preventing longer wavelength of emitted light and having a high Tg (glass transition temperature). In one or more embodiments of the present invention, preferable is a compound having a Tg of 90° C. or more, more preferable is a compound having a Tg of 130° C. or more to obtain an excellent performance.

Here, a glass transition temperature (Tg) is a value obtained with DSC (Differential Scanning Colorimetry) based on the method described in JIS K 7121.

Conventionally known host compounds may be used in one or more embodiments of the present invention. Specific examples of a known host compound are described in the following documents, and they may be suitably used. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

When an organic EL element according to one or more embodiments of the present invention has a plurality of light emitting layers, a host compound may be different in each light emitting layer. However, it is preferable to use the same compound in view of the production efficiency and production control.

Preferably, a host compound has the lowest excited triple energy level ($T_1$) of 2.7 eV or more to obtain a higher light emitting efficiency.

In one or more embodiments of the present invention, the lowest excited triple energy level ($T_1$) indicates a peak energy level of a light emitting band corresponding to transition between the lowest vibration bands of the phosphorescent emission spectrum observed at a liquid nitrogen temperature from the host compound dissolved in a solvent.

(2) Phosphorescent Dopant

A phosphorescent dopant usable in one or more embodiments of the present invention may be selected from the known compounds. Examples thereof are metal complexes containing a metal belonging to groups 8 to 10 in the periodic table. Preferable are an iridium compound, an osmium compound, a platinum compound (platinum complex compound), or a rare earth complex. Among them, most preferable is an iridium compound.

When an organic EL element emitting white light is produced, phosphorescent emission materials are preferably used at least for light emitting substances of green, yellow, and red region.

(Partial Structures Represented by Formulas (A) to (C).

When a blue phosphorescent dopant is used as a phosphorescent dopant, it may be suitably selected from the known compounds used in a light emitting layer of an organic EL element. However, it is preferable that it contains at least one partial structure represented by any one of the following Formulas (A) to (C).

Formula (A)

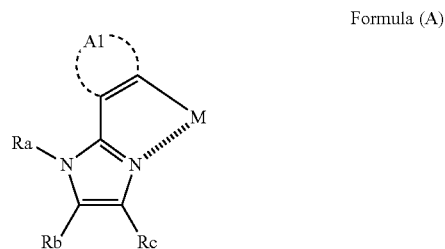

In Formula (A), "Ra" represents a hydrogen atom, an aliphatic group, an aromatic group, or a heterocyclic group. "Rb" and "Rc" each independently represent a hydrogen atom or a substituent. "A1" represents a residue which is necessary to form an aromatic group or a heterocyclic group. "M" represents Ir or Pt.

Formula (B)

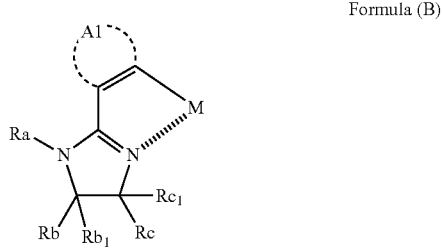

In Formula (B), "Ra" represents a hydrogen atom, an aliphatic group, an aromatic group, or a heterocyclic group. "Rb", "Rc", "Rb$_1$" and "Rc$_1$" each independently represent a hydrogen atom or a substituent. "A1" represents a residue which is necessary to form an aromatic group or a heterocyclic group. "M" represents Ir or Pt.

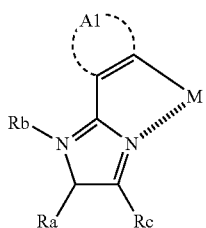

Formula (C)

In Formula (C), "Ra" represents a hydrogen atom, an aliphatic group, an aromatic group, or a heterocyclic group. "Rb" and "Rc" each independently represent a hydrogen atom or a substituent. "A1" represents a residue which is necessary to form an aromatic group or a heterocyclic group. "M" represents Ir or Pt.

Examples of an aliphatic group represented by "Ra" in Formulas (A) to (C) are: an alkyl group (for example, a methyl group, an ethyl group, a propyl group, a butyl group, a pentyl group, an iso-pentyl group, a 2-ethyl-hexyl group, an octyl group, an undecyl group, a dodecyl group, and a tetradecyl group); a cycloalkyl group (for example, a cyclopentyl group and a cyclohexyl group); an aryl group (for example, a phenyl group, a tolyl group, an azulenyl group, an anthranyl group, a phenanthryl group, a pyrenyl group, a chrysenyl group, a naphthacenyl group, an o-terphenyl, a m-terphenyl group, a p-terphenyl group, an acenaphthenyl group, a coronenyl group, a fluorenyl group, and a perylenyl group); a heterocyclic group (for example, a pyrrolyl group, an indolyl group, a furyl group, a thienyl group, an imidazolyl group, a pyrazolyl group, an indolizinyl group, a quinolinyl group, a carbazolyl group, an indolinyl group, a thiazolyl group, a pyridyl group, a pyridazinyl group, a thiadiazinyl group, an oxadiazolyl group, a benzoquinolinyl group, a thiadiazolyl group, a pyrrolothiazolyl group, a pyrrolopyridazinyl group, a tetrazolyl group, an oxazolyl group, and a chromanyl group.

These groups may have a substituent represented by R' and R" in Formula (a).

Examples of a substituent represented by "Rb", "Rc", "Rb$_1$" and "Rc$_1$" in Formulas (A) to (C) are: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, and an allyl group); an alkynyl group (for example, an ethynyl group and a propargyl group); an aryl group (for example, a phenyl group and a naphthyl group); an aromatic heterocyclic group (for example, a furyl group, a thienyl group, a pyridyl group, a pyridazinyl group, a pyrimidinyl group, a pyrazinyl group, a triazinyl group, group, an imidazolyl group, a pyrazolyl group, a thiazolyl group, a quinazolinyl, and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsdfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; and a silyl group (for example, a trimethylsilyl group, a triisopropylsilyl group, a triphenylsilyl group, and a phenyldiethylsilyl group).

These groups may be further substituted with the above-described groups.

Examples of an aromatic ring represented by "A1" in Formulas (A) to (C) include: a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring, and an anthraanthrene ring. Examples of an aromatic heterocyclic ring include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, and a triazole ring, an indole ring, a benzimidazole ring, a benzothiaxole ring, a benzoxazole ring, a quinoxaline ring, a quinazoline ring, a phthalazine ring, a carbazole ring, a carboline ring, and a diazacarbazole ring (indicating a ring structure in which one of the carbon atoms constituting the carboline ring is replaced with a nitrogen atom).

In Formulas (A) to (C), "M" represents Ir or Pt. In particular, Ir is preferable.

The structures of Formulas (A) to (C) are a partial structure. In order to become a emission dopant having a complete structure, it is required a ligand corresponding to the valence of the center metal. Examples of such ligand are: a halogen (for example, a fluorine atom, a chlorine atom, a bromine atom and an iodine atom), an aryl group (for example, a phenyl group, a p-chlorophenyl group, a mesityl group, a tolyl group, a xylyl group, a biphenyl group, a naphthyl group, an anthryl group, and a phenanthryl group), an alkyl group (for example, a methyl group, an ethyl group, an isopropyl group, a hydroxyethyl group, a methoxymethyl group, a trifluoromethyl group, and a t-butyl group), an alkyloxy group, an aryloxy group, an alkylthio group, an arylthio group, an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, and a phthalazinyl group, and a partial structure obtained by eliminating a metal from Formulas (A) to (C).

As an emission dopant, preferable is a tris body which forms a complete structure with 3 pieces of partial structure of Formulas (A) to (C).

Examples of a blue phosphorescent dopant having a partial structure of Formulas (A) to (C) are listed in the following, however, embodiments of the present invention is not limited to them.

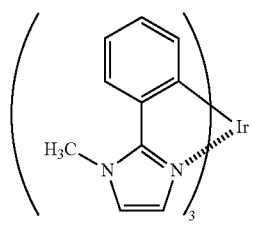

D-1

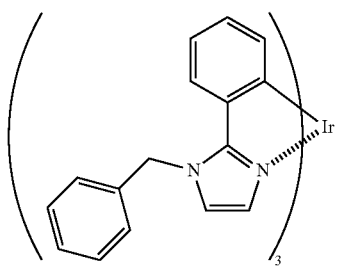

D-2

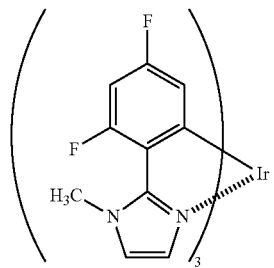

D-3

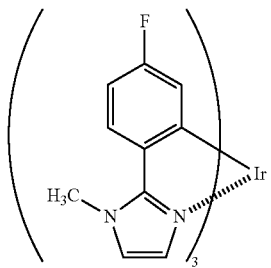

D-4

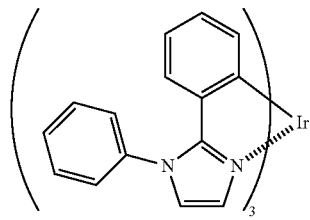

D-5

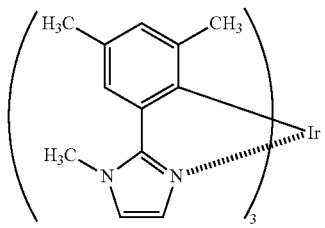

D-6

-continued
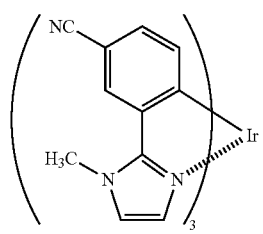 D-7
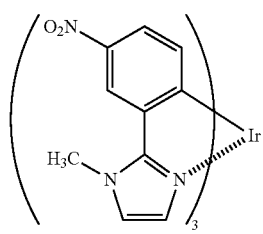 D-8
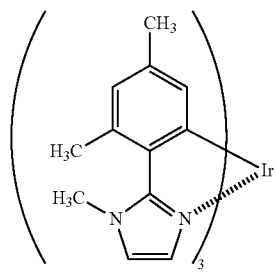 D-9
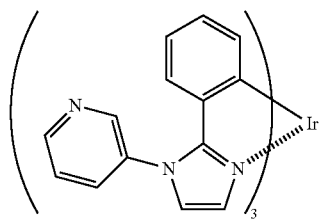 D-10
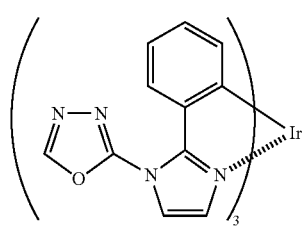 D-11
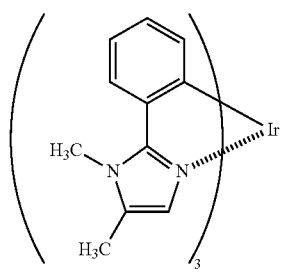 D-12
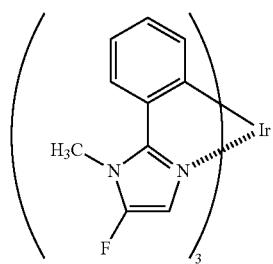 D-13
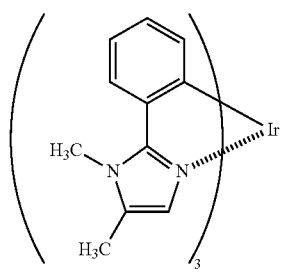 D-14
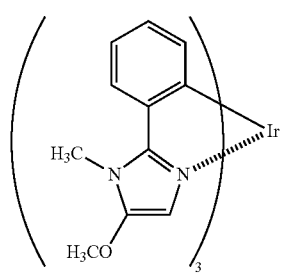 D-15
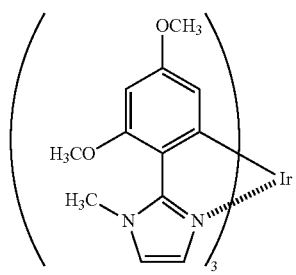 D-16
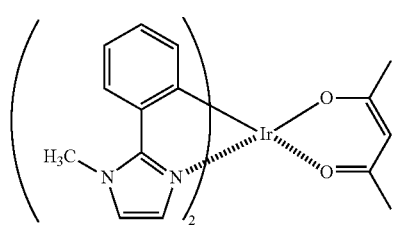 D-17
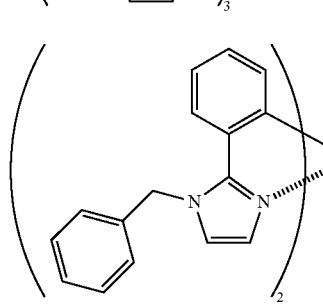 D-18

-continued
D-19
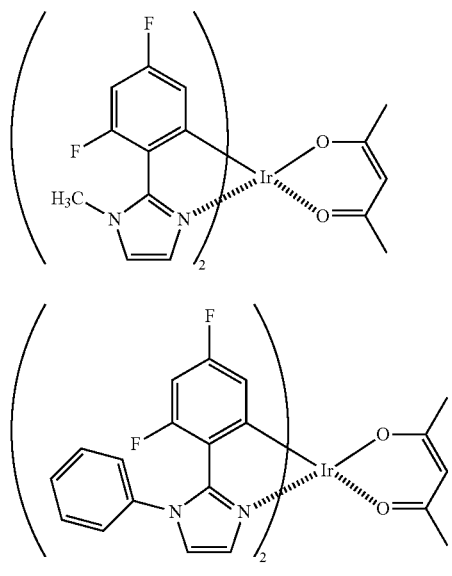
D-20
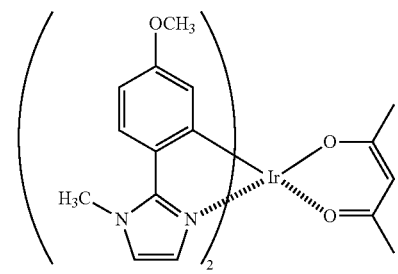
D-21
D-22
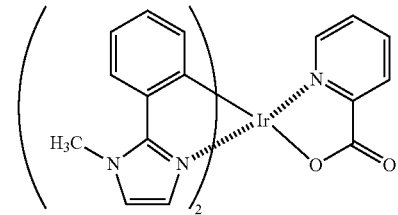
D-23
D-24
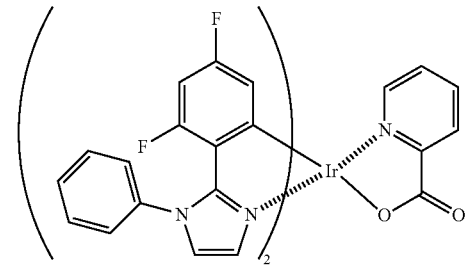
D-25
D-26
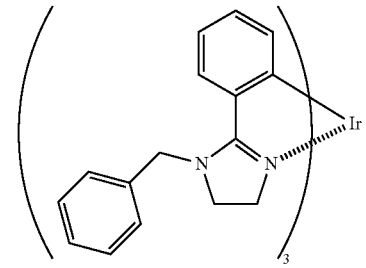
D-27
D-28
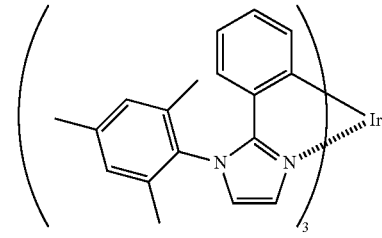
D-29
D-30
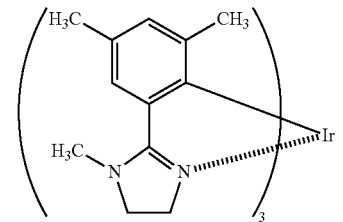

-continued
D-31 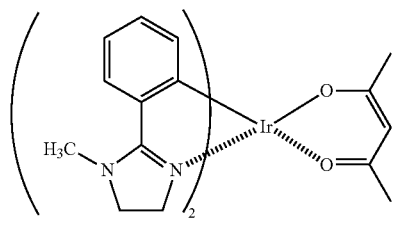
D-32 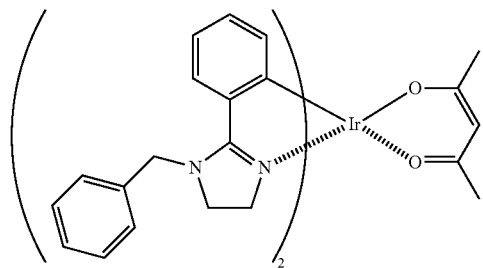
D-33 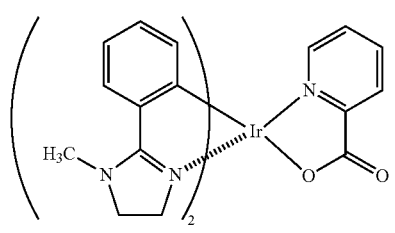
D-34 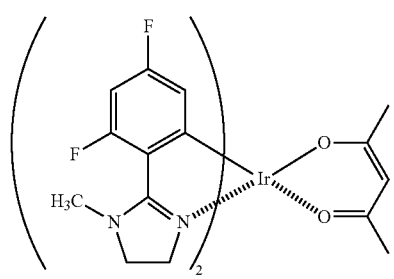
D-35 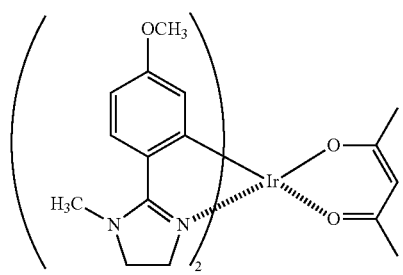
D-36 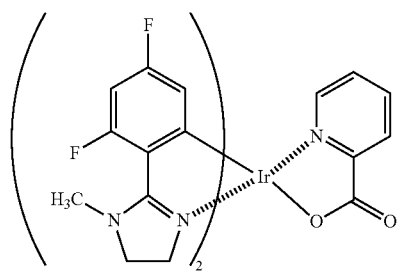
D-37 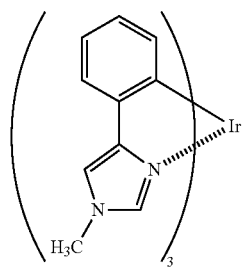
D-38 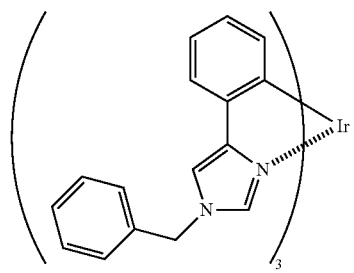
D-39 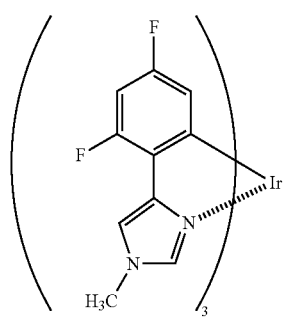
D-40 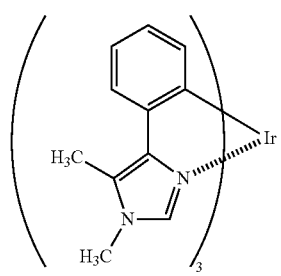

-continued
D-41
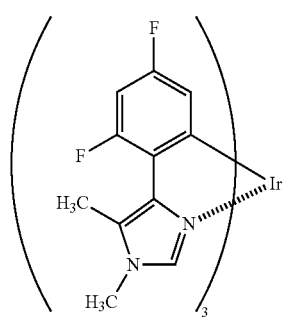
D-42
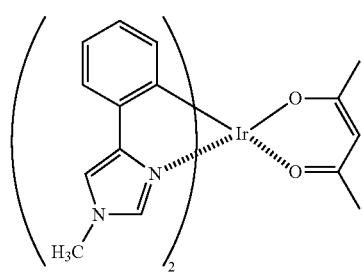
D-43
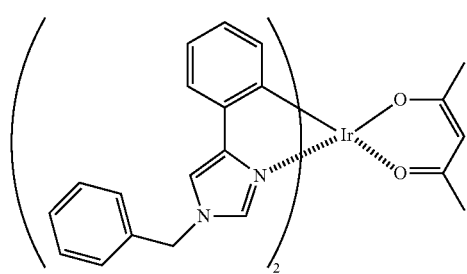
D-44
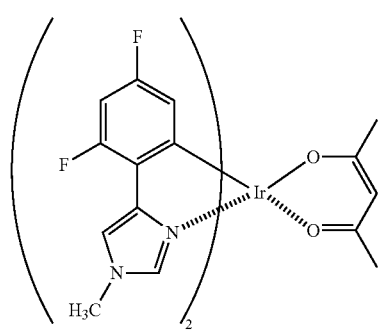
D-45
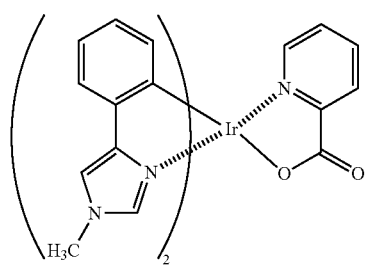
D-46
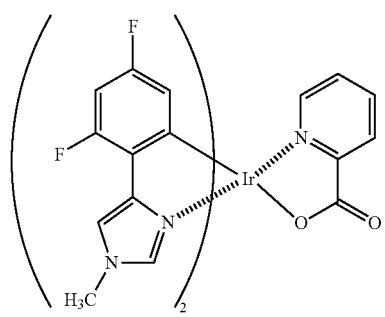
D-47
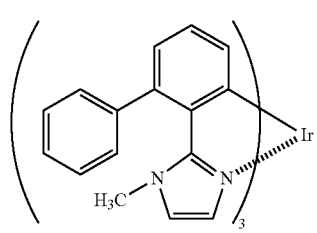
D-48
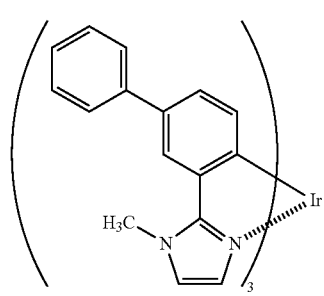
D-49
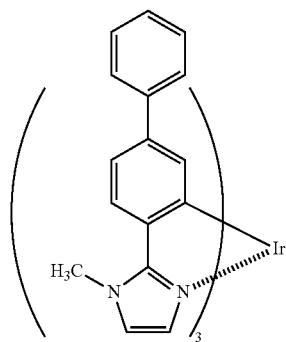
D-50
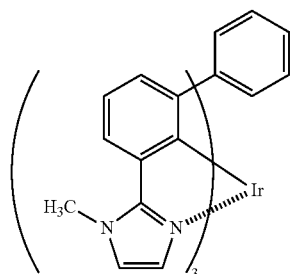

-continued
| D-51 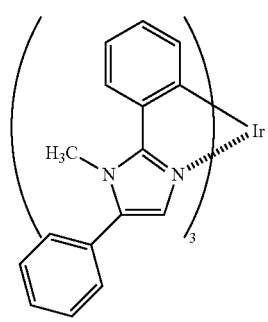 | D-52 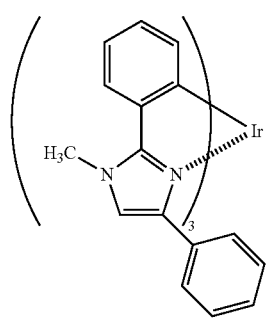 |
|---|---|
| D-53 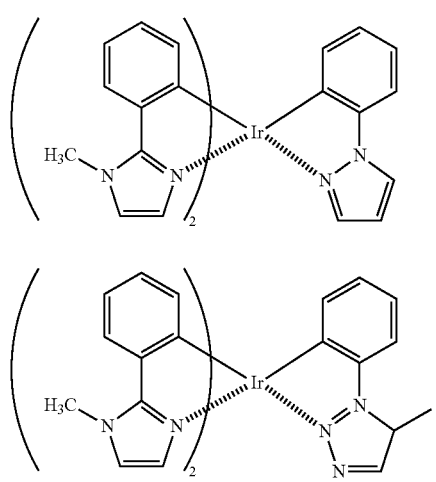 | D-54 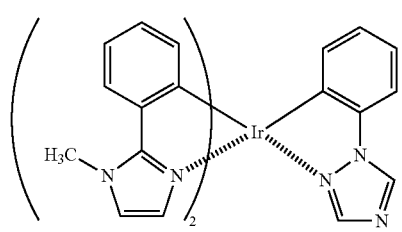 |
| D-55 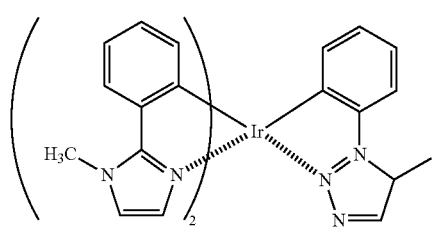 | D-56 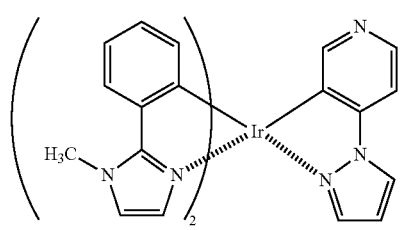 |
| D-57 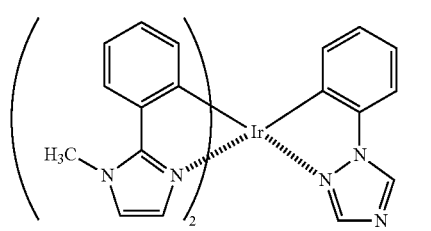 | D-58 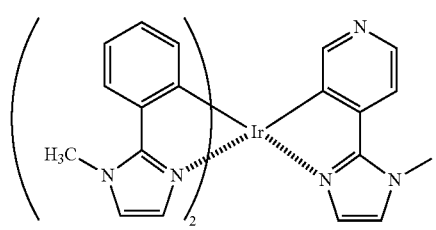 |
| D-59 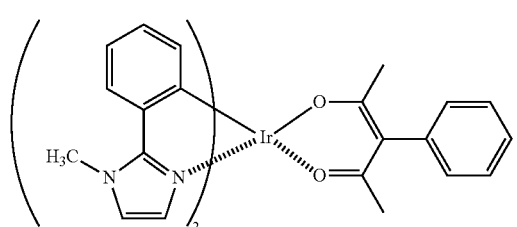 | D-60 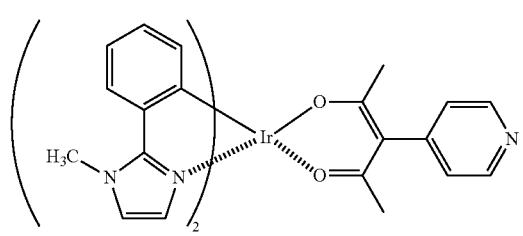 |
| D-61 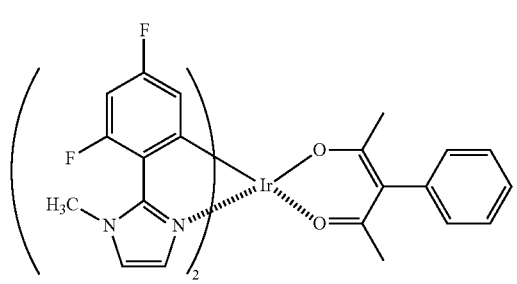 | D-62 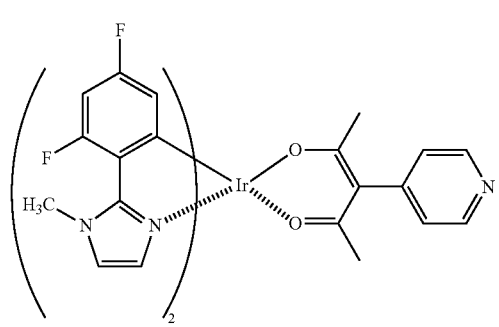 |

-continued
D-63
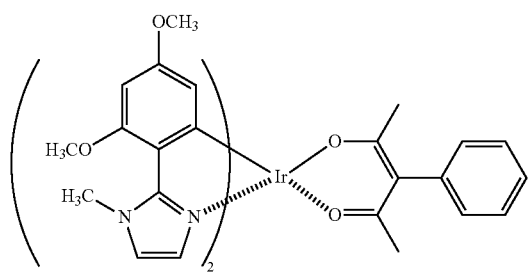
D-64
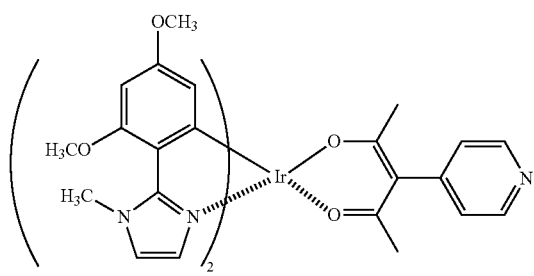
D-65
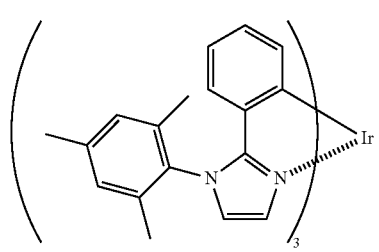
D-66
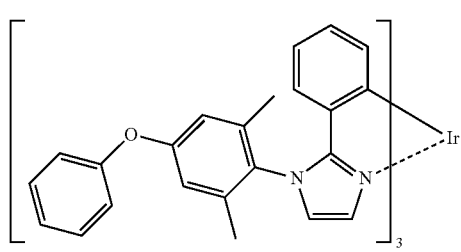
D-67
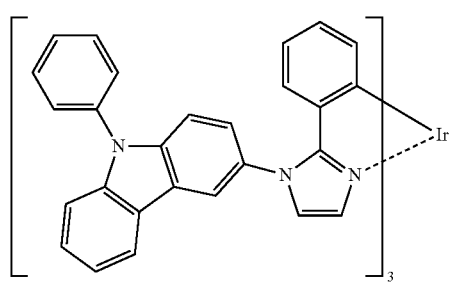
D-68
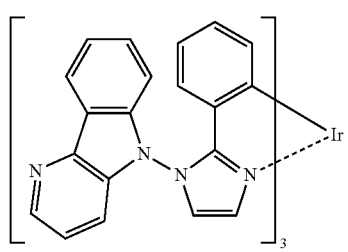
D-69
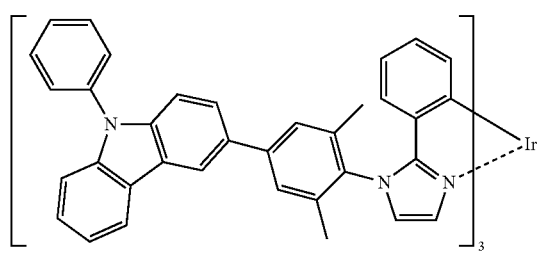
D-70
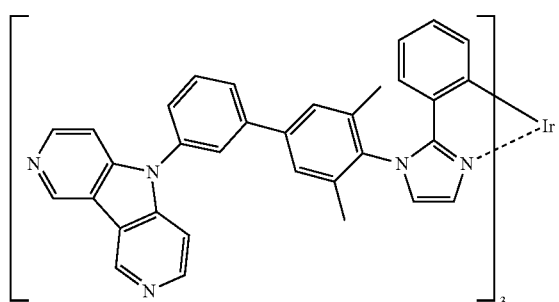
D-71
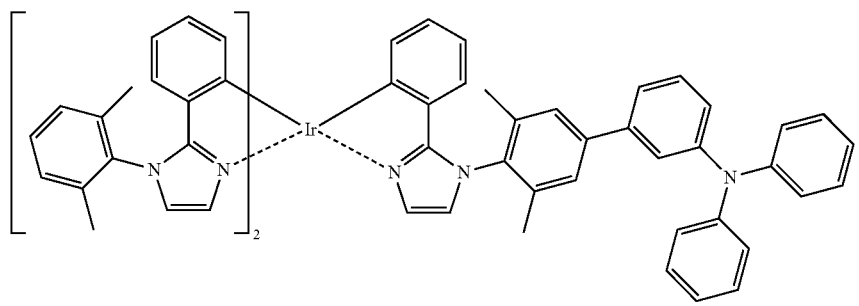

-continued
D-72
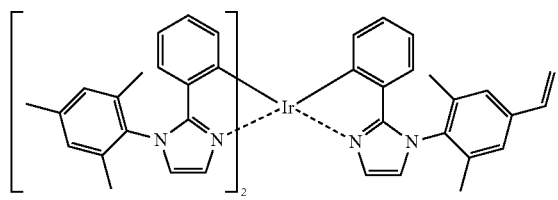
D-73
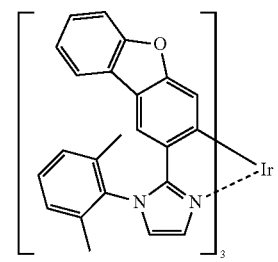
D-74
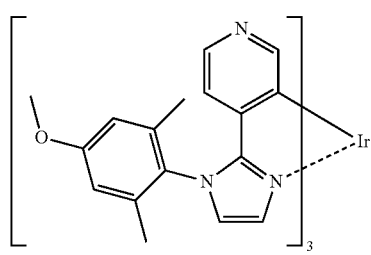
D-75
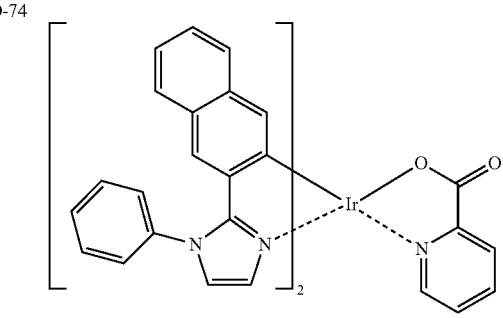
D-76
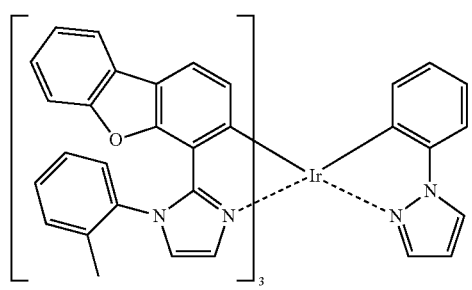
D-77
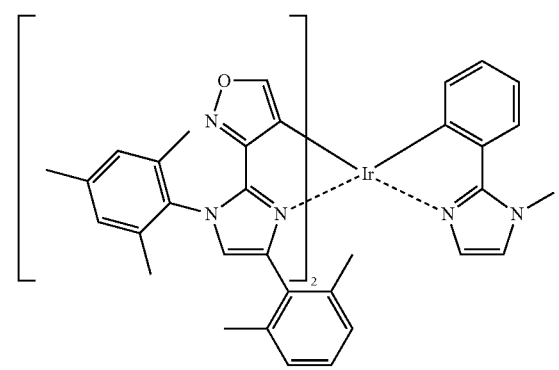
D-78
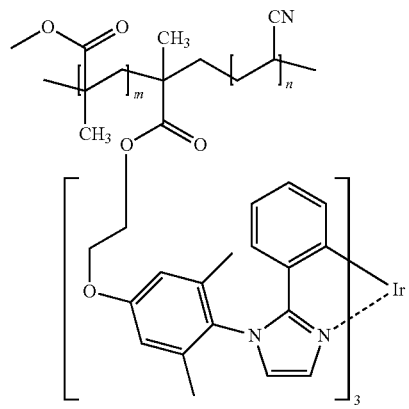
D-79
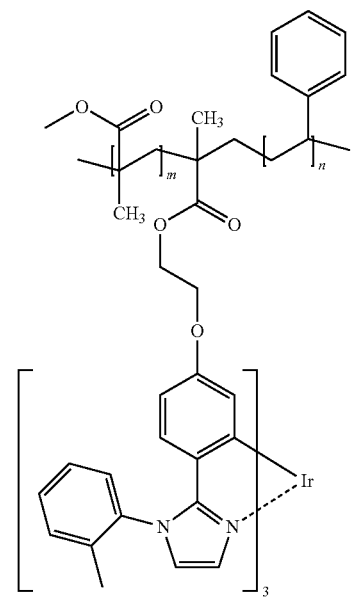

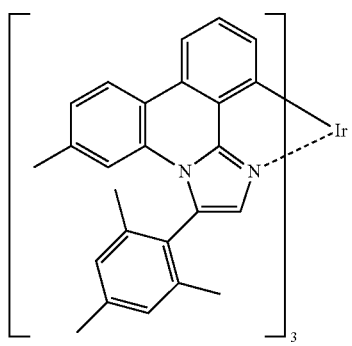

D-80

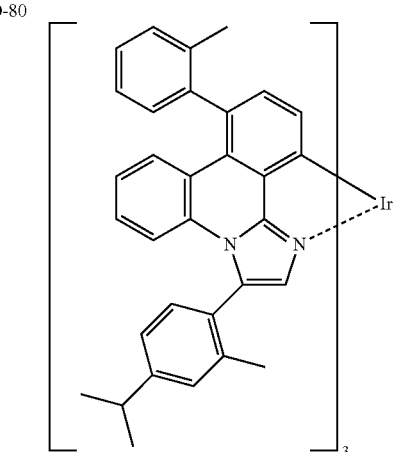

D-81

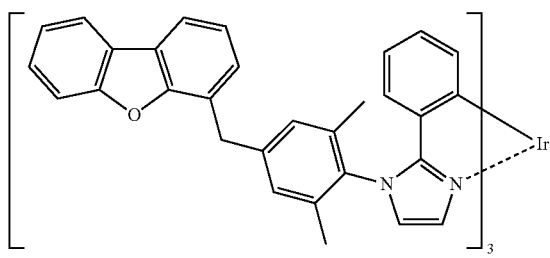

D-82

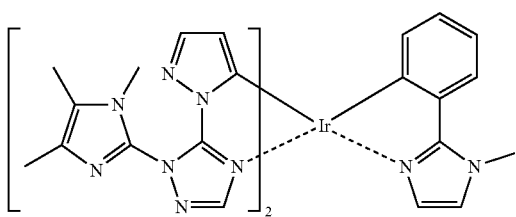

D-83

(3) Fluorescent Dopant

Examples of a fluorescent dopant (it may be called as a fluorescence dopant or a fluorescent compound) are: coumarin based dyes, pyran based dyes, cyanine based dyes, croconium based dyes, squarylium based dyes, oxobenzanthracene based dyes, fluorescein based dyes, rhodamine based dyes, pyrylium based dyes, perylene based dyes, stilbene based dyes, polythiophene based dyes, and rare earth complex based fluorescent materials.

<Injection Layer: Hole Injection Layer and Electron Injection Layer>

An injecting layer is provided when needed. The injecting layer may be provided: between an anode or an intermediate electrode layer and a light emitting layer or a hole transport layer, or between a cathode or an intermediate electrode layer and a light emitting layer or an electron transport layer.

An injection layer is a layer which is arranged between an electrode or an intermediate electrode layer and an organic layer to decrease a driving voltage and to improve an emission luminance, which is detailed in volume 2, chapter 2 (pp. 123-166) of "Organic EL Elements and Industrialization Front thereof (Nov. 30, 1998, published by N. T. S. Corp.)", and it includes a hole injection layer (an anode buffer layer) and an electron injection layer (a cathode buffer layer).

A hole injection layer (an anode buffer layer) is also detailed in publications such as JP-A Nos. 9-45479, 9-260062 and 8-288069. Specific examples thereof include: a phthalocyanine buffer layer containing such as copper phthalocyanine; an oxide buffer layer containing such as vanadium oxide; an amorphous carbon buffer layer; and a polymer buffer layer employing conductive polymer such as polyaniline (or called as emeraldine) or polythiophene. Further, a material described in JP-A No. 2003-519432 is also preferably used.

A mixture of a plurality of materials may be used for a hole injection layer. In one or more embodiments of the present invention, however, it is preferable that the hole injection layer is formed by a single organic compound. One of the reasons is the following. When a plurality of materials are used by mixing, it may induce an increased risk of property variation due to the variation of mixing ratio during the production, such as a density variation in the surface of the formed film substrate.

A thickness of a hole injection layer is not specifically limited. Generally, it is in the range of about 0.1 to 100 nm, and preferably, it is in the range of 1 to 30 nm.

As a suitable material for an electron injection layer located between an electron transport layer and a cathode layer, it can cite alkali metals, alkali earth metals having a work function of 3 eV or less, or compounds of these metals. Examples of an alkali metal compound are: potassium fluoride, lithium fluoride, sodium fluoride, cesium fluoride, lithium oxide, lithium quinoline complex, and cesium carbonate. Lithium fluoride and cesium fluoride are preferable.

In the layer adjacent to the anode side of the intermediate electrode layer, it is preferable to avoid a layer composed of an alkali metal compound or an alkali earth metal compound.

A thickness of an electron injection layer is not specifically limited. Generally, it is in the range of about 0.1 to 10 nm, and preferably, it is in the range of 0.1 to 2 nm.

<Blocking Layer: Hole Blocking Layer and Electron Blocking Layer>

A blocking layer is appropriately provided according to necessity. Examples are a hole blocking (hole block) layer described in JP-A Nos. 11-204258, 11-204359 and p. 237 of "Organic EL Elements and Industrialization Front Thereof (Nov. 30, 1998, published by N. T. S. Corp.)".

A hole blocking layer, in a broad meaning, has a function of an electron transport layer. A hole blocking layer is composed of a hole blocking material having a function of transporting an electron but a very small ability of transporting a hole. It can improve the recombination probability of an electron and a hole by blocking a hole while transporting an electron. Further, a constitution of an electron transport layer described later can be appropriately utilized as a hole blocking layer when needed. A hole blocking layer is preferably placed adjacent to a light emitting layer.

On the other hand, an electron blocking layer, in a broad meaning, has a function of a hole transport layer. An electron blocking layer is composed of a material having a function of transporting a hole but a very small ability of transporting an electron. It can improve the recombination probability of an electron and a hole by blocking an electron while transporting a hole. Further, a constitution of a hole transport layer described later can be appropriately utilized as an electron blocking layer when needed.

A thickness of a hole blocking layer or an electron blocking layer according to one or more embodiments of the present invention is preferably in the range of 3 to 100 nm, and more preferably, it is in the range of 5 to 30 nm.

<Hole Transport Layer>

A hole transport layer contains a hole transport material having a function of transporting a hole, and in a broad meaning, a hole injection layer and an electron blocking layer are also included in a hole transport layer. A hole transport layer may be provided as a single layer or a plurality of layers.

A hole transport material is a material having any one of a property to inject or transport a hole or a barrier property to an electron, and it may be either an organic substance or an inorganic substance. For example, listed materials are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene none derivative, a hydrazone derivative, a stilbene derivative, a silazane derivative, an aniline type copolymer, or conductive polymer oligomer, and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound.

Representative examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-tri-amino)styryl]stilbene; 4-N,N-diphenylamino-(2-diphenylvinyl)benzene; 3-methoxy-4'-N,N-diphenylaminostilbene; and N-phenylcarbazole. In addition, there are cited those having two condensed aromatic rings in the molecule described in U.S. Pat. No. 5,061,569, such as 4,4'-bis[N-(1-naphthyl)-N-phenylamino]biphenyl(NDP), and 4,4',4"-tris[N-(3-methylphenyl)-N-phenylamino]triphenylamine (MDTDATA), in which three of triphenyl amine units are bonded in a star burst form, as described in JP-A No. 4-308688.

Polymer materials, in which these materials are introduced in a polymer chain or in the main chain of polymer, can be also utilized. Further, an inorganic compound such as a p-type Si and a p-type SiC can be utilized as a hole injection material and a hole transport material.

Further, it is possible to employ so-called p-type hole transport materials, as described in JP-A Nos. 4-297076, 2000-196140, 2001-102175, J. Appl. Phys., 95, 5773 (2004), JP-A No. 11-251067, and J. Huang et al., Applied Physics Letters 80(2002), p. 139, and JP-A No. 2003-519432. In one or more embodiments of the present invention, since a highly-efficient light emitting element can be prepared, it is preferable to employ these materials.

A hole transport layer may be one layer structure composed of one or a plurality of the above-described materials.

A thickness of a hole transport layer is not specifically limited. Generally, it is in the range of about 5 nm to 5 μm, and preferably, it is in the range of about 5 to 200 nm.

<Electron Transport Layer>

An electron transport layer is composed of a material having a function of transporting an electron. One or a plurality of electron transport layers may be provided.

As an electron transport material used in an electron transport layer, any one of the conventional compounds may be selected and can be employed with the condition that it has a function of transporting an injected electron via a cathode or an intermediate electrode layer to a light emitting layer. Examples thereof include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. In addition, a thiadiazole derivative which has a structure of replacing an oxygen atom in the oxadiazole ring with a sulfur atom, and a quinoxaline derivative which has a quinoxaline ring known as an electron inductive group are also used for a material in an electron transport layer. Polymer materials, in which these materials are introduced in a polymer chain or in the main chain of polymer, can be also utilized. In one or more embodiments of the present invention, when an electron transport layer is placed adjacent to an intermediate electrode layer, it is preferable to use a compound having a pyridine ring in the molecular structure.

Further, the following can be used as a material for an electron transport layer: a metal complex of a 8-quinolinol derivative such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol) zinc (Znq); and metal complexes in which a central metal of the aforesaid metal complexes is substituted by In, Mg, Cu, Ca, Sn, Ga or Pb. Further, metal-free or metal phthalocyanine, or a compound whose terminal is substituted by an alkyl group or a sulfonic acid group, can be preferably utilized as a material for an electron transport layer. In addition, a distyryl pyrazine derivative used as a material for a light emitting layer is also used as a material for an electron transport layer. In the same manner as for a hole injection layer and a hole transport layer, an inorganic semiconductor such as an n-type Si and an n-type SiC can be also utilized as a material for an electron transport layer.

A plurality of materials may be used in an electron transport layer. It may carry out doping with an alkali metal, an alkali earth metal, an alkali metal compound or an alkali earth metal compound. However, it is preferable that an electron transport layer is formed with a single organic compound. One of the reasons is the following. When a plurality of materials are used by mixing, it may induce an increased risk of property variation due to the variation of mixing ratio during the production, such as a density variation in the surface of the formed film substrate.

In one or more embodiments of the present invention, by using an intermediate electrode layer having a low work function, it can obtain an appropriate property without deteriorating injection of electrons from the intermediate electrode layer without conducting doping with an alkali metal.

A glass transition temperature of an organic compound contained in an electron transport layer is preferably 110° C. or more from the viewpoint of obtaining excellent storage stability at high temperature and process stability at high temperature.

The layer thickness of the electron transport layer is not specifically limited, however, it is generally in the range of about 5 nm to 5 µm, and preferably it is in the range of 5 to 200 nm.

<Support Substrate>

A support substrate used for an organic EL element according to one or more embodiments of the present invention is not specifically limited with respect to types of glass and plastics. The support substrate may be also called as substrate body, substrate, substrate substance, or support. They me be transparent or opaque. However, a transparent support substrate is preferable when the emitted light is taken from the side of the support substrate. Support substrates preferably utilized includes such as glass, quartz and transparent resin film. A specifically preferable support substrate is a resin film capable of providing an organic EL element with a flexible property.

Resin films includes: polyesters such as polyethylene terephthalate (PET) and polyethylene naphthalate (PEN); polyethylene, polypropylene; cellulose esters or their derivatives such as cellophane, cellulose diacetate, cellulose triacetate (TAC), cellulose acetate butylate, cellulose acetate, propionate (CAP), cellulose acetate phthalate, and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyallylate; and cycloolefin resins such as ARTON (produced by JSR Co. Ltd.) and APEL (produce by Mitsui Chemicals, Inc.).

On a surface of a resin film, it may be formed a film incorporating an inorganic or an organic compound or a hybrid film incorporating both compounds. The film is preferably a barrier film having a water vapor permeability of 0.01 g/(m$^2$·24 h) or less determined by the method based on JIS K 7129-1992. More preferably, the film is a high barrier film having an oxygen permeability of 1×10$^{-3}$ ml/(m$^2$·24 h·atm) or less determined by the method based on JIS K 7126-1992, and a water vapor permeability of 1×10$^{-3}$ g/(m$^2$·24 h) or less. Still more preferably, it has an oxygen permeability of 1×10$^{-5}$ ml/(m$^2$·24 h·atm) or less, and a water vapor permeability of 1×10$^{-5}$ g/(m$^2$·24 h) or less.

As barrier film forming materials, the employed materials may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of an inorganic layer and a layer made of an organic material. The laminating order of the inorganic layer and the layer made of an organic material is not particularly limited, but it is preferable that both are alternatively laminated a plurality of times.

Barrier film forming methods are not particularly limited, and examples of employable methods include: a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, as described in JP-A No. 2004-68143.

Examples of opaque support substrates include metal plates such aluminum or stainless steel films, opaque resin substrates, and ceramic substrates.

<Sealing>

Sealing an organic EL element according to one or more embodiments of the present invention, may be accomplished by, for example, a method in which a sealing member, electrodes, and a supporting substrate are subjected to adhesion with an adhesive. The sealing member may be arranged to cover a display region of an organic EL element, and it may be an engraved plate or a flat plate. Neither transparency nor electrical insulation is limited.

Specifically listed are glass plates, polymer plates, metal plates, and films. Specifically, it is possible to list, as glass plates, soda-lime glass, barium-strontium containing glass, lead glass, aluminosilicate glass, borosilicate glass, barium borosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In one or more embodiments of the present invention, since it is possible to make the element to a thin film, a polymer film or a metal film is preferably employed. Further, preferably, the polymer film has an oxygen permeability of 1×10$^{-3}$ ml/(m$^2$·24 h·atm) or less determined, and a water vapor permeability of 1×10$^{-3}$ g/(m$^2$·24 h) or less. More preferably, it has an oxygen permeability of 1×10$^{-5}$ ml/(m$^2$·24 h·atm) or less, and a water vapor permeability of 1×10$^{-5}$ g/(m$^2$·24 h) or less.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type UV radiation curable type epoxy resin adhesives.

In addition, since an organic EL element is occasionally deteriorated via a thermal process, preferred are those which enable adhesion and curing between room temperature (25° C.) and 80° C. Further, desiccating agents may be dispersed into the aforesaid adhesives. Adhesives may be applied onto sealing portions via a commercial dispenser or printed on the sealing portions in the same manner as screen printing.

When a space is formed between the sealing member and the display region of the organic EL element, it is preferable to inject an inert gas such as nitrogen or argon, or an inert liquid such as a fluorinated hydrocarbon or a silicone oil in the space. It may be made to a vacuum state. Further, a hygroscopic compound may be enclosed in the space.

Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). Among sulfates, metal halides, and perchlorates, suitably employed are anhydrides.

<Protective Film and Protective Plate>

In order to enhance the mechanical strength of the organic EL element, a protective film or a protective plate may be arranged on the outside of the sealing film. Specifically, when sealing is achieved via the sealing film, the resulting mechanical strength is not always high enough, whereby it is preferable to arrange the protective film or the protective plate described above. Usable materials for these include glass plates, polymer plate-films, and metal plate-films which are similar to those employed for the sealing. However, in terms of light weight and decrease in thickness, it is preferable to employ a polymer film.

<Anode>

As electrode substances for an anode, preferable are a metal having a large work function (4 eV or more), an alloy, a conductive compound, and a mixture thereof. Specific examples of such an electrode substance include: a metal such as Au, Ag, and Al; and a conductive transparent material such as CuI, indium tin oxide (ITO), $SnO_2$ and ZnO. Further, a material such as IDIXO ($In_2O_3$—ZnO), which can prepare an amorphous and transparent conductive film, may be also utilized.

As for an anode, these electrode substances may be made into a thin layer by a method such as evaporation or sputtering, and a pattern of a desired form may be formed by photolithography. When a requirement of pattern precision is not so severe (about precision of 100 μm or more), a pattern may be formed through a mask of a desired form at the time of vapor deposition, or sputtering of the above-described substance. Alternatively, when coatable materials such as organic conductive compounds are employed, it is possible to employ a wet system film forming method such as a printing system or a coating system.

When emitted light is taken out of this anode side, the transmittance is preferably set to be 10% or more. The sheet resistance as an anode is preferably a several hundred Ω/square or less. Further, although the layer thickness depends on a material, it is generally selected from the range of 5 to 1,000 nm, and preferably from the range of 5 to 200 nm.

<Cathode>

On the other hand, as a cathode, there are used a metal, an alloy, a conductive compound, and a mixture thereof. Specific examples of such an electrode substance include: sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, a rare earth metal, silver, and aluminum. Among them, with respect to durability against electron injection and as oxidation, preferable are: a mixture of an electron injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide ($Al_2O_3$) mixture, a lithium/aluminum mixture, aluminum and silver.

As for a cathode, these electrode substances may be made into a thin layer by a method such as vapor deposition or sputtering.

Further, the sheet resistance as a cathode is preferably a several hundred Ω/square or less. The layer thickness is generally selected from the range of 5 nm to 5 μm, and preferably, from the range of 5 to 200 nm.

Herein, to transmit produced emission, either one of an anode or a cathode of an organic EL element is preferably transparent or translucent to improve the emission luminance.

Further, after forming, on the cathode, the above material in a film having a thickness of 1 to 20 nm, it is possible to prepare a transparent or translucent cathode in such a manner that electrically conductive transparent materials described for the anode are prepared thereon. By applying the above, it is possible to produce an element in which both anode and cathode are transparent.

<<Application of Organic EL Element>>

An organic EL element according to one or more embodiments of the present invention is suitably applied to a various kinds of devices. In the following, an organic EL module is described as an example.

<<Constitution of Organic EL Module>>

In one or more embodiments of the present invention, the organic EL module is designated as a mounted body having a structure in which a conductive material (member) is bonded to an anode and a cathode of at least one organic EL element, and further, it is connected to an interconnection substrate. The organic EL module has an independent function of itself.

Figure 15:
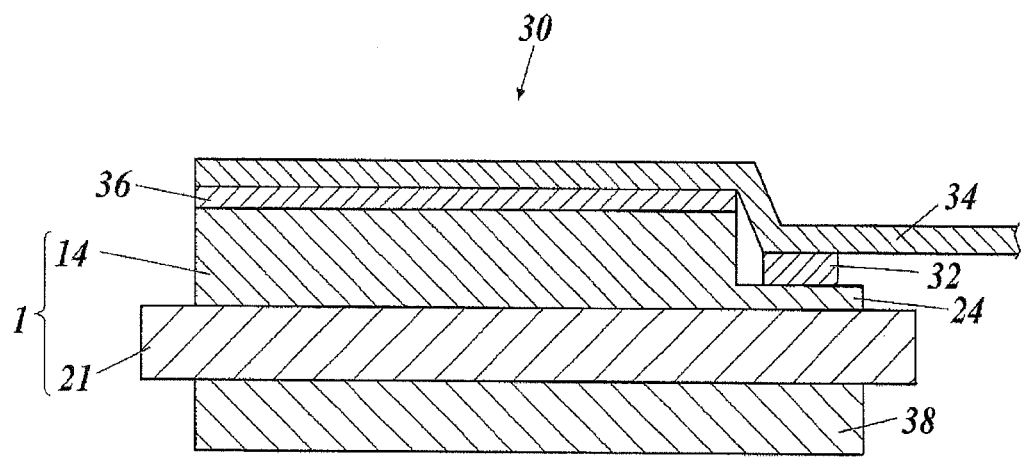
FIG. 15 is a schematic drawing illustrating an example of an organic EL module.

An example of an organic EL module according to one or more embodiments of the present invention is illustrated in FIG. 15.

As illustrated in FIG. 15, an organic EL module 30 is mainly composed of an organic EL element 1 (a laminated body 14), an anisotropic conductive film (ACF) 32, and a flexible printed circuit 34.

The organic EL element 1 is provided with a laminated body 14 which contains a support substrate 2, electrodes, and a various kinds of organic functional layers. The anode 4 (refer to FIG. 1) is pulled out on an edge portion of the support substrate 2 on which the laminated body 14 is not formed. This taking-out electrode 4a and the flexible printed circuit 34 are electrically connected through the anisotropic conductive film 32.

The flexible printed circuit 34 is bonded onto the organic EL element 1 (the laminated body 14) through an adhesive 36. The flexible printed circuit 34 is bonded to a driver IC and a print substrate not illustrated here.

Although not illustrated in FIG. 15, a taking-out electrode is also formed from the cathode 12 (refer to FIG. 1). This taking-out electrode and the flexible printed circuit 34 are electrically connected.

Further, in one or more embodiments of the present invention, a polarizing member 38 may be disposed on the light emitting surface side of the support substrate 2. A half mirror or a black filter may be used in place of the polarizing member 38. By this, the organic EL module 30 according to one or more embodiments of the present invention can display black which cannot be done with light guide dots of LED.

<Anisotropic Conductive Film>

An anisotropic conductive film according to one or more embodiments of the present invention is made of conductive particles such as metal cores of gold, nickel, and silver, or resin cores plated with gold dispersed in a binder.

A thermoplastic resin or a thermo-setting resin is used as a binder. Among them, a thermo-setting resin is preferable, and an epoxy resin is more preferable.

An anisotropic conductive film having nickel fibers as a filler can be suitably used.

In one or more embodiments of the present invention, a fluid material such as a conductive paste, for example, a silver paste, may be used in place of the anisotropic conductive film.

<Polarizing Member>

As a polarizing member according to one or more embodiments of the present invention, a commercially available polarizing plate or a circularly polarizing plate are cited.

A polarizing film, which is a principal constitution member of a polarizing plate, is an element passing only light having a polarization plane with a predetermined direction. A representative element is a polyvinyl alcohol polarizing film. There are mainly two: one is a polyvinyl alcohol film dyed with iodine, and another is a polyvinyl alcohol film dyed with a dichroic dye. A polarizing film is produced by film formation of a polyvinyl alcohol aqueous solution, then, the produced film is stretched to one direction, followed by dying. Otherwise, it is produced by dying the film at first, then carrying out one directional stretching. Preferably, the film is further subjected to a durability treatment with a boron compound is used. A thickness of a polarizing film is in the range of 5 to 30 μm, preferably in the range of 8 to 15 μm. In one or more embodiments of the present invention, these films are suitably used.

Further, a commercially available polarizing plate protective film is preferably used. Specific examples thereof are: KC8UX2MW, KC4UX, KC5UX, KC4UY, KC8UY, KC12UR, KC4UEW, KC8UCR-3, KC8UCR-4, KC8UCR-5, KC4FR-1, KC4FR-2, KC8UE, and KC4UE (made by Konica Minolta, Inc.).

An adhesive used for bonding a polarizing member and a support substrate is preferably a substance of optically transparent and also exhibiting appropriate elasticity and adhesiveness.

Specific examples are: an acrylic copolymer, an epoxy resin, polyurethane, a silicone polymer, polyether, a butyral resin, a polyamide resin, a polyvinyl alcohol resin and a synthetic rubber. Among them, an acrylic copolymer is preferably used since its adhesion property can be controlled most easily and it is excellent in transparency, weather-resistant, and durability.

These adhesives are applied on a substrate and they can be formed in a film by curing with a method such as: a drying method, a chemical curing method, thermo-setting method, a thermo-melting method, and a photo-curing method.

<<Production Method of Organic EL Module Having a Light Emitting Pattern>>

An organic EL module can be produced by connecting the taking-out electrode from the anode which is an electric current supplying portion with the taking-out electrode (not illustrated in the drawing) from the cathode which is an electric current receiving portion.

In particular, when an anisotropic conductive film is used as a connecting way, the anisotropic conductive film and the taking-out electrode are electrically connected by a temporary bonding step of the anisotropic conductive film with a temporary pasting temperature, and by a pressure bonding step in which conductive particles having a function of electric connection contained in the anisotropic conductive film are pressed.

When the support substrate is a film substrate, it is selected an anisotropic conductive film having a pressure bonding temperature of in the range of 100 to 150° C. in order to reduce thermal damage to the film substrate (for example, MF series made of Hitachi Chemical, Co. Ltd.).

More specifically, first, a temporary bonding step of the anisotropic conductive film is conducted. In this step, an ACF pasting apparatus (LD-30, made by Ohashi Engineering, Co.) is used, for example. A heat tool temperature for the temporary pasting is set to be about 80° C. After conducting position adjustment of the organic EL element with the anisotropic conductive film, the pasting is done with a predetermined pressure (0.1 to 0.3 MPa) for about 5 seconds.

Subsequently, a full bonding step (a pressure bonding step) is conducted. In this step, a full pressure bonding apparatus (BD-02, made by Ohashi Engineering, Co.) is used, for example. A heat tool temperature for the full pressure bonding is set to be about 130 to 150° C. Then, a contact pad of a flexible printed circuit connecting to an organic EL element is set by positional adjusting to the taking-out electrode of the organic EL element. After termination of position adjustment, pressure bonding is carried out on the flexible printed circuit with a predetermined pressure (1 to 3 MPa) for about 10 seconds. Thus, the full pressure bonding step is completed. After bonding, a silicone resin may be potted on the bonded portion to fortify the bonded portion of the anisotropic conductive film.

Further, according to the application, it may be provided with a polarizing member, a half mirror member, or a black filter on a light emitting surface side of the support substrate.

The second embodiment is common with the first embodiment in the point that: at least one organic function layer in each light emitting unit is patterned with a mask in the forming step of the organic function layer, and after formation of the organic function layer, the organic function layer is further patterned by light irradiation so as to pattern into a region where a light emitting function is modulated, and a region where a light emitting function is not modulated (it is called as patterning). However, the second embodiment is different from the first embodiment in the following point.

<<Production Method of Organic EL Element>>

A production method of an organic EL element having a light emitting pattern according to one or more embodiments of the present invention is characterized in that an organic EL element provided with one or a plurality of organic functional layers between a pair of electrodes can change two or more kinds of light emitting patterns depending on the situations.

Here, "a pattern" indicates a design (a pattern or a design of drawing), a character, or an image displayed by an organic EL element.

Figure 16:
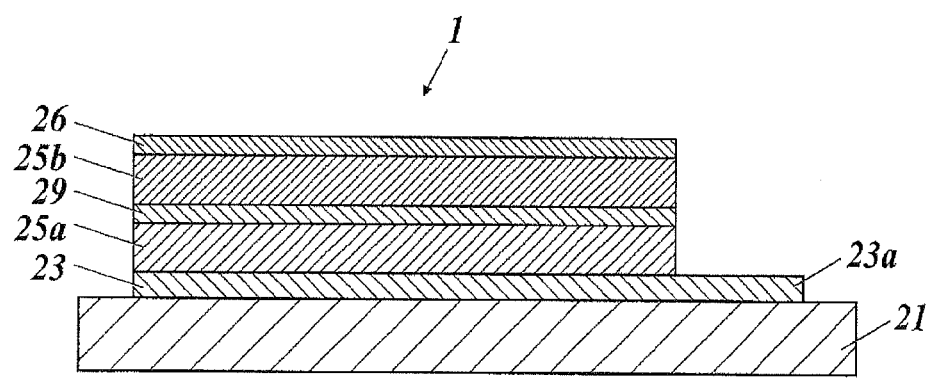
FIG. 16 is a schematic cross sectional view illustrating an example of an organic EL element.

In the following, a production method of an organic EL element 1 illustrated in FIG. 16 will be described as an example.

(1) Laminating Step

In a production method of an organic EL element 1 according to one or more embodiments of the present invention, it is carried out a step of laminating (laminating step) layers on a support substrate 21 to form: an anode 23, a first light emitting unit 25a, an intermediate electrode layer 29, a second light emitting unit 25b, and a cathode 26.

First, a support substrate 21 is prepared. On the support substrate 21, there is formed a thin film of a required electrode substance, for example, a thin film made of a anode substance with a thickness of 1 μm or less, preferably, in the range of 10 to 200 nm via a method such as a vapor deposition method or a sputtering method to result in forming an anode 23. At the same time, a taking-out electrode 4a is formed at the edge portion of the anode 23 to connect with an outer electric source by using an appropriate method such as a vapor deposition method.

Next, on this, there are sequentially laminated a hole injection layer, a hole transport layer, a light emitting layer and an electron transport layer, which form a first light emitting unit 25a. Here, during the time of forming the first light emitting unit 25a, a shadow mask pattern of film forming is suitably selected so that a different pattern is formed from the pattern of the second light emitting unit 25b described later. The shadow mask pattern may be used for all of the layers of a hole injection layer, a hole transport layer, a light emitting layer, an electron transport layer and an electron injection layer. However, from the viewpoint of film forming accuracy, it is preferably used for a hole injection layer and a hole transport layer. More preferably, the shadow mask is used only for a hole injection layer.

The formation of each of these layers may be done with a spin coating method, a cast coating method, an ink-jet method, a vapor deposition method, and a printing method. From the viewpoint of obtaining a uniform layer and hardly producing a pinhole, particularly preferable methods are a vacuum vapor deposition method and a spin coating method. Further, a different layer forming method may be used layer by layer. When a vapor deposition method is adopted for forming each of these layers, the conditions of vapor deposition are different depending on the kinds of compounds used. Generally, it is preferable to suitably select the following conditions, heating temperature of a boat: 50 to 450° C.; vacuum level: $1 \times 10^{-6}$ to $1 \times 10^{-2}$ Pa; vapor deposition rate: 0.01 to 50 nm/sec; temperature of a substrate: −50 to 300° C.; and layer thickness: 0.1 to 5 μm.

After forming these layers, there is formed thereon a thin film made of an intermediate electrode layer material with a thickness in the range of 0.6 to 5 nm, more preferably in the range of 0.8 to 3 nm, still more preferably in the range of 0.8 to 2 nm via a vapor deposition method to result in providing an intermediate electrode layer 29.

Subsequently, in the same manner as formation of the first light emitting unit 25a, each layer of the second light emitting unit 25b is formed. At this moment, as described above, a different shadow mask pattern from that of the first light emitting unit 25a is used during the film formation.

After forming the second light emitting unit 25b as described above, a cathode 26 is formed thereon via a suitable method such as a vapor deposition method or a sputtering method. In this case, the cathode 26 is formed in a pattern having a shape of pulling out an edge portion from the upper portion of the second light emitting unit 25b to the periphery of the support substrate 21, while maintaining an insulating state with respect to the intermediate electrode layer 29 and the anode 23 by the light emitting units 25a and 25b.

(2) Sealing Step

After the laminating step, a step of sealing the organic EL element 1 (sealing step) is carried out.

That is, the sealing material is placed on the support substrate 21 to cover at least the light emitting units 25a and 25b, while keeping the edge portions of the anode 23 (taking-out electrode 4a) and the edge portion of the cathode 26 in the exposed condition.

(3) Light Irradiation Step

An organic EL element 1 having a light emitting pattern can be produced by modulating a light emitting function of the light emitting units 25a and 25b by light irradiation.

Here, "to modulate a light emitting function by light irradiation" indicates the process by which the function of the hole transport layer composing the light emitting unit is changed by light irradiation so that the light emitting function of the light emitting unit is modified.

In the light irradiation step, the method of the light irradiation may be any method and it is not specifically limited as long as it can make a light emitting portion which is changed the luminance at a predetermined pattern region of the light emitting units 25a and 25b by a predetermined light irradiation.

Light irradiated in the light irradiation step may contain UV rays, visible rays or infrared rays. Preferably, it contains UV rays.

In one or more embodiments of the present invention, a UV ray is an electromagnetic wave having a longer wavelength than an X ray and a shorter wavelength than a shortest wavelength of a visible light. Specifically, it is an electromagnetic having a wavelength of 1 to 400 nm.

Options for generating and irradiating UV rays is not specifically limited as long as they generate UV rays and irradiate with a conventionally known apparatus. Examples of a specific light source are: a high pressure mercury lamp, a low pressure mercury lamp, a hydrogen (deuterium) lamp, a rare gas (e.g., xenon, argon, helium, neon) discharge lamp, a nitrogen laser, an excimer laser (e.g., XeCl, XeF, KrF, KrCl), a hydrogen laser, a halogen laser, and a harmonic wave light of various visible (LD) to infrared laser (e.g., THG (Third Harmonic Generation) of YAG laser).

This light irradiation step is preferably done after the sealing step.

In the light irradiation step, it is possible to change the light-emitting luminance of the irradiated portion according to the amount of light irradiation by changing an amount of light irradiation by adjusting the strength of the light or the irradiation time. The light emitting luminance will be more decreased when the amount of light irradiation is larger. The light emitting luminance will be less decreased when the amount of light irradiation is smaller. Consequently, the light emitting luminance is maximum when the amount of light irradiation is 0, that is, when it is not irradiated.

By the steps described above, an organic EL element 1 having a required light emitting pattern can be produced. In the production of this organic EL element, it is preferable that the production from the first light emitting unit 25a to the cathode 26 is done with one time vacuuming operation. However, it may employ a different production method by taking out the support substrate 21 from the vacuum atmosphere on the way. In that case, it is required to conduct the operations under a dry inert gas atmosphere.

When a direct-current voltage is applied to the produced organic EL element 1, light emission can be observed by applying voltage of 2 o 40 V to the electrodes arranged at the both side of the light emitting units 25a or 25b (for example, the anode 23 is made to have plus (+) polarity, and the intermediate electrode layer 29 is made to have minus (−) polarity). Further, an alternating-current voltage may be applied. In addition, an arbitrary wave shape may be used for applying alternating-current.

In this case, an electric current flows only to the light emitting pattern portion. Therefore, electric power consumption can be decreased compared with LED which guides light to an unrequired portion.

Further, higher shape accuracy can be achieved by carrying out patterning with light irradiation in addition to patterning with a mask.

<Light Emitting Pattern of Organic EL Element>

When the light emitting luminance is changed to decrease by light irradiating an organic EL element having a light emitting pattern, if light irradiation is done at one time to the organic EL element having been finished the sealing step, each light emitting unit cannot display a different design or mark.

In order to avoid this, when it is intended to change the design or mark between the light emitting units, it is preferable that the organic layers (in particular, a hole transport layer or a hole injection layer) are subjected to mask patterning with a film forming mask, and then, the light emitting luminance change process by light irradiation is performed at the final trimming arrangement.

In the following, an organic EL element 1 illustrated in FIG. 16 will be described in more detail by referring to the drawings.

Figure 17A:
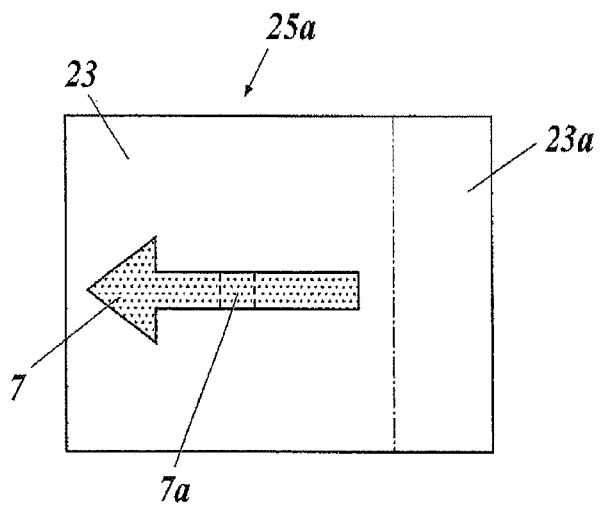
FIG. 17A is a plan view illustrating a pattern shape in a hole injection layer of a light emitting unit according to one or more embodiments.

First, at the moment of film formation of a hole injection layer 7 of the first light emitting unit 25a, a vapor deposition step is performed using a metal mask having an aperture form corresponding to FIG. 17A. The hole injection layer 7 illustrated by FIG. 17A is formed.

Subsequently, at the moment of film formation of a hole injection layer 11 of the second light emitting unit 25b, a vapor deposition step is performed similarly using a metal mask having an aperture form corresponding to FIG. 17B. The hole injection layer 11 illustrated by FIG. 17B is formed.

Figure 17B:
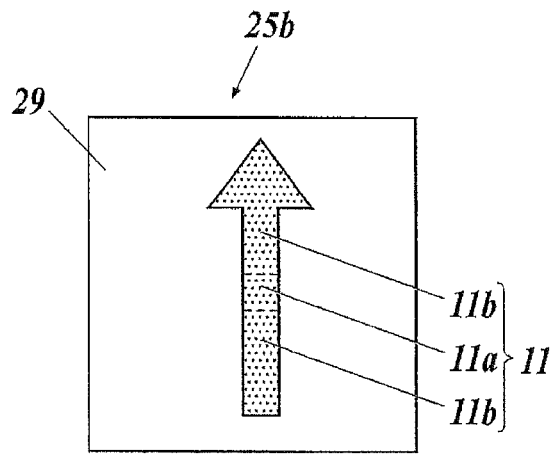

By the above-described method, it becomes possible to confirm light emission of arrow shapes corresponding to FIGS. 17A and 17B in each light emitting unit 25a or 25b.

However, the shape accuracy of the arrow shape contains blurring due to film forming widening at the vapor evaporation step. As a result, the surrounding of the arrow shape will have a certain amount of luminance, and it becomes a vague shape.

Further, when the second light emitting unit 250b is lighted by electric driving and when a planar view is observed, the emission corresponding to the overlapped portion of the hole injection layer 11 and the hole injection layer 7, namely, the amount of the emission (amount of transmitted light) taken out to the outside of the support substrate 7 among the emission from the light emitting layer corresponding to the overlapped portion 11a, is absorbed in the overlapped portion 7a of the hole injection layer 7. By this, the amount of the emission becomes smaller compared with the non-overlapped portion 11b of the hole injection layer 11 in which the hole injection layer 7 is not overlapped. As a result, the emission luminance of the overlapped portion 11a and the non-overlapped portion 11b will be different and it will produce emission unevenness.

Figure 18:
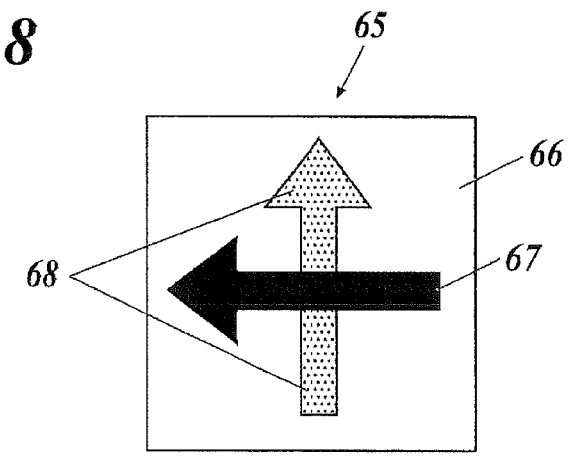
FIG. 18 is a schematic drawing illustrating a schematic constitution of a mask used for light irradiation according to one or more embodiments.

In order to solve this feature, the light irradiation step is carried out after performing the film formation step and the sealing step. Specifically, in order to obtain a light emitting image illustrated in FIG. 18, there is prepared a mask plate 65 which is made to control the amount of the transmitted light. The mask plate 65 is composed of a transparent portion 66 enabling to fully transmit light, a non-transparent portion 67 which does not transmit light, and a semi-transparent portion 68 which enables to limit the amount of the transmitted light.

In the light irradiating step, the light emitting positions of FIGS. 17A and 17B and the above-described mask plate 65 are positionally adjusted and the mask plate is fixed. Here, the semi-transparent portion 68 is placed on the above position of the non-overlapped portion 11b of the hole injection layer 11. After completion of the positional adjustment, the light irradiating step is performed.

By this method, it is possible to increase shape accuracy by changing the luminance of the periphery (edge portion) of the arrow shape.

Moreover, by conducting light irradiation with a controlled amount of light to the non-overlapped portion 11b of the hole injection layer 11, the amount of the transmitted light from the overlapped portion 11a and the overlapped portion 11b to the support substrate 21 will be made equal, and it can obtain a light emitting pattern without light emitting unevenness.

By this method, it is possible to form a design or a mark with high form accuracy even when the light emitting units are plural and the light emitting shape is changed in each light emitting unit.

The organic EL element 1 produced as described above displays a light emitting pattern having the shape illustrated in FIG. 17A when only the first light emitting unit 25a is driven, and it displays a light emitting pattern having the shape illustrated in FIG. 17B when only the light emitting unit 25b is driven.

An electric drive of the light emitting units 25a and 25b is controlled by a driver IC (Integrated circuit) based on information of a position sensor.

The emission color of the light emitting units 25a and 25b may be any color. The color may be the same or different.

<Intermediate Electrode Layer>

An intermediate electrode layer of one or more embodiments of the present invention may be arranged between two light emitting units, and it may have a light transmitting property.

An intermediate electrode layer may have a state in which a film made of metal substance is not formed in a part of the fine region and to form a pinhole or a mesh structure in the plane direction of the layer. Otherwise, an intermediate electrode layer forming portion may form an island shape (macule).

In the intermediate electrode layer according to one or more embodiments of the present invention, a metal having a work function of 3.0 eV or less is employed.

Examples of a substance used in the intermediate electrode layer are: calcium (work function: 2.87 eV; melting point: 1112.2 K), lithium (do.: 2.9 eV; do.: 453.7 K), sodium (do.: 2.75 eV; do.: 371 K), potassium (do.: 2.3 eV; do.: 336.9 K), cesium (do.: 2.14 eV; do.: 301.6 K), rubidium (do.: 2.16 eV; do.: 312.1 K), barium (do.: 2.7 eV; do.: 998.2 K), and strontium (do.: 2.59 eV, do.: 1042.2 K). Among them, lithium, calcium and barium are preferable. These substances have a melting point at normal pressure of 400 K or more and they will hardly deteriorate the performance of an organic EL element at a high temperature.

A thickness of an intermediate electrode layer is preferably in the range of 0.6 to 5 nm, more preferably, in the range of 0.8 to 3 nm, and still more preferably, in the range of 0.8 to 2 nm.

When a thickness of an intermediate electrode layer is 5 nm or less, it will inhibit deterioration in efficiency of an organic EL element due to light absorption of the metal substance employed. And, there will be no deterioration in storage stability and driving stability of an organic EL element.

On the other hand, when a thickness of an intermediate conductive layer is 0.6 nm or more, it will result in increased property stability, in particular, it will result in achieving small property change in the early stage after production of an element.

In addition, "a thickness of an intermediate electrode layer" according to one or more embodiments of the present invention is defined as "an average thickness" which is calculated by dividing the formed film mass per unit area with a density of the material. Consequently, it does not matter whether a thickness of an intermediate electrode layer at an arbitral portion is larger or smaller compared with "an average thickness".

In one or more embodiments of the present invention, from the viewpoint of avoiding deterioration of the conductivity in the voltage application direction of the intermediate electrode layer, and controlling the conductivity in in-plane direction, it is preferable that at least one of the surfaces of the intermediate electrode layer is formed as a non-flat surface instead of the case in which a surface of the intermediate electrode layer facing the light emitting unit has a complete flat surface. When the intermediate electrode layer has a non-flat surface, this indicates that the shape of the intermediate electrode layer in the in-plane direction has a mesh structure or an island structure.

In addition, it is preferable that a layer adjacent to the intermediate electrode layer and located in the side of the anode is formed with a film formation using a single organic compound. This makes the production process to be simple and can easily control the production process. Further, it is preferable since it can reduce the risk of property variation caused by using a plurality of materials, and it will result in excellent long term stability, high temperature stability or long term driving stability.

It is preferable that the layer adjacent to the intermediate electrode layer has a function (between the light emitting unit located in the side of the cathode and the light emitting unit located in the side of the anode via the intermediate electrode layer) of giving and receiving a charge or injecting a charge to each light emitting unit. As a layer having such function, in order to increase a charge transport property, it is preferable to form a mixture layer composed of a charge transporting organic compound with an inorganic material or an organic metal complex which can oxidize or reduce the organic compound, or can form a charge transfer complex.

EXAMPLES

The present invention will now be described with reference to examples, however, other embodiments of the present invention are not limited thereto. In addition, an indication of "%" is used in examples. This represents "mass %", if it is not particularly mentioned.

<<Preparation of Organic EL Element>>

An anode was prepared by making patterning to a glass substrate of 30 mm×60 mm, thickness of 0.7 mm and having been formed with a film of ITO (indium tin oxide) with a thickness of 150 nm. Thereafter, this transparent support substrate provided with the ITO transparent electrode was subjected to ultrasonic washing with isopropyl alcohol, followed by drying with desiccated nitrogen gas, and was subjected to UV ozone washing for 5 minutes. The resulting transparent support substrate was fixed to a substrate holder of a commercial vacuum deposition apparatus.

In each heating boat for vapor deposition in the vacuum deposition apparatus was loaded with an appropriate amount of constituting material for each layer. The heating boat for vapor deposition was prepared with a resistance heating material of molybdenum or tungsten.

After reducing the pressure of a vacuum tank to a vacuum level of $1 \times 10^{-4}$ Pa, by using a shadow mask which can make patterning of the design of FIG. 17A, a deposition heating boat containing a compound M-4 was heated via application of electric current and vapor deposition was made onto the transparent support substrate at a deposition rate of 0.1 nm/sec, whereby it was produced a layer having a thickness of 15 nm.

Subsequently, a compound M-2 was vapor deposited in a similar way, and it was produced a layer having a thickness of 40 nm.

Subsequently, a compound BD-1, a compound GD-1, a compound RD-1, a compound H-1, and a compound H-2 were co-deposited at a deposition rate of 0.1 nm/sec so that the contents of the following compounds were made as follows: the compound BD-1: 5%, the compound GD-1: 17%, and the compound RD-1: 0.8%. Thus, it was formed a first white light emitting layer having a thickness of 30 nm.

Subsequently, a compound E-1 was vapor deposited at a deposition rate of 0.1 nm/sec, and it was produced a layer having a thickness of 30 nm.

M-4

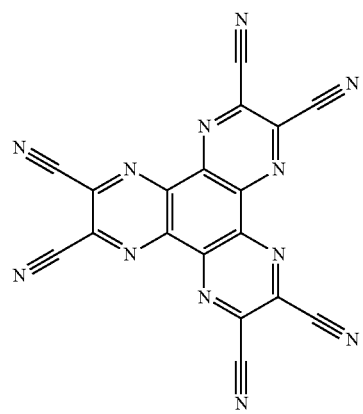

-continued
M-2
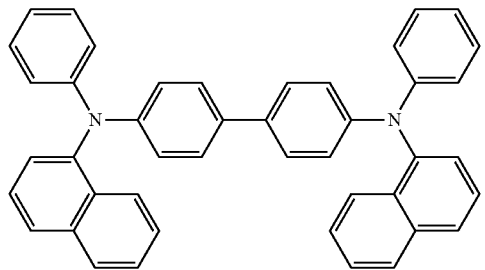
BD-1
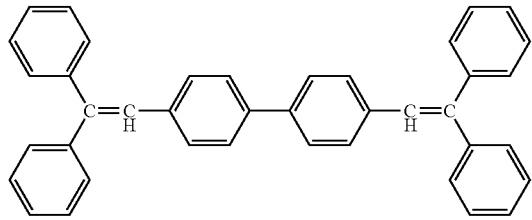
GD-1
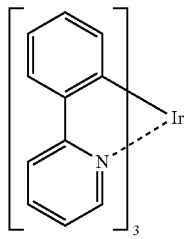
RD-1
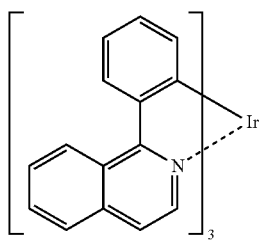
H-1
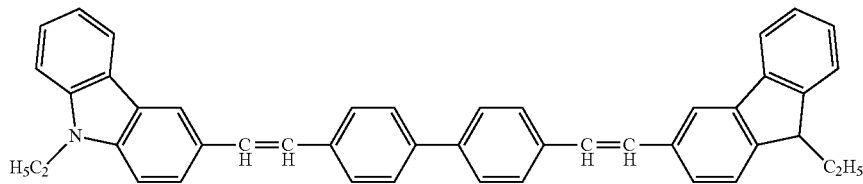
H-2
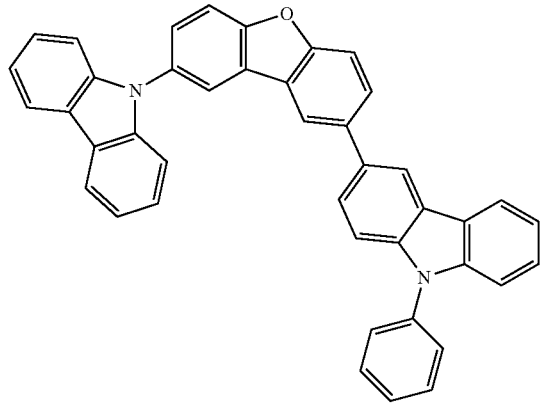

-continued

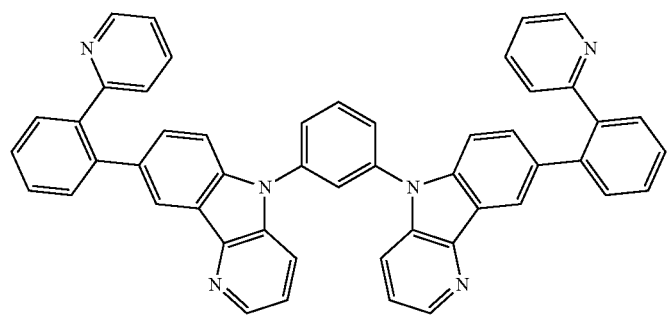

E-1

Subsequently, lithium was vapor deposited to form an intermediate electrode layer having a thickness of 1.5 nm.

Subsequently, by using a shadow mask which can make patterning of the design of FIG. 17B, the compound M-4 was vapor deposited at a deposition rate of 0.1 nm/sec, and it was produced a layer having a thickness of 15 nm.

Subsequently, the compound M-2 was vapor deposited at a deposition rate of 0.1 nm/sec, and it was produced a layer having a thickness of 50 nm.

Subsequently, the compound BD-1, the compound GD-1, the compound RD-1, the compound H-1, and a compound H-2 were co-deposited at a deposition rate of 0.1 nm/sec so that the contents of the following compounds were made as follows: the compound BD-1: 5%, the compound GD-1: 17%, and the compound RD-1: 0.8%. Thus it was formed a second white light emitting layer having a thickness of 30 nm.

Subsequently, the compound E-1 was vapor deposited at a deposition rate of 0.1 nm/sec, and it was produced a layer having a thickness of 30 nm.

Further, after forming a LiF layer having a thickness of 1.5 nm, aluminum was vapor deposited with a thickness of 110 nm to form a cathode.

Subsequently, a non-light-emitting surface of the above-described element was covered with a glass case, whereby an organic EL element was produced.

Subsequently, the produced organic EL element as described above was covered with a glass case, and it was sealed in a glove box (under high purity nitrogen gas ambience at a purity of 99.999% or more) so that the organic EL element was not brought into contact with atmosphere.

Subsequently, a pattern mask (refer to FIG. 18) and a UV absorbing filter (made by Isuzu Glass, Ltd.) were arranged by closely adhered with a reduced pressure on a surface of the substrate opposite to the surface on which were provided with the above-described various layers. UV rays were irradiated from the substrate side for 3 hours using UV Tester (SUV-W151: 100 mW/cm², made by Iwasaki Electric Co. Ltd.) to make a patterning.

Here, the UV absorbing filter having a light transmittance of 50% or less in the wavelength component of 320 nm or less was employed (cut wavelength: 320 nm).

It was confirmed that the produced organic EL element as described above exhibited different light emitting patterns excellent in shape accuracy and without emission unevenness as illustrated in FIGS. 17A and 17B by independent driving of each light emitting unit.

Embodiments of the present invention can be suitably used for providing a production method and a production apparatus of an organic EL element enabling to change a light emitting pattern of high shape accuracy, and embodiments the present invention can be suitably used for providing an organic EL module provided with an organic EL element produced with this production method.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS

1: Organic EL element
3: Resin adhesive layer
4: Back side film
7: Hole injection layer
7a: Overlapped portion
11b: Non-overlapped portion
14: Laminated body
21: Support substrate
23: Anode
23a: Taking-out electrode
24: Taking-out wiring
25a: First light emitting unit
25b: Second light emitting unit
26: Cathode
27 and 29: Intermediate electrode layer
28: Sealing layer
30: Organic EL module
32: Anisotropic conductive film
34: Flexible substrate
36: Adhesive
38: Polarizing member
41: 3rd guide hole
51 and 52: Convey roller
53 and 54: Receive roller
55: Raw material supplying section
56: Back side cooling roller
60, 60a, 60b and 60L: Continuous mask
61, 61a, and 61b: Opening section
61L: Transparent sheet member
61S: Pattern portion
62: Bonding jig
63: Second guide hole
64: Sheet form mask
65: Mask plate
66: Transparent portion
67: Non-transparent portion
68: Semi-transparent portion
70: Rotate transport section 70a: Second rotate transport section
71 to 78: Convey roller
80 and 80a: Cleaning section
81: Cooling section
82: Plasma etching section
83: Heating section
84: Cleaning head
90 to 93: Convey roller
94: Second feeding out section
95: Convey roller
96 and 97: Receive roller
98: Heat roller
99: Pressure roller
100: Production apparatus
101: Feeding out section
102 and 103: Guide roller
104: Slit roller
211: First guide hole
511 and 512: Convey roller
530: Concave portion
531 to 533: Receive roller
551 and 552: Raw material supplying section
561 and 562: Back side cooling roller
711: Rotating shaft
712 to 714: Roller
715: Projection
R1: Anterior room
R10: Surface treatment and accumulating room
R20: Film forming room
R21: First film forming room
R22: Second film forming room
R23: 3rd film forming room
R24: 4th film forming room
R25: 5th film forming room
R30: 6th film forming room
R40: Accumulating room
R50: Laminating room
R60: Winding room
R231a and R231b: Hole injection layer forming room
R232: Organic functional layer forming room
RL: Second patterning section
L1 and L2: UV irradiation apparatus
L3: Focused spot irradiation apparatus
w1 and w2: Length

The invention claimed is:

1. A method of producing an organic electroluminescent element comprising a support substrate having thereon: at least two light emitting units each containing one or a plurality of organic functional layers; and at least one intermediate electrode layer, the intermediate electrode layer being arranged between the light emitting units,
the method comprising:
patterning with a mask at least one of the organic functional layers in each of the light emitting units; and
patterning the at least one of the organic functional layers by light irradiation into a region where a light emitting function is modulated, and a region where a light emitting function is not modulated,
wherein the patterning by light irradiation is conducted each time when each of the light emitting units is produced.

2. The method of producing an organic electroluminescent element described in claim 1, wherein the light irradiation is done under conditions of: wavelength in the range of 320 to 420 nm; and radiation luminance in the range of 10 to 1,000 mW/cm$^2$.

3. An organic electroluminescent module having an organic electroluminescent element produced by a method of producing an organic electroluminescent element described in claim 1.

4. An organic electroluminescent module described in claim 3, wherein a polarizing member, a half mirror member, or a black filter is provided on a light emitting surface side of the support substrate.

5. A method of producing an organic electroluminescent element comprising a support substrate having thereon: at least two light emitting units each containing one or a plurality of organic functional layers; and at least one intermediate electrode layer, the intermediate electrode layer being arranged between the light emitting units,
the method comprising:
patterning with a mask at least one of the organic functional layers in each of the light emitting units; and
patterning the at least one of the organic functional layers by light irradiation into a region where a light emitting function is modulated, and a region where a light emitting function is not modulated,
wherein the patterning by light irradiation is conducted after all of the light emitting units are laminated; and
the light irradiation is done by changing an amount of the light irradiation in the region where the light emitting function is modulated.

6. The method of producing an organic electroluminescent element of claim 5, wherein the at least one of the organic functional layers is a hole transport layer or a hole injection layer.

7. An apparatus for producing an organic electroluminescent element comprising a support substrate having thereon: at least two light emitting units each containing one or a plurality of organic functional layers; and at least one intermediate electrode layer, the intermediate electrode layer being arranged between the light emitting units,
the apparatus comprising:
a first patterning section that patterns with a mask at least one of the organic functional layers in each of the light emitting units; and
a second patterning section that patterns the at least one of the organic functional layers by light irradiation into a region where a light emitting function is modulated, and a region where a light emitting function is not modulated,
wherein the second patterning section conducts the patterning each time when each of the light emitting units is produced.

* * * * *